United States Patent
Ikegami et al.

(10) Patent No.: US 8,772,788 B2
(45) Date of Patent: Jul. 8, 2014

(54) SEMICONDUCTOR ELEMENT AND METHOD OF MANUFACTURING THEREOF

(75) Inventors: Ryo Ikegami, Hyogo (JP); Masao Uchida, Osaka (JP); Yuki Tomita, Hyogo (JP); Masahiko Niwayama, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/122,823

(22) PCT Filed: Apr. 23, 2012

(86) PCT No.: PCT/JP2012/002783
§ 371 (c)(1),
(2), (4) Date: Nov. 27, 2013

(87) PCT Pub. No.: WO2012/164817
PCT Pub. Date: Dec. 6, 2012

(65) Prior Publication Data
US 2014/0110723 A1    Apr. 24, 2014

(30) Foreign Application Priority Data

May 30, 2011 (JP) ................. 2011-120663
May 30, 2011 (JP) ................. 2011-120664
May 30, 2011 (JP) ................. 2011-120665
Sep. 28, 2011 (JP) ................. 2011-212430

(51) Int. Cl.
  *H01L 29/15*    (2006.01)
  *H01L 31/0312*  (2006.01)
  *H01L 21/336*   (2006.01)
  *H01L 29/78*    (2006.01)

(52) U.S. Cl.
  CPC ................. *H01L 29/7802* (2013.01)
  USPC .......................................... 257/77; 438/268

(58) Field of Classification Search
  CPC ............ H01L 29/7802; H01L 29/1095
  USPC .......................................... 257/77; 438/268
  See application file for complete search history.

(56) References Cited

U.S. PATENT DOCUMENTS 5,976,936 A    11/1999  Miyajima et al.
6,165,822 A    12/2000  Okuno et al.
(Continued)

FOREIGN PATENT DOCUMENTS

JP    09-074192 A    3/1997
JP    09-074193 A    3/1997
(Continued)

OTHER PUBLICATIONS

International Search Report for corresponding International Application No. PCT/JP2012/002783 mailed Jul. 17, 2012.
(Continued)

*Primary Examiner* — William D Coleman
(74) *Attorney, Agent, or Firm* — Renner, Otto, Boisselle & Sklar, LLP

(57) ABSTRACT

A semiconductor device disclosed in the present application includes: a semiconductor substrate; a first silicon carbide semiconductor layer located on a principal surface of the semiconductor substrate, the first silicon carbide semiconductor layer including a drift region of a first conductivity type, a body region of a second conductivity type, and an impurity region of a first conductivity type; a trench provided in the first silicon carbide semiconductor layer so as to reach inside of the drift region; a second silicon carbide semiconductor layer of the first conductivity type located at least on a side surface of the trench so as to be in contact with the impurity region and the drift region; a gate insulating film; a gate electrode; a first ohmic electrode; and a second ohmic electrode. The body region includes a first body region which is in contact with the second silicon carbide semiconductor layer on the side surface of the trench, and a second body region which is in contact with the drift region and has a smaller average impurity concentration than the first body region.

23 Claims, 47 Drawing Sheets

(56) References Cited

U.S. PATENT DOCUMENTS

| | | | |
|---|---|---|---|
| 7,399,676 B2 * | 7/2008 | Kumar et al. | 438/268 |
| 7,989,882 B2 * | 8/2011 | Zhang et al. | 257/330 |
| 2001/0025984 A1 | 10/2001 | Osawa | |
| 2005/0062048 A1 | 3/2005 | Hayashi et al. | |
| 2007/0007537 A1 | 1/2007 | Ogura et al. | |
| 2008/0230787 A1 | 9/2008 | Suzuki et al. | |
| 2009/0261350 A1 * | 10/2009 | Yamamoto et al. | 257/77 |
| 2009/0289264 A1 | 11/2009 | Matsuki et al. | |
| 2011/0068353 A1 | 3/2011 | Nakano | |
| 2012/0057386 A1 * | 3/2012 | Adachi et al. | 363/131 |
| 2012/0153303 A1 * | 6/2012 | Uchida | 257/77 |
| 2012/0217513 A1 * | 8/2012 | Tega et al. | 257/77 |
| 2013/0140586 A1 * | 6/2013 | Takahashi et al. | 257/77 |
| 2013/0214291 A1 * | 8/2013 | Uchida et al. | 257/77 |

FOREIGN PATENT DOCUMENTS

| | | |
|---|---|---|
| JP | 09-266309 A | 10/1997 |
| JP | 2001-135817 A | 5/2001 |
| JP | 2001-284584 A | 10/2001 |
| JP | 2003-068761 A | 3/2003 |
| JP | 2003-152182 A | 5/2003 |
| JP | 2005-136092 A | 5/2005 |
| JP | 2006-080185 A | 3/2006 |
| JP | 2007-013058 A | 1/2007 |
| JP | 2007-258617 A | 10/2007 |
| JP | 2008-235546 A | 10/2008 |
| JP | 2009-260064 A | 11/2009 |
| WO | WO 2008/057438 A1 | 5/2008 |
| WO | WO 2009/142233 A1 | 11/2009 |
| WO | WO 2010/125819 A1 | 11/2010 |

OTHER PUBLICATIONS

Forms PCT/IPEA/416 and PCT/IPEA/409 for corresponding International Application No. PCT/JP2012/002783 dated Jul. 16, 2013.

Kenya Yamashita et al., "Normally-off 4H-SiC Power MOSFET with Submicron Gate", Materials Science Forum, vols. 600-603(2009), pp. 1115-1118.

M. Uchida et al., "Novel SiC Power MOSFET with Integrated Unipolar Internal Inverse MOS-Channel Diode", IEDM11-602, 2011 IEEE International, pp. 26.6.1-26.6.4.

* cited by examiner

FIG.1
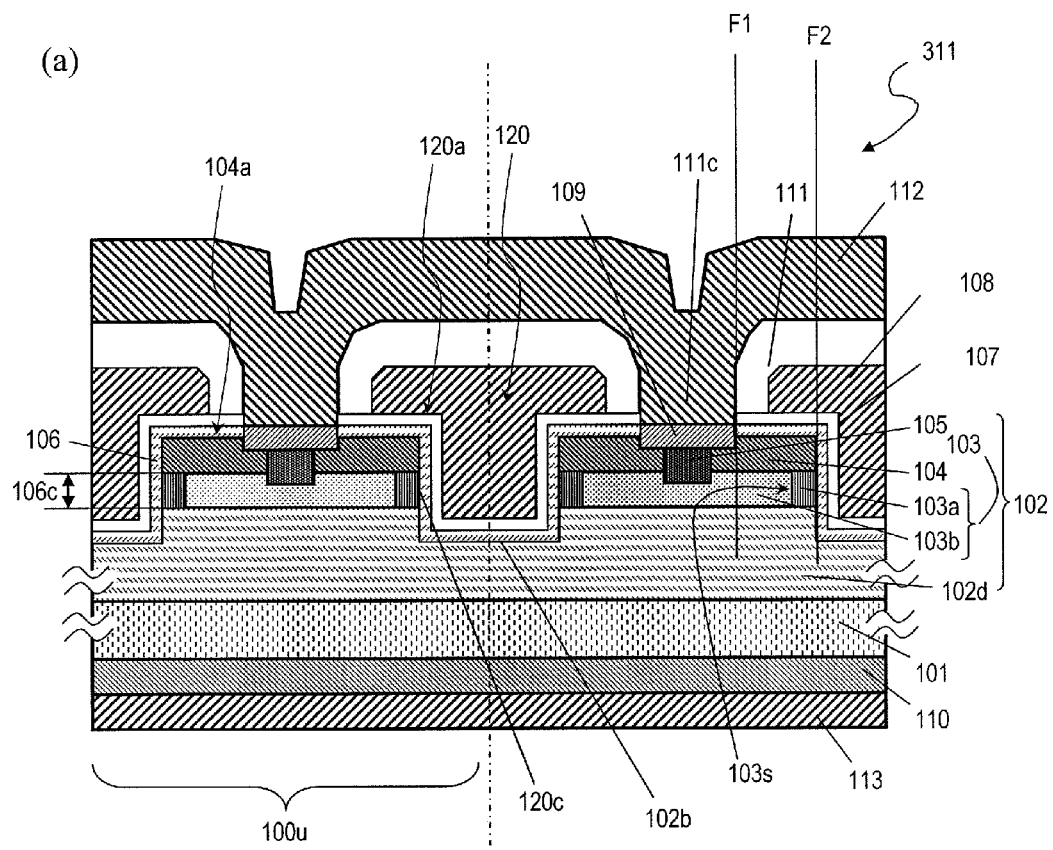
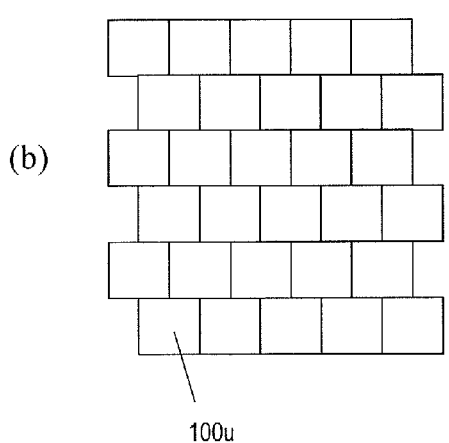
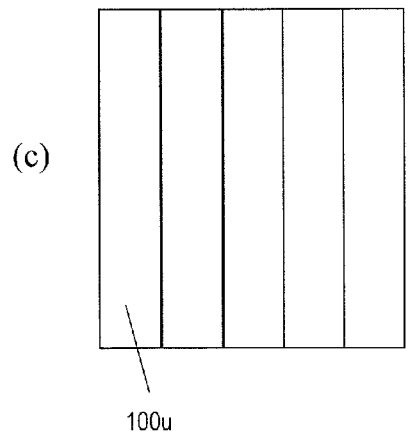

FIG. 3
(a)
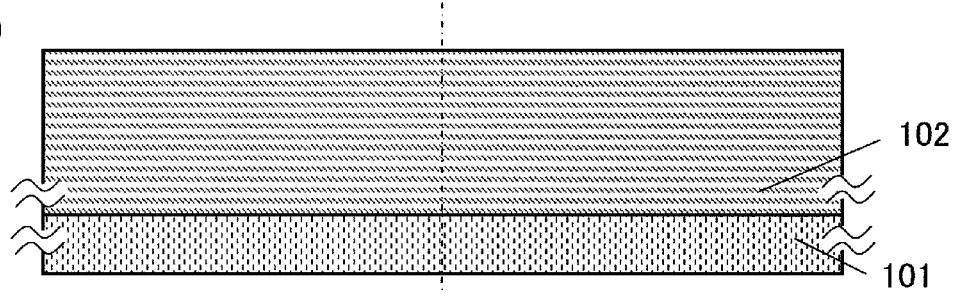
(b)
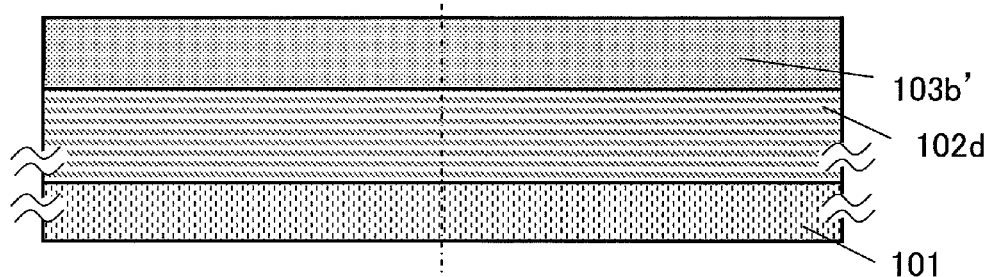
(c)
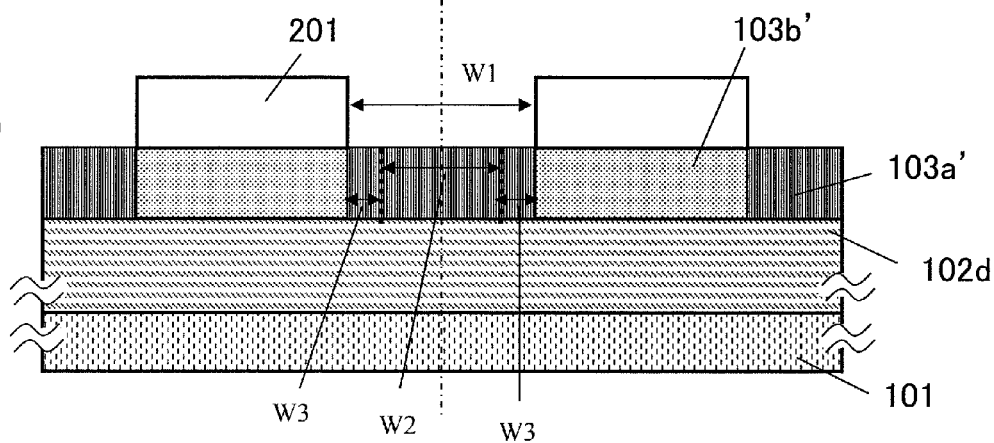

(a)

109

(b)

110

FIG. 8
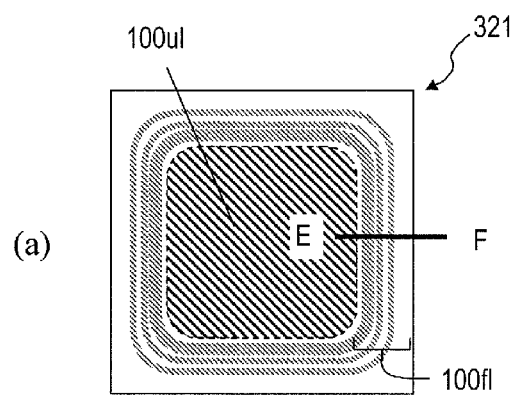
(a)
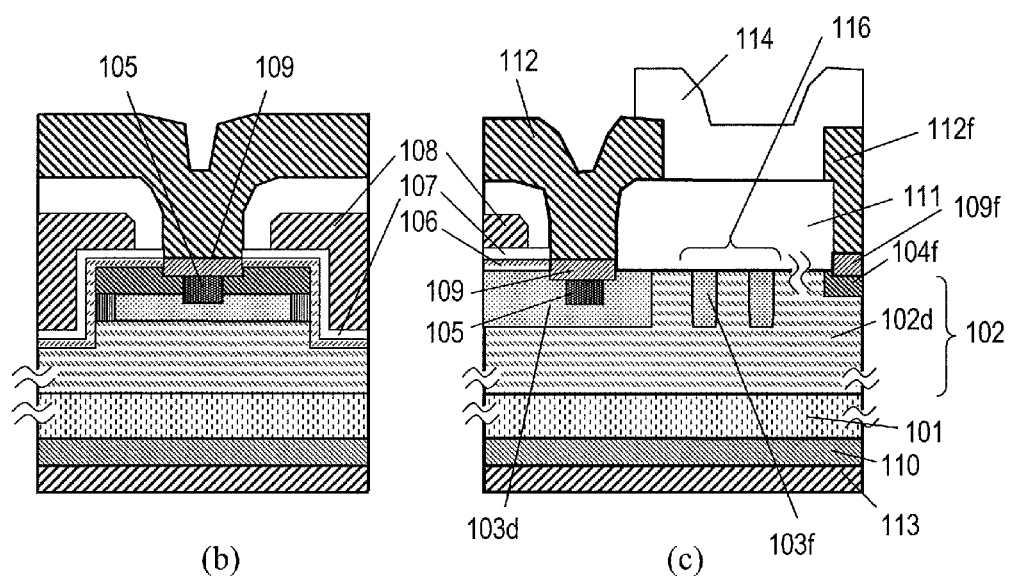
(b)　　　(c)

FIG.13
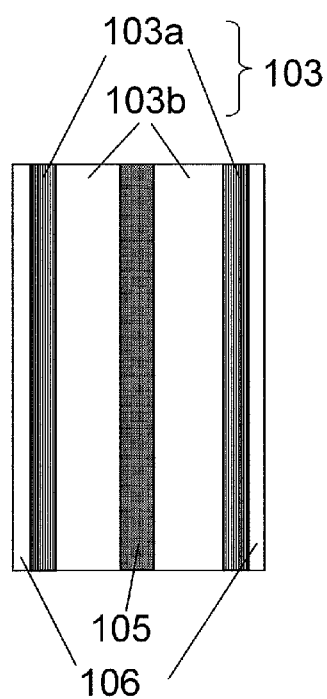
(a)
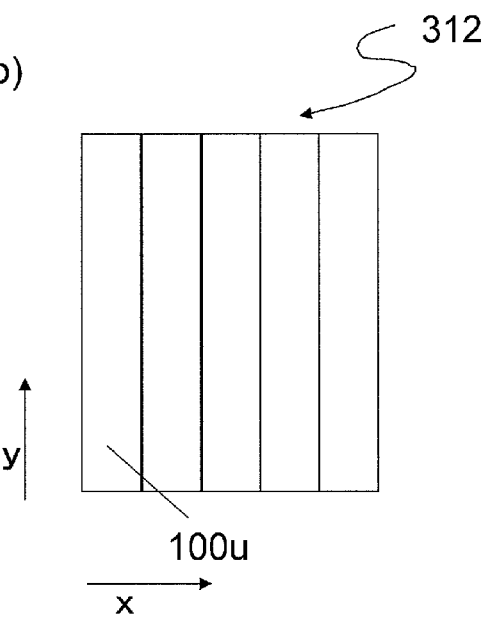
(b)

FIG.23
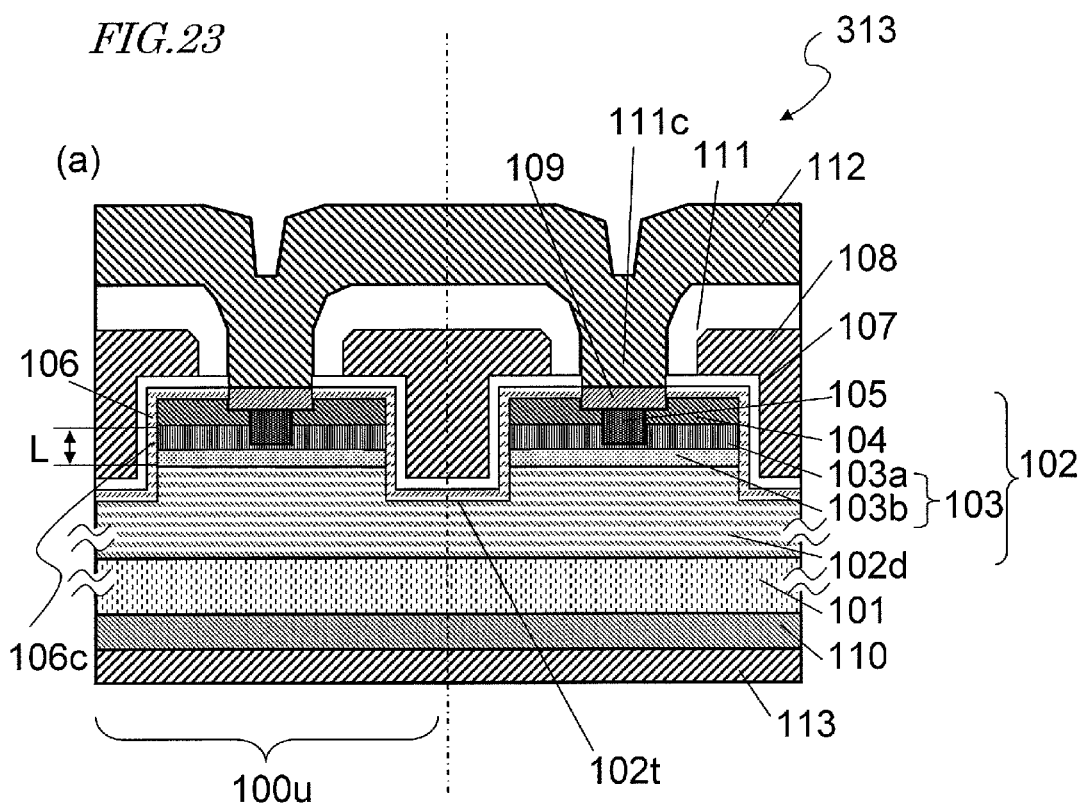
(a)
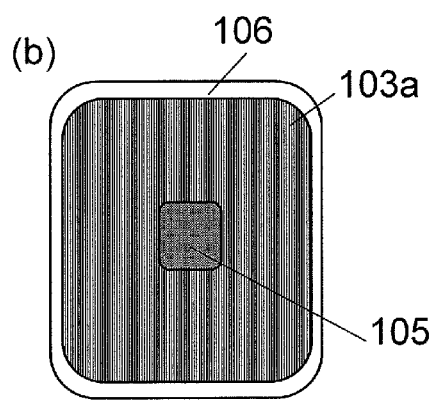
(b)
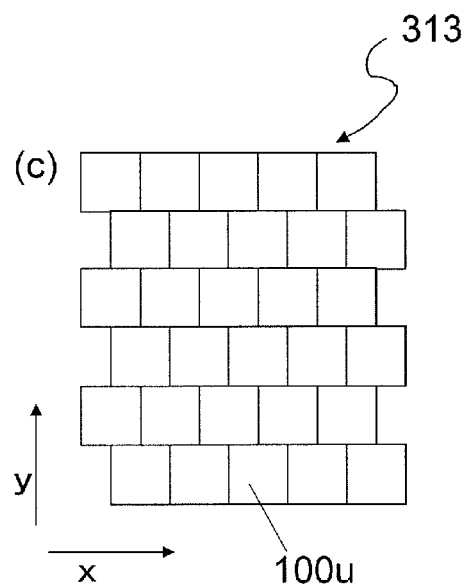
(c)

FIG. 30
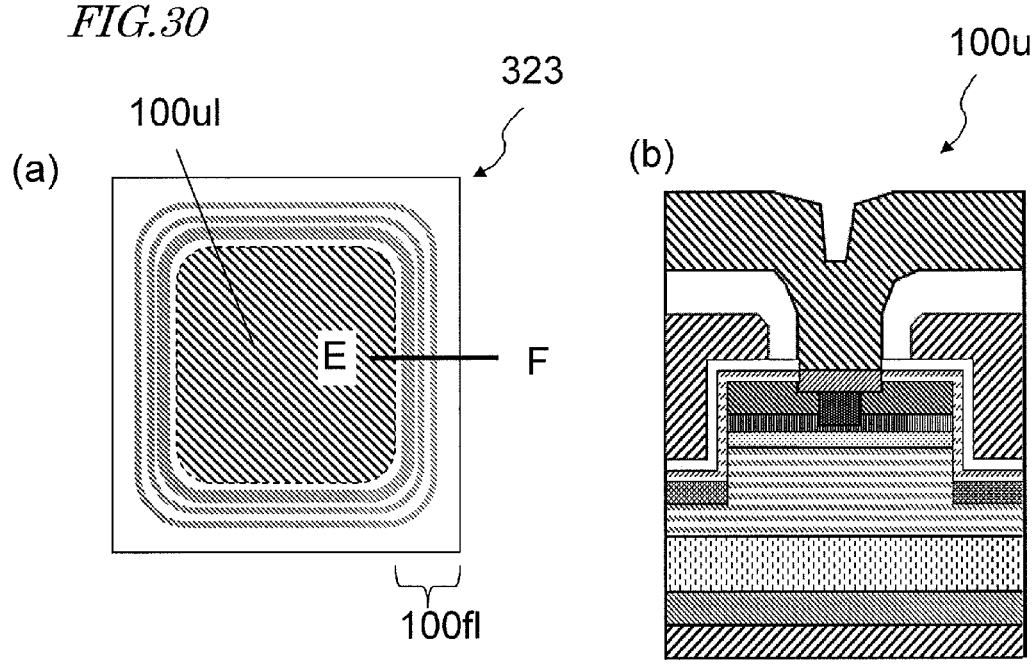
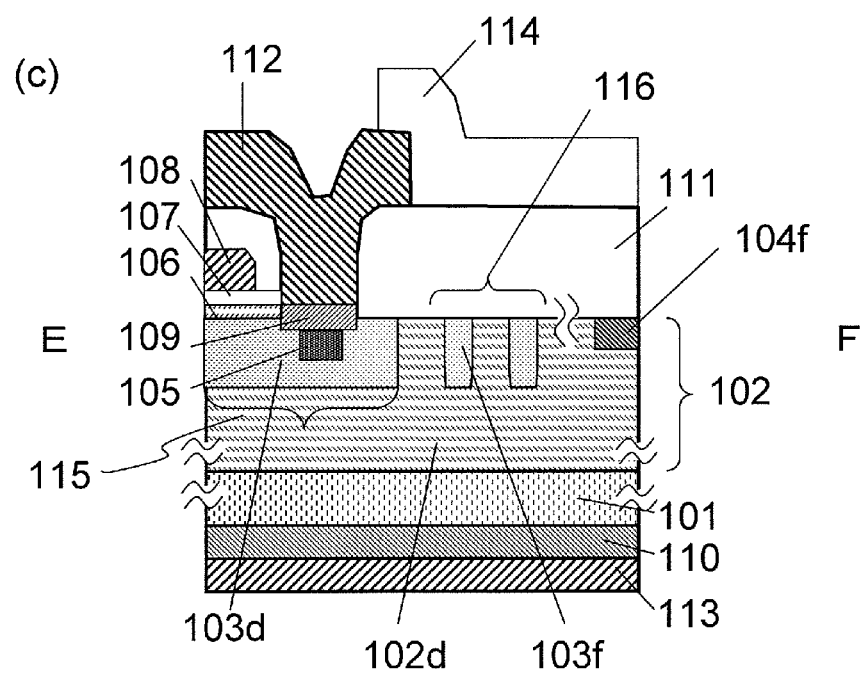

FIG. 37
(a)
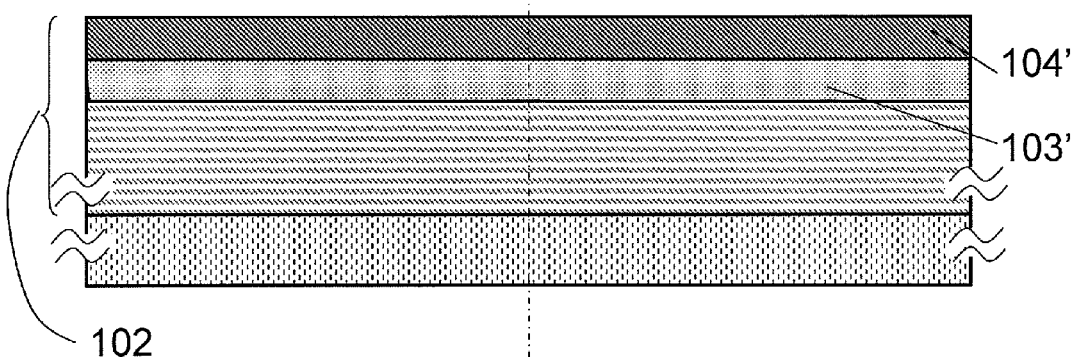
(b)
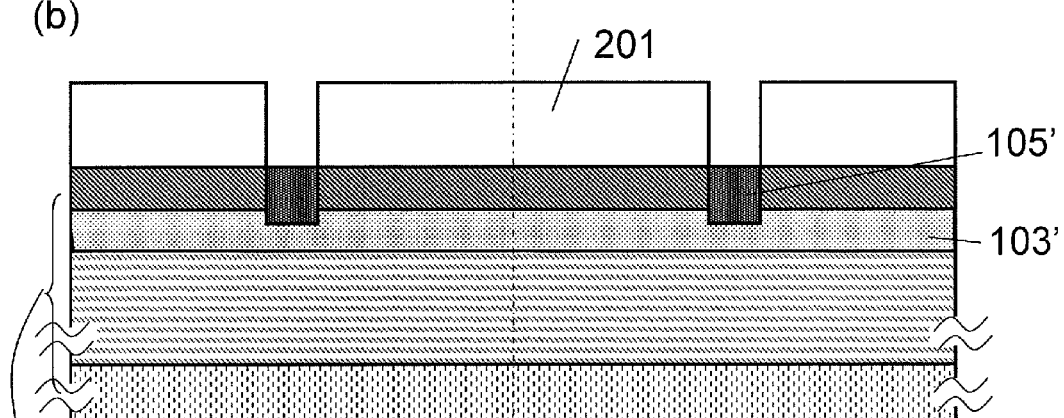
(a')
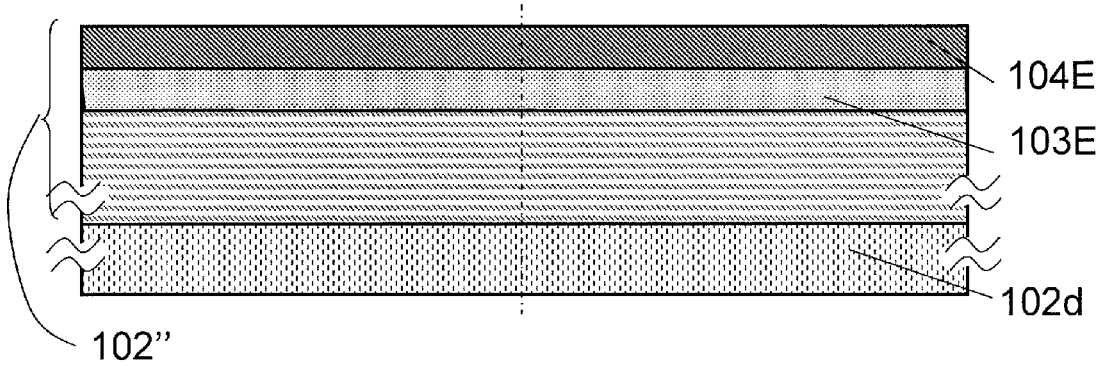

FIG. 44
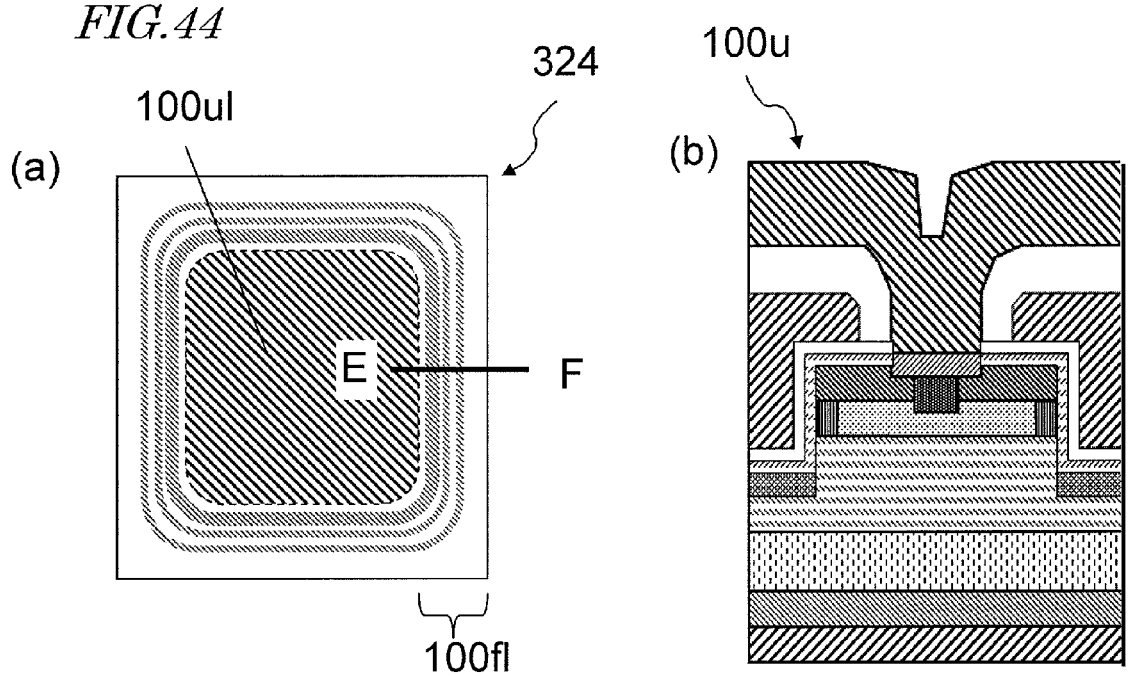
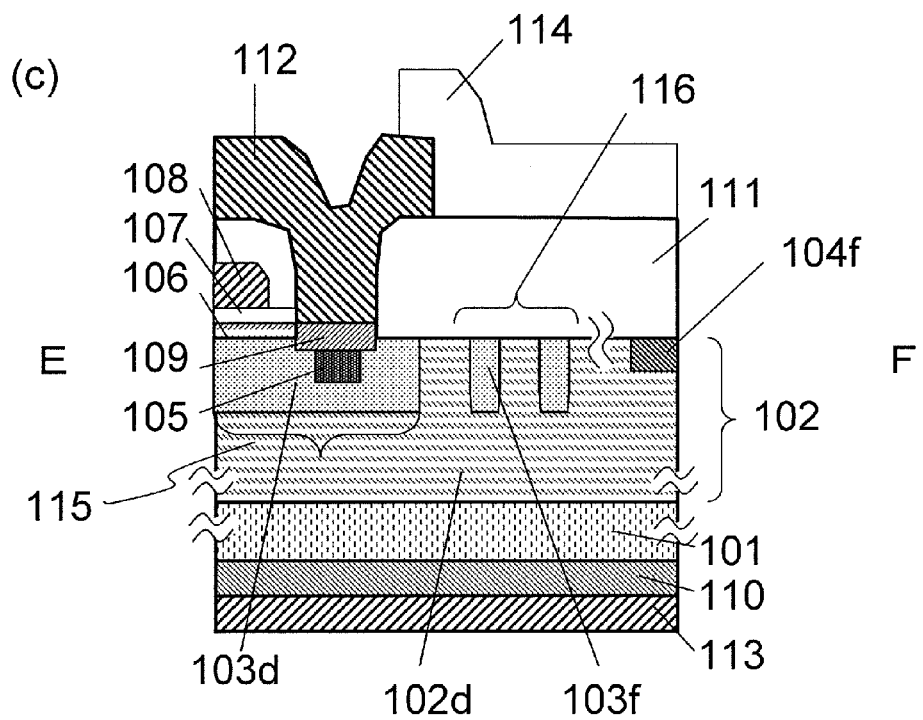

US 8,772,788 B2

SEMICONDUCTOR ELEMENT AND METHOD OF MANUFACTURING THEREOF

TECHNICAL FIELD

The present application relates to a semiconductor device. Particularly, the present application relates to a silicon carbide semiconductor device (power semiconductor device) for use in high-withstand-voltage, high-current applications.

BACKGROUND ART

Silicon carbide (SiC) is a hard semiconductor material with a larger bandgap than silicon (Si), and it has been applied to various semiconductor devices such as power devices, hostile-environment devices, high-temperature devices, and high-frequency devices. Applications to power devices such as semiconductor devices and rectifier devices, among others, have been drawing public attention. Power devices using SiC have advantages such as the significant decrease in power loss as compared with Si power devices. Utilizing such characteristics of SiC power devices, it is possible to realize smaller semiconductor devices as compared with Si power devices.

Of all power devices using SiC, one of typical semiconductor devices is metal-insulator-semiconductor field effect transistors (MISFETs). Hereinafter, a MISFET using SiC may be referred to simply as "SiC-FET". Metal-oxide-semiconductor field-effect transistors (MOSFETs) are a type of MISFETs.

In order for an even higher current to flow through a power device such as a MISFET, it is effective to increase the channel density. Therefore, vertical MISFETs having the trench gate structure (trench-type MISFETs) have been proposed, replacing the conventional vertical MISFETs having the planar structure (planar-type MISFETs).

In a trench-type MISFET, the channel region is formed on the side surface of the trench formed in the semiconductor layer. Therefore, the channel packing density for the substrate area can be improved sufficiently, and the ON resistance (normalized ON resistance) per unit area can be sufficiently decreased.

Now, referring to FIG. 47, an example of a cross-sectional structure of a conventional trench-type MISFET will be described. The trench-type MISFET shown in FIG. 47 is disclosed in Patent Document No. 1, for example. A vertical MISFET typically includes a plurality of unit cells arranged in two dimensions.

A semiconductor device 1000 shown in FIG. 47 includes a plurality of unit cells 1000$u$. Each unit cell 1000$u$ includes an n$^+$-type substrate 1010 of silicon carbide, and a silicon carbide semiconductor layer 1020 formed on the principal surface of the substrate 1010. The silicon carbide semiconductor layer 1020 includes an n$^-$-type drift region 1020$d$ formed on the principal surface of the substrate 1010, and a p-type body region 1030 formed on the drift region 1020$d$. A p$^+$-type contact region 1050 and an n$^+$-type source region 1040 are arranged in a portion of the surface region of the body region 1030. A source electrode 1090 is arranged on the silicon carbide semiconductor layer 1020 so as to be in contact with the contact region 1050 and the source region 1040.

A trench 1020$t$ is arranged in the silicon carbide semiconductor layer 1020 so as to run through the body region 1030 to reach the drift region 1020$d$. In this example, the trench 1020$t$ runs through the source region 1040 and the body region 1030 to reach the drift region 1020$d$. An n$^-$-type channel layer 1060 is arranged on the side wall of the trench 1020$t$ so as to connect between the source region 1040 and the drift region 1020$d$. Arranged in the trench 1020$t$ are a gate electrode 1080, and a gate insulating film 1070 for providing insulation between the gate electrode 1080 and the channel layer 1060. A drain electrode 1100 is provided on the reverse surface of the substrate 1010.

An interlayer insulating film 1110 is formed on the source electrode 1090 and the gate electrode 1080. An upper wiring electrode 1120 is provided on the interlayer insulating film 1110. The upper wiring electrode 1120 is electrically connected to the source electrode 1090 of each unit cell 1000$u$ in an opening portion 1110$c$ formed in the interlayer insulating film 1110. A reverse surface wiring electrode 1130 is provided on the drain electrode 1100. When mounted onto a lead frame or a module, the reverse surface wiring electrode 1130 serves to provide adhesion between the semiconductor device 1000 and a solder material for securing the lead frame or the module.

Patent Document No. 2 discloses an example where the channel layer 1060 is of the p-type.

Patent Document No. 3 discloses a MISFET serving as a diode for allowing a current to flow from the source electrode 1090 to the drain electrode 1100 through the channel layer 1060.

CITATION LIST

Patent Literature

[Patent Document No. 1] Japanese Laid-Open Patent Publication No. 9-74193
[Patent Document No. 2] Japanese Laid-Open Patent Publication No. 9-74192
[Patent Document No. 3] WO2010/125819

SUMMARY OF INVENTION

Technical Problem

An SiC-FET includes a body diode 1000$d$ formed by the pn junction between the p body region 1030 and the n-drift layer 1020. A current in the forward direction flows through the body diode 1000$d$ when a negative voltage is applied to the drain electrode 1100 with respect to the source electrode 1090.

In contrast, as shown in Patent Document No. 3, where a current is allowed to flow through the channel layer of the MISFET so that it serves as a diode (channel diode), the absolute value |Vf0| of the rising voltage of the channel diode is set to be smaller than the absolute value |Vf| of the rising voltage of the body diode of the MISFET.

However, a study by the present inventors revealed that a sufficient withstand voltage of the MISFET may not be ensured and a leak defect may occur when the impurity concentration of the body region is excessively increased for the purpose of setting the absolute value |Vf0| of the rising voltage of the channel diode to be small in the conventional trench-type MISFET.

In view of such a conventional technique, the present application provides a silicon carbide semiconductor device including a free-wheeling diode therein, which solves at least one of the problems of the conventional technique.

Solution to Problem

A semiconductor device disclosed in the present application includes: a semiconductor substrate having a principal surface and a reverse surface; a first silicon carbide semiconductor layer located on the principal surface of the semiconductor substrate, the first silicon carbide semiconductor layer including a drift region of a first conductivity type, a body region of a second conductivity type located on the drift region, and an impurity region of the first conductivity type located on the body region; a trench provided in the first silicon carbide semiconductor layer, running through the body region so as to reach inside of the drift region; a second silicon carbide semiconductor layer of the first conductivity type located at least on a side surface of the trench so as to be in contact with at least a portion of the drift region and at least a portion of the impurity region; a gate insulating film located on the second silicon carbide semiconductor layer; a gate electrode located on the gate insulating film; a first ohmic electrode in contact with the impurity region; and a second ohmic electrode located on the reverse surface of the semiconductor substrate, wherein: the body region includes a first body region and a second body region having a smaller average impurity concentration than the first body region, the first body region being in contact with the second silicon carbide semiconductor layer on the side surface of the trench, and the second body region being in contact with the drift region; potentials to be applied to the second ohmic electrode and the gate electrode with respect to the first ohmic electrode are Vds and Vgs, respectively, and a gate threshold voltage is Vth; where Vgs≥Vth, a current flows from the second ohmic electrode to the first ohmic electrode through the second silicon carbide semiconductor layer; and where 0 volt≤Vgs<Vth, a current flows from the first ohmic electrode to the second ohmic electrode through the second silicon carbide semiconductor layer before a current starts to flow from the body region to the drift region, as Vds becomes less than 0 volt.

Advantageous Effects of Invention

With the semiconductor device disclosed in the present application, the body region is formed by two regions, whereby it is possible to independently control the impurity concentration of the first body region for adjusting the threshold and the impurity concentration of the second body region forming a pn junction with the first silicon carbide semiconductor layer. Thus, it is possible to provide a semiconductor device of which the rising voltage of the channel diode is lower than the body diode and which has a high device withstand voltage.

BRIEF DESCRIPTION OF DRAWINGS

FIG. 1 (*a*) is an important-part cross-sectional view showing a semiconductor device of Embodiment 1-1, and (*b*) and (*c*) are diagrams each showing an arrangement of unit cells.

FIGS. 3 (*a*) to (*c*) are process cross-sectional views illustrating a method for manufacturing the semiconductor device shown in FIG. 1.

FIG. 8 (*a*) is a top view showing a semiconductor device of Embodiment 1-2, (*b*) is a cross-sectional view of a unit cell, and (*c*) is a cross-sectional view taken along line E-F of (*a*).

FIGS. 13 (*a*) and (*b*) are, respectively, a top view of a body region where unit cells have a stripe shape, and a plan view showing an example of an arrangement of unit cells in the semiconductor device.

FIG. 23 (*a*) is a cross-sectional view of a semiconductor device of Embodiment 3-1, (*b*) is a top view of a body region in the semiconductor device, and (*c*) is a plan view showing an example of an arrangement of unit cells in the semiconductor device.

FIG. 30 (a) is a top view showing a semiconductor of an embodiment of the present invention, (b) is a cross-sectional view of a unit cell, and (c) is a cross-sectional view showing a peripheral portion of the semiconductor device.

FIGS. 37 (a) and (b) are process cross-sectional views each illustrating a method for manufacturing the semiconductor device of Embodiment 4-1, and (a') is a process cross-sectional view according to another embodiment.

FIG. 44 (a) is a top view showing a semiconductor device according to an embodiment of the present invention, (b) is a cross-sectional view of a unit cell, and (c) is a cross-sectional view showing a peripheral portion of the semiconductor device.

DESCRIPTION OF EMBODIMENTS

A semiconductor device and a method for manufacturing a semiconductor device disclosed in the present application are based on findings newly obtained by the present inventors. Hereinbelow, the findings will first be explained, and problems to be solved by the embodiments will then be explained. Note that the findings and problems will be explained hereinbelow with reference to FIG. 47 for the purpose of illustration, and the present invention is not limited thereto.

Figure 47:
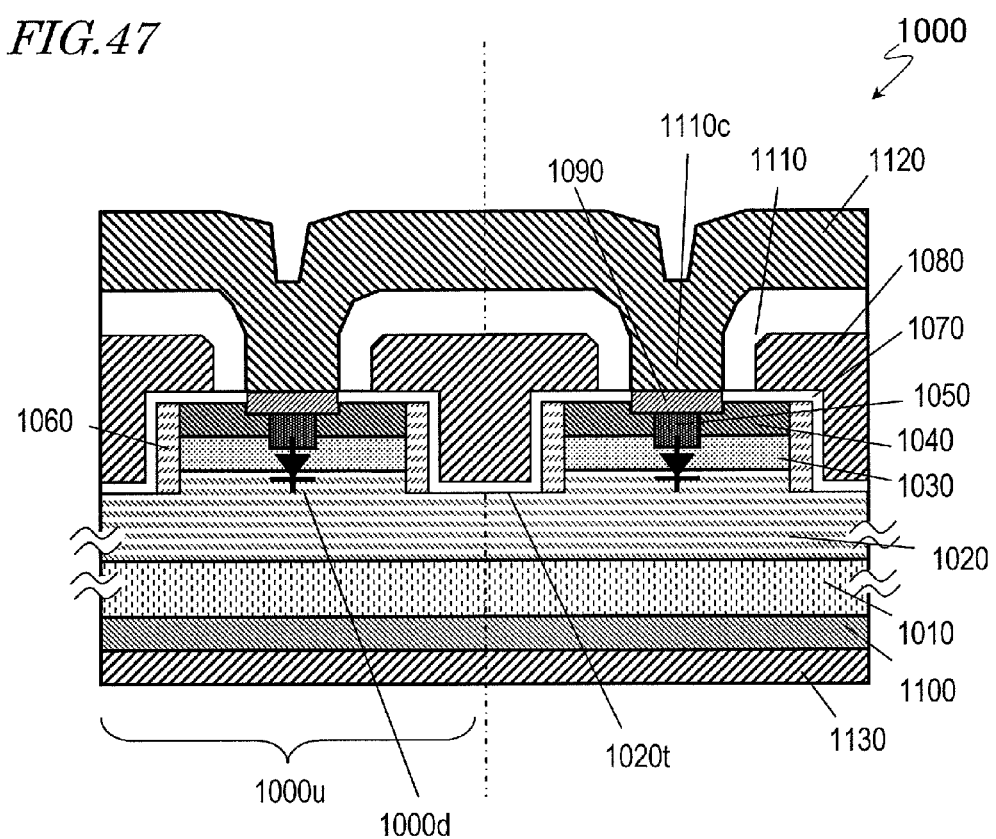
FIG. 47 A cross-sectional view schematically showing a configuration of a conventional semiconductor device.

The conventional semiconductor device 1000 shown in FIG. 47 includes a pn junction (body diode) between the body region 1030 and the channel layer 1060. The dopant concentration and the width in the direction parallel to the substrate surface of the body region 1030, the dopant concentration and the thickness of the channel layer 1060, and the thickness of the gate insulating film 1070 are determined so that when the potential difference of the gate electrode with respect to the source electrode is zero, at least a portion of the depletion layer expanding from the pn junction boundary into the channel layer reaches the gate insulating film 1070, where the semiconductor device 1000 is of a normally-OFF type. Thus, when the potential difference of the gate electrode with respect to the source electrode is zero, a portion of the channel layer 1060 is completely depleted.

The present inventors found that in the semiconductor device 1000, the rising voltage of the channel diode can be decreased by increasing the concentration of the body region. The finding will now be discussed.

The rising voltage |Vf0| of the channel diode of the semiconductor device 1000 is generally equal to the potential barrier at the boundary between the gate insulating film 1070 and the channel layer 1060. This potential barrier is controlled by the sum of the depletion layer expanding from the pn junction boundary into the body region 1030 and the depletion layer expanding from the pn junction boundary into the channel layer 1060.

Now, the depletion layer expanding in the body region 1030 becomes smaller if the dopant concentration of the body region 1030 is increased. On the other hand, the depletion layer expanding into the channel layer 1060 is controlled by the thickness of the channel layer 1060. Therefore, the sum of the depletion layer expanding in the body region 1030 and the depletion layer expanding in the channel layer 1060 (in the direction parallel to the substrate surface in FIG. 47) can be decreased by increasing the dopant concentration of the body region 1030. That is, by increasing the dopant concentration of the body region 1030, it is possible to decrease the potential barrier at the boundary between the gate insulating film 1070 and the channel layer 1060 and to decrease the rising voltage |Vf0| of the channel diode.

Figure 48:
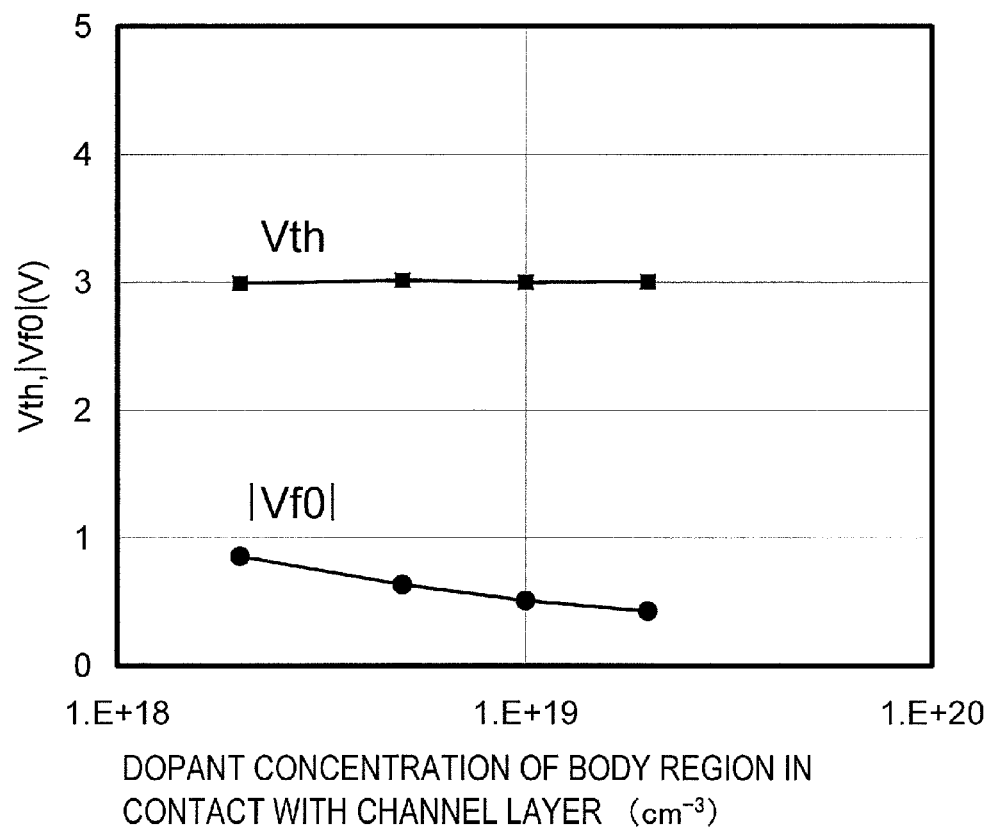
FIG. 48 A graph showing the relationship of the threshold voltage Vth of the transistor and the rising voltage |Vf0| of the channel diode with respect to the impurity concentration of the body region in the semiconductor device shown in FIG. 47, according to a study by the present inventors.

FIG. 48 illustrates the threshold voltage Vth of the transistor and the rising voltage |Vf0| of the channel diode when the dopant concentration of the body region 1030 in contact with the channel layer 1060 is varied. While the threshold voltage Vth also changes when the dopant concentration of the body region 1030 is changed, it is herein set so that the threshold voltage Vth is about 3 V by appropriately changing the dopant concentration of the channel layer 1060. FIG. 48 shows where the threshold voltage Vth is constant, the rising voltage |Vf0| decreases as the dopant concentration of the body region 1030 increases. Therefore, in order to selectively decrease the rising voltage |Vf0| of the channel diode while maintaining the threshold voltage Vth of the transistor, it is desirable that the dopant concentration of the body region 1030 in contact with the channel layer 1060 is as large as possible.

Such an in-depth study as described above yielded the finding that it is desirable that the concentration of the body region is high in order to decrease the absolute value |Vf0| of the rising voltage of the channel diode. Particularly, by appropriately setting other parameters, it is possible to selectively decrease the rising voltage |Vf0| of the channel diode while maintaining the threshold voltage Vt of the semiconductor device.

However, there is a concern that there may be various problems when the dopant concentration of the body region 1030 is increased. Since the crystalline state of silicon carbide is typically inferior to that of silicon, there is a concern that if the dopant activation is insufficient, the crystal defects cannot be fully recovered, and an unexpected leak current may occur if the body region has a high concentration. For example, where the body region 1030 shown in FIG. 47 is set to a high concentration, crystal defects may occur in the body region 1030, decreasing the withstand voltage between the body region 1030 and the drift layer 1020. Where the source region 1040 is formed by ion implantation, the resistance of the source region increases if the body region 1030 is set to a high concentration. This as a result increases the ON resistance of the semiconductor device.

Moreover, in a power device having a high withstand voltage, where a peripheral structure having a pn junction (e.g., a ring region 103f shown in FIG. 8), for example, is included, and where the body region 1030 and the peripheral structure are formed in the same process for the purpose of process simplification, there is also a concern for a decrease in the withstand voltage of the peripheral structure. The withstand voltage characteristics of the peripheral structure are significantly dependent on the concentration thereof. Therefore, if the concentration of the peripheral structure increases as the concentration of the body region 1030 is increased, there is a concern for a decrease in the withstand voltage due to the concentration falling out of the optimal concentration, in addition to the problem of the crystal defects described above. Therefore, changing the concentration of the body 1030 leads to a loss of balance for maintaining the withstand voltage in the peripheral structure, resulting in a significant decrease in the degree of design freedom.

In view of the problems set forth above, in semiconductor devices according to embodiments disclosed in the present application, the concentration of a partial region of the body region is increased and the concentration of the other region is decreased, thereby realizing both a decrease in the absolute value |Vf0| of the rising voltage of the channel diode and an improvement of the withstand voltage between the body region and the drift layer.

Summary of one aspect of the present invention is as follows.

A semiconductor device in one aspect of the present invention is a semiconductor device including: a semiconductor substrate having a principal surface and a reverse surface; a first silicon carbide semiconductor layer located on the principal surface of the semiconductor substrate, the first silicon carbide semiconductor layer including a drift region of a first conductivity type, a body region of a second conductivity type located on the drift region, and an impurity region of the first conductivity type located on the body region; a trench provided in the first silicon carbide semiconductor layer, running through the body region so as to reach inside of the drift region; a second silicon carbide semiconductor layer of the first conductivity type located at least on a side surface of the trench so as to be in contact with at least a portion of the drift region and at least a portion of the impurity region; a gate insulating film located on the second silicon carbide semiconductor layer; a gate electrode located on the gate insulating film; a first ohmic electrode in contact with the impurity region; and a second ohmic electrode located on the reverse surface of the semiconductor substrate, wherein: the body region includes a first body region which is in contact with the second silicon carbide semiconductor layer on the side surface of the trench, and a second body region which is in contact with the drift region and has a smaller average impurity concentration than the first body region; potentials to be applied to the second ohmic electrode and the gate electrode with respect to the first ohmic electrode are Vds and Vgs, respectively, and a gate threshold voltage is Vth; where Vgs≥Vth, a current flows from the second ohmic electrode to the first ohmic electrode through the second silicon carbide semiconductor layer; and where 0 volt≤Vgs<Vth, a current flows from the first ohmic electrode to the second ohmic electrode through the second silicon carbide semiconductor layer before a current starts to flow from the body region to the drift region, as Vds becomes less than 0 volt.

The second body region is further in contact with the impurity region.

The first body region is further in contact with the impurity region and the drift region.

The first body region is further in contact with the impurity region and is not in contact with the drift region.

The semiconductor device includes a plurality of unit cells; each unit cell includes the semiconductor substrate, the first silicon carbide semiconductor layer, the trench, the second silicon carbide semiconductor layer, the gate insulating film, the gate electrode, the first ohmic electrode, and the second ohmic electrode; and a width of the first body region of each unit cell in a direction parallel to the semiconductor substrate is equal to a width of the first body region of another unit cell, which is adjacent to said unit cell with the trench interposed therebetween, in a direction parallel the semiconductor substrate.

The first body region is defined in a self-aligned manner with respect to the trench.

The second silicon carbide semiconductor layer is in contact with the first body region and the second body region on the side surface of the trench.

The first body region is further in contact with the impurity region and is not in contact with the drift region.

The second body region is located under the first body region and is not in contact with the impurity region.

The second silicon carbide semiconductor layer and the body region are configured so that where 0 volt≤Vgs<Vth, a current flows from the first ohmic electrode to the second ohmic electrode through the second silicon carbide semiconductor layer before a current starts to flow from the body region to the drift region, as Vds becomes less than 0 volt.

The second silicon carbide semiconductor layer is an epitaxial layer.

An average impurity concentration of the first body region is twice or more an average impurity concentration of the second body region.

The semiconductor device further includes an electric field relaxing region of the second conductivity type provided on a bottom surface of the trench.

The semiconductor device further includes a contact region which is adjacent to the impurity region and is in contact with the second ohmic electrode and the second body region.

The semiconductor device includes: a unit cell arrangement section including a plurality of unit cells arranged therein, each unit cell including the semiconductor substrate, the first silicon carbide semiconductor layer, the trench, the second silicon carbide semiconductor layer, the gate insulating film, the gate electrode, the first ohmic electrode, and the second ohmic electrode; and a peripheral portion arranged outside the unit cell arrangement section as seen from a normal direction to the principal surface of the semiconductor substrate, wherein the peripheral portion includes a ring region of the second conductivity type arranged in the first silicon carbide semiconductor layer so as to surround the unit cell arrangement section as seen from a normal direction to the principal surface of the semiconductor substrate, wherein an impurity concentration profile of the second conductivity type in a depth direction in the ring region is equal to an impurity concentration profile of the second conductivity type in a depth direction in the second body region of each unit cell.

A method for manufacturing a semiconductor device in another aspect of the present invention includes the steps of: forming a first silicon carbide semiconductor layer on a semiconductor substrate, the first silicon carbide semiconductor layer including a drift region of a first conductivity type and a second body region of a second conductivity type; forming a mask on a partial region of a surface of the first silicon carbide semiconductor layer; forming a first body region of the second conductivity type in the second body region of the first silicon carbide semiconductor layer by implanting an impurity using the mask; forming a side wall on a side surface of the mask; and forming a trench running through the first body region so as to expose the drift region therethrough by etching the first silicon carbide semiconductor layer using the mask and the side wall.

In the step of forming the first body region, the first body region which does not reach the drift region is formed.

The method further includes the step of: forming an impurity region by implanting an impurity into a surface portion of the second body region, between the step of forming the first silicon carbide semiconductor layer and the step of forming the mask, wherein: in the step of forming the trench, a trench running through the first body region and the impurity region is formed.

The step of forming the first silicon carbide semiconductor layer includes the step of: forming the second body region while defining the drift region in an area other than the second body region by implanting an impurity into a surface portion of silicon carbide semiconductor layer of the first conductivity type.

The method further includes the step of forming a contact region in the impurity region and the second body region, before the step of forming the mask.

The method further includes the steps of: after the step of forming the trench, activating the impurity region, the first body region and the second body region by performing a heat treatment on the first silicon carbide semiconductor layer; and after the step of activation, forming a second silicon carbide semiconductor layer so as to cover at least a side surface of the trench; forming a gate insulating film on the second silicon carbide semiconductor layer; forming a gate electrode on the gate insulating film; removing a portion of the gate insulating film and the second silicon carbide semiconductor layer so that a portion of the source region and the contact region are exposed; forming a first ohmic electrode so as to be in contact with the exposed portion of the impurity region and the contact region; and forming a second ohmic electrode so as to be in contact with a surface of the substrate with which the first silicon carbide semiconductor layer is not in contact.

The semiconductor device includes a unit cell arrangement section including the plurality of unit cells arranged therein, and a perimeter portion arranged outside the unit cell arrangement section as seen from a normal direction to the principal surface of the substrate; in the perimeter portion, the first silicon carbide semiconductor layer includes a ring region of the second conductivity type arranged so as to surround the unit cell arrangement section as seen from a normal direction to the principal surface of the substrate; and the second body region and the ring region are formed in the same step.

Embodiments of the semiconductor device of the present invention will now be described. Note that the embodiments to be described below are merely examples, and the present invention is not limited to the following embodiments.

The semiconductor device to be described below includes a MISFET formed by a silicon carbide semiconductor layer functioning as a channel region, a gate electrode for controlling the current flowing into the silicon carbide semiconductor layer, and a first ohmic electrode and a second ohmic electrode electrically connected to the silicon carbide semiconductor layer. This MISFET operates as a diode for allowing a current to flow from the first ohmic electrode to the second ohmic electrode through the channel region when the potential of the gate electrode with respect to the potential of the first ohmic electrode is greater than or equal to zero and less than the threshold voltage Vth of the transistor. That is, the semiconductor device of the present embodiment is a semiconductor device including a MISFET, and the channel region of the MISFET exhibits diode characteristics under a predetermined condition.

The present specification defines Vds as the potential of the second ohmic electrode D (drain electrode) with respect to the potential of the first ohmic electrode S (source electrode), Vgs as the potential of the gate electrode G with respect to the potential of the first ohmic electrode S, the "forward direction" as the direction in which the current flows from the second ohmic electrode D to the first ohmic electrode S, and the "reverse direction" as the direction in which the current flows from the first ohmic electrode S to the second ohmic electrode D. Note that the unit for the potential and that for the voltage are both volts (V).

The description in the present specification assumes that the first conductivity type is of the n-type, and the second conductivity type is of the p-type. However, the first conductivity type may be the p-type and the second conductivity type may be the n-type. Suffixes "+" or "−" on the upper right corner of the conductivity type designation, n or p, represents the relative impurity concentration. The designation "$n^+$" means a higher n-type impurity concentration than "n", and "$n^-$" means a lower n-type impurity concentration than "n".

Embodiment 1-1

Configuration of semiconductor device 311

FIG. 1(a) schematically shows a cross section of a semiconductor device 311 of Embodiment 1-1. the semiconductor device 311 includes MISFETs as unit cells 100u. FIG. 1(a) shows a cross section of two MISFETs located on the right side and the left side of the one-dot-chain line. The semiconductor device typically includes a plurality of unit cells arranged in one dimension or two dimensions.

The semiconductor device 311 includes a semiconductor substrate 101 of the first conductivity type, and a first silicon carbide semiconductor layer 102 of the first conductivity type located on the principal surface of the semiconductor substrate 101. The semiconductor substrate 101 has n$^+$-type conductivity, and is of silicon carbide.

The first silicon carbide semiconductor layer 102 includes a drift region 102d, and a body region 103 located on the drift region 102d. The body region 103 includes a first body region 103a and a second body region 103b. As shown in FIG. 1(a), the first body region 103a is in contact with the drift region 102d and an impurity region 104, and is in contact with a second silicon carbide semiconductor layer 106 on the side surface of a trench 120. The second body region 103b is in contact with the drift region 102d and the first body region 103a. The first body region 103a covers a side surface 103s of the second body region 103b. The first body region 103a and the second body region 103b are each of the second conductivity type, and have different impurity concentrations from each other. Specifically, the average impurity concentration of the second body region 103b is smaller than the average impurity concentration of the first body region 103a. In the present embodiment, the first body region 103a is of the p$^+$-type, and the second body region 103b is of the p-type. Herein, the average impurity concentration means an average value of the impurity concentration distribution in the region.

The impurity region 104 of the first conductivity type is located on the body region 103. In the present embodiment, the impurity region 104 is of the n$^+$-type, and functions as the source region. The impurity region 104 in contact with the second body region 103b.

Preferably, a contact region 105 of the second conductivity type in contact with the second body region 103b is formed in the impurity region 104. The contact region 105 is preferably of the P$^{++}$-type or the p$^+$-type. A first ohmic electrode 109 is formed on the impurity region 104. The first ohmic electrode 109 is formed on the surface of the impurity region 104 and the contact region 105, and is electrically connected to both the impurity region 104 and the contact region 105. Where the contact region 105 is not provided, the impurity region 104 may be provided with a contact trench for exposing the second body region 103b therethrough, and the first ohmic electrode 109 may be formed in the trench 120, thereby allowing the second body region 103b and the first ohmic electrode 109 to be in direct contact with each other.

As shown in FIG. 1(a), the semiconductor device 311 includes the trench 120 having an opening 120a in the impurity region 104. The trench 120 runs through the impurity region 104 and the body region 103 to reach the drift region 102d. Therefore, a portion of the impurity region 104, the first body region 103a, which is a portion of the body region 103, and a portion of the drift region 102d together form a side surface 120c of the trench 120. A portion of the drift region 102d forms a bottom surface 120b of the trench 120.

The second silicon carbide semiconductor layer 106 is located on at least the side surface 120c of the trench 120. The second silicon carbide semiconductor layer 106 is in contact with a portion of the impurity region 104, and a portion of the first body region 103a and the drift region 102d, which form the side surface 120c of the trench 120. The second silicon carbide semiconductor layer 106 may be provided in the trench 120 so as to be in contact with at least the first body region 103a, and the second silicon carbide semiconductor layer 106 does not need to be located on the bottom surface 120b of the trench 120. In the present embodiment, the second silicon carbide semiconductor layer 106 is provided on the side surface 120c and the bottom surface 120b of the trench 120 and a surface 104a of the impurity region 104. The second silicon carbide semiconductor layer 106 has the first conductivity type and is formed by epitaxial growth. The second silicon carbide semiconductor layer 106 includes a channel region 106c, which is located on the first body region 103a and functions as a transistor channel. Therefore, the second silicon carbide semiconductor layer 106 is referred to also as the "channel epi layer". The length of the channel region 106c (channel length) accounts for the length indicated by a double-headed arrow shown in FIG. 1(a). That is, the "channel length" of the MISFET is defined by the depth of the first body region 103a in the figure.

With the impurity region 104 and the second silicon carbide semiconductor layer 106 described above, the first body region 103a is in contact with the impurity region 104, the second silicon carbide semiconductor layer 106 and the drift region 102d, and completely covers the side surface 103s of the second body region 103b.

A gate insulating film 107 is located on the second silicon carbide semiconductor layer 106, and a gate electrode 108 is formed on the gate insulating film 107. A second ohmic electrode 110 is formed on the reverse surface of the semiconductor substrate 101. In the present embodiment, the second ohmic electrode 110 is a drain electrode.

The second ohmic electrode 110 is formed on the reverse surface of the semiconductor substrate 101. A reverse surface wiring electrode 113 is further formed on the second ohmic electrode 110. An interlayer insulating film 111 is formed so as to cover the gate electrode 108, and an upper wiring electrode 112 is formed on the interlayer insulating film 111. The upper wiring electrode 112 is connected to the first ohmic electrode 109 through a contact hole 111c provided in the interlayer insulating film 111.

The unit cell 100u has a square shape, for example, as the semiconductor device 311 is seen from the side of the upper wiring electrode 112. It may have a rectangular shape, a rectangular shape or a polygonal shape other than a four-sided shape. FIG. 1(b) shows an arrangement of the unit cells 100u in the semiconductor device 311. In the example shown in FIGS. 1(a) to 1(c), the semiconductor device 311 includes a plurality of MISFETs, as the unit cells 100u. As shown in FIG. 1(b), the unit cells 100u are arranged, for example, in two dimensions in the x and y directions, and are arranged in the y direction while being shifted by ½ from one another. Where the unit cells 100u have a shape elongated in one direction, they may be arranged in parallel to one another as shown in FIG. 1(c). As shown in FIG. 1(a), the semiconductor substrates 101 and the first silicon carbide semiconductor layers 102 of the unit cells 100u are connected together. The upper wiring electrode 112 and the reverse surface wiring electrode 113 of the unit cells 100u are also connected together.

The semiconductor device 311 of the present embodiment includes the first body region 103a and the second body region 103b having different impurity concentrations from each other. With this structure, the channel region 106c can be used as a current path of a free-wheeling diode so as to suppress the forward current flowing through the pn junction formed by the body region 103 and the drift region 102d, thereby suppressing the increase in crystal defects while ensuring an appropriate withstand voltage. Such a function will now be described together with the operation of the semiconductor device 311.

First, the diode operation of the semiconductor device 311 will be described.

As shown in FIG. 1(a), in the semiconductor device 311, the gate electrode 108, the gate insulating film 107 and the second silicon carbide semiconductor layer 106 together form a MIS structure, and the current to flow through the second silicon carbide semiconductor layer 106 connected to the first ohmic electrode 109 and the second ohmic electrode 110 is controlled by the voltage applied to the gate electrode 108. Where the threshold voltage of the MISFET (the threshold voltage of the forward current) is denoted as Vth, the MISFET is in the ON state when Vgs≥Vth, whereas when Vds>0 V, a current flows from the second ohmic electrode 110 to the first ohmic electrode 109 through the second silicon carbide semiconductor layer 106. On the other hand, where Vgs<Vth, it is in the OFF state as a transistor.

However, even if the MISFET is in the OFF state, 0 V≤Vgs<Vth holds, and when Vds<0 V, it functions as a diode for allowing a current to flow from the first ohmic electrode 109 to the second ohmic electrode 110 through the second silicon carbide semiconductor layer 106 by appropriately selecting the impurity concentration of the first body region 103a, the impurity concentration of the second silicon carbide semiconductor layer 106, and the thickness of the second silicon carbide semiconductor layer 106. In other words, the second silicon carbide semiconductor layer 106 and the body region 103 are configured so that where 0 V≤Vgs<Vth is satisfied, a current flows from the first ohmic electrode 109 to the second ohmic electrode 110 through the second silicon carbide semiconductor layer 106 before a current starts to flow from the body region 103 to the drift region 102d, as Vds becomes less than 0 volt. Hereinafter, in the present specification, a diode that allows a current to flow from the first ohmic electrode 109 to the second ohmic electrode 110 through the second silicon carbide semiconductor layer 106 including the channel region 106c will be referred to as a "channel diode". As the direction from the second ohmic electrode 110 to the first ohmic electrode 109 is defined as the "forward direction" and the direction from the first ohmic electrode 109 to the second ohmic electrode 110 as the "reverse direction", the direction in which this diode allows a current to flow is the "reverse direction".

This channel diode, which uses the channel region 106c of the MISFET as the current path, has such a characteristic that a current of 1 mA or more is not allowed to flow where Vds>Vf0 (Vf0 is a negative value) and a current of 1 mA or more is allowed to flow where Vds≤Vf0. In other words, although the current flowing through this diode is almost zero (less than 1 mA) when Vds>Vf0 (Vf0 is a negative value), it becomes 1 mA when Vds reaches Vf0 as Vds is gradually decreased from zero (as the absolute value of Vds is increased), and it increases as Vds is further decreased (as the absolute value thereof is increased). In this sense, Vf0 corresponds to the "rising voltage" in the current-voltage characteristics of the diode.

As a current is allowed to flow through the channel diode, the semiconductor device 311 of the present embodiment provides the following advantageous effects. With silicon carbide semiconductors, a unique problem has been reported that the forward current flowing through the pn junction of a silicon carbide semiconductor increases the stacking defects due to semiconductor substrate bottom surface dislocations. Therefore, when a return current flows through the body diode of the MISFET in a conventional semiconductor device of silicon carbide, the return current will accelerate crystalline deterioration of silicon carbide at the pn junction of the body diode. In contrast, with the semiconductor device 311 of the present embodiment, more of the return current flows through the channel diode, thereby suppressing the increase in crystal defects. Since the channel diode operates in a unipolar operation, the reverse recovery current when the diode transitions from the ON state to the OFF state is reduced. Thus, it is possible to suppress the decrease in the recovery loss or the switching speed, for example.

Next, the impurity concentration of the first body region 103a will be described.

In the semiconductor device 311 of the present embodiment, the average impurity concentration of the first body region 103a is designed so that the rising voltage Vf0 of the diode and the threshold voltage Vth of the transistor in the semiconductor device 311 are each of an intended value. Particularly, the rising voltage Vf0 of the diode is set to be smaller than the rising voltage Vf of the pn junction diode formed by the body region 103 and the first silicon carbide semiconductor layer 102.

The rising voltage Vf0 of the diode and the threshold voltage Vth of the transistor are each primarily determined by the impurity concentration of the first body region 103a of the body region 103 which is in contact with the second silicon carbide semiconductor layer 106, the impurity concentration and the thickness of the second silicon carbide semiconductor layer 106, and the thickness of the gate insulating film 107.

Figure 2:
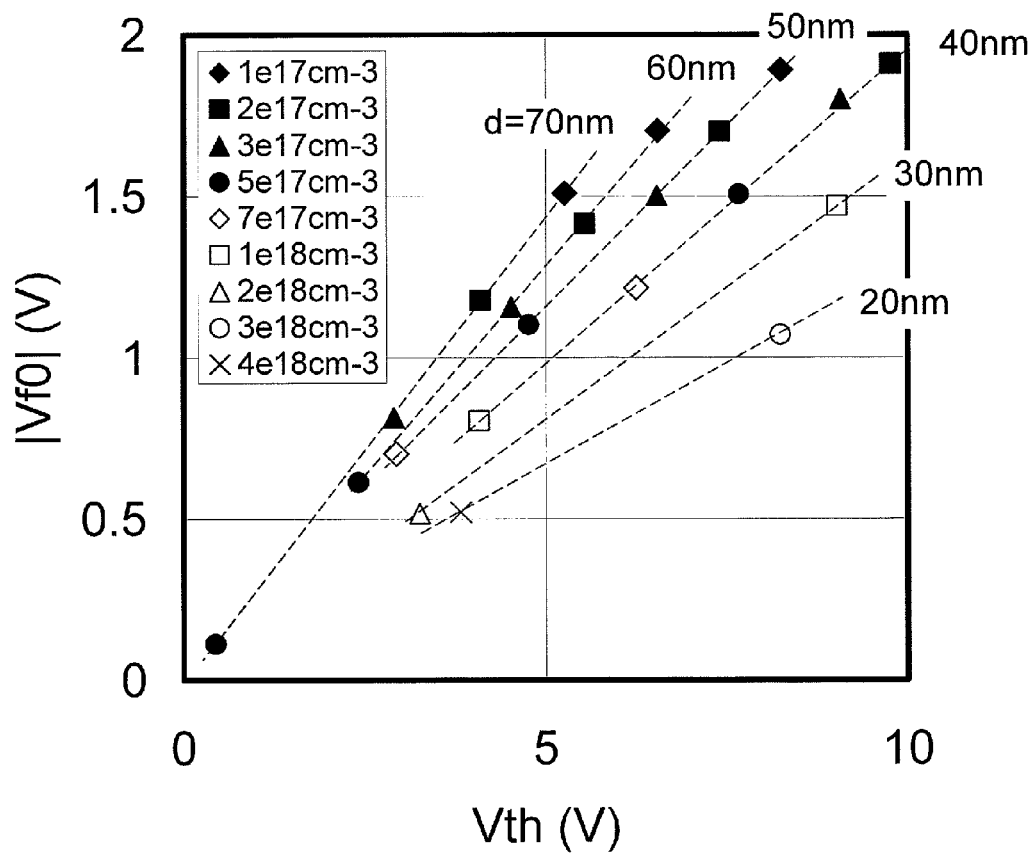
FIG. 2 A graph showing the relationship of the threshold Vth of the semiconductor device and the rising voltage |Vf0| of the channel diode with respect to the impurity concentration and the thickness of the second silicon carbide semiconductor layer for a semiconductor device of an embodiment.
Figure 4:
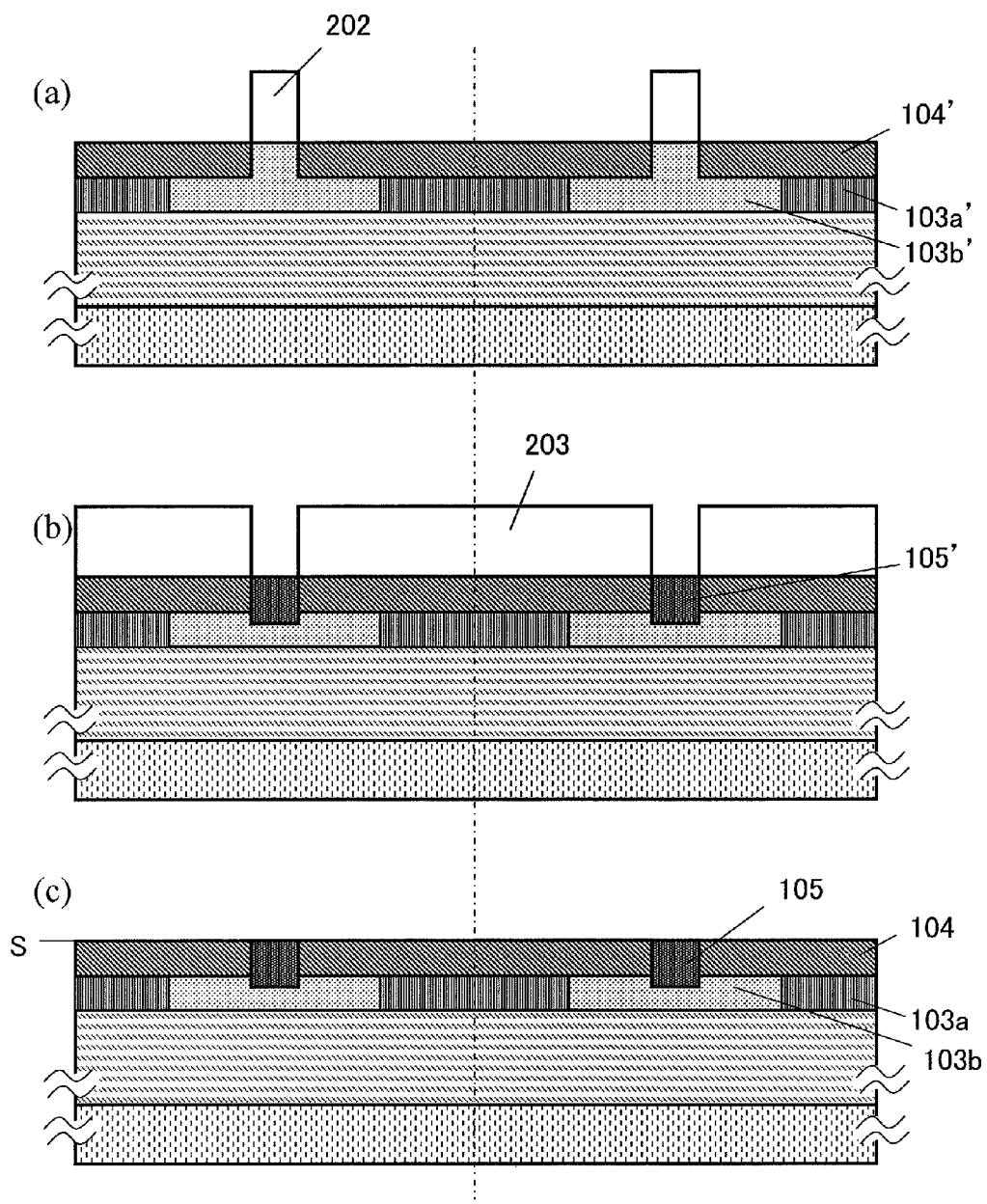
FIGS. 4 (*a*) to (*c*) are process cross-sectional views illustrating the method for manufacturing the semiconductor device shown in FIG. 1.
Figure 5:
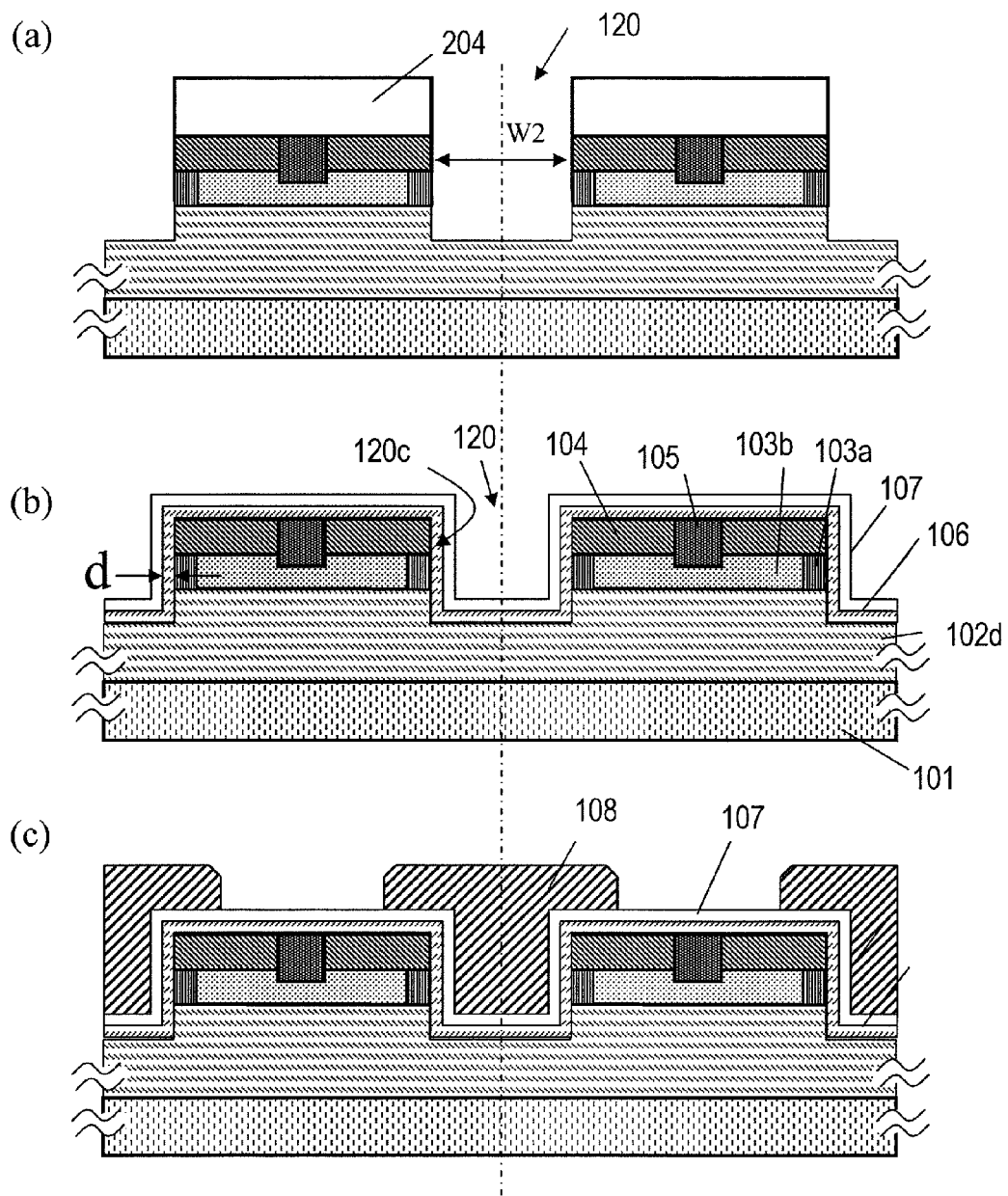
FIGS. 5 (*a*) to (*c*) are process cross-sectional views illustrating the method for manufacturing the semiconductor device shown in FIG. 1.
Figure 6:
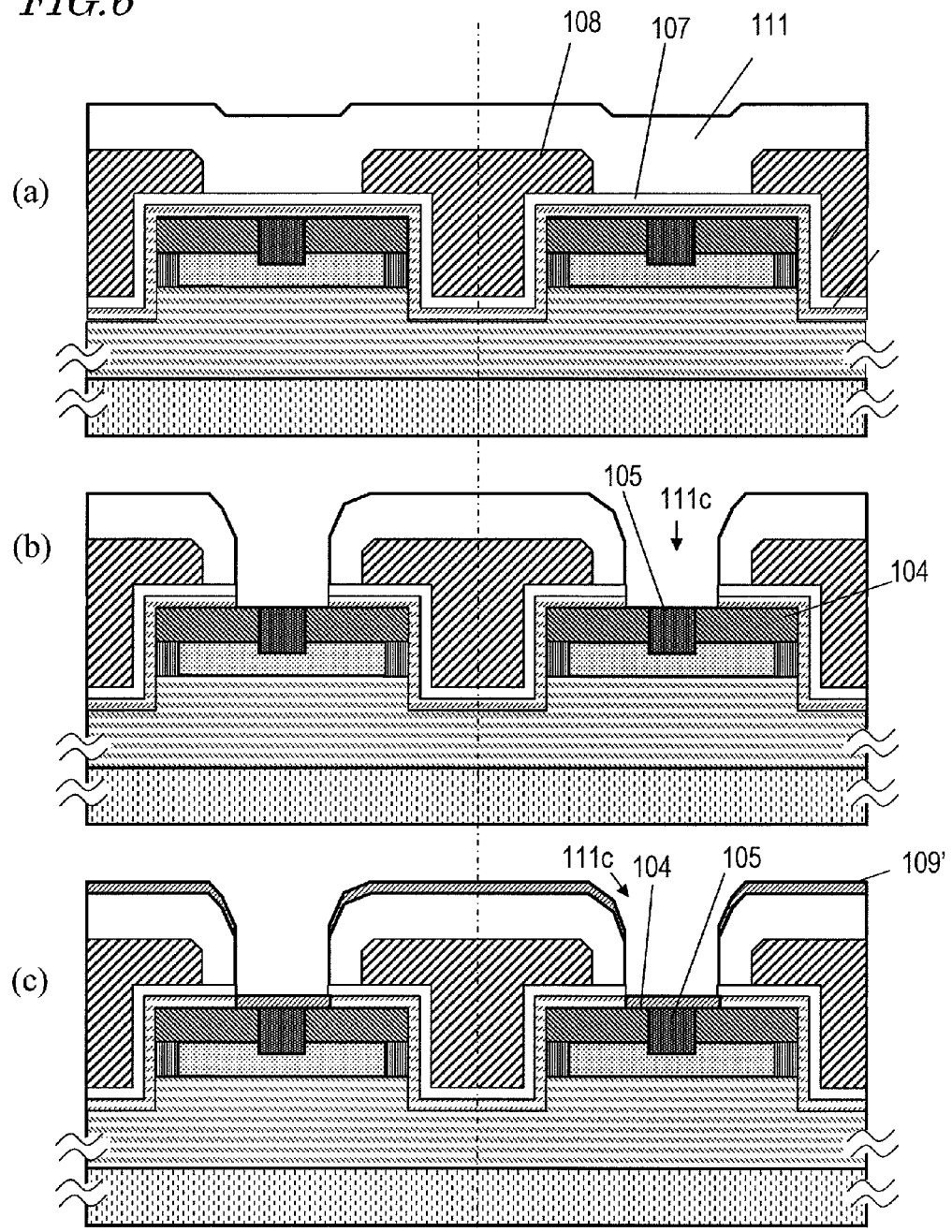
FIGS. 6 (*a*) to (*c*) are process cross-sectional views illustrating the method for manufacturing the semiconductor device shown in FIG. 1.
Figure 7:
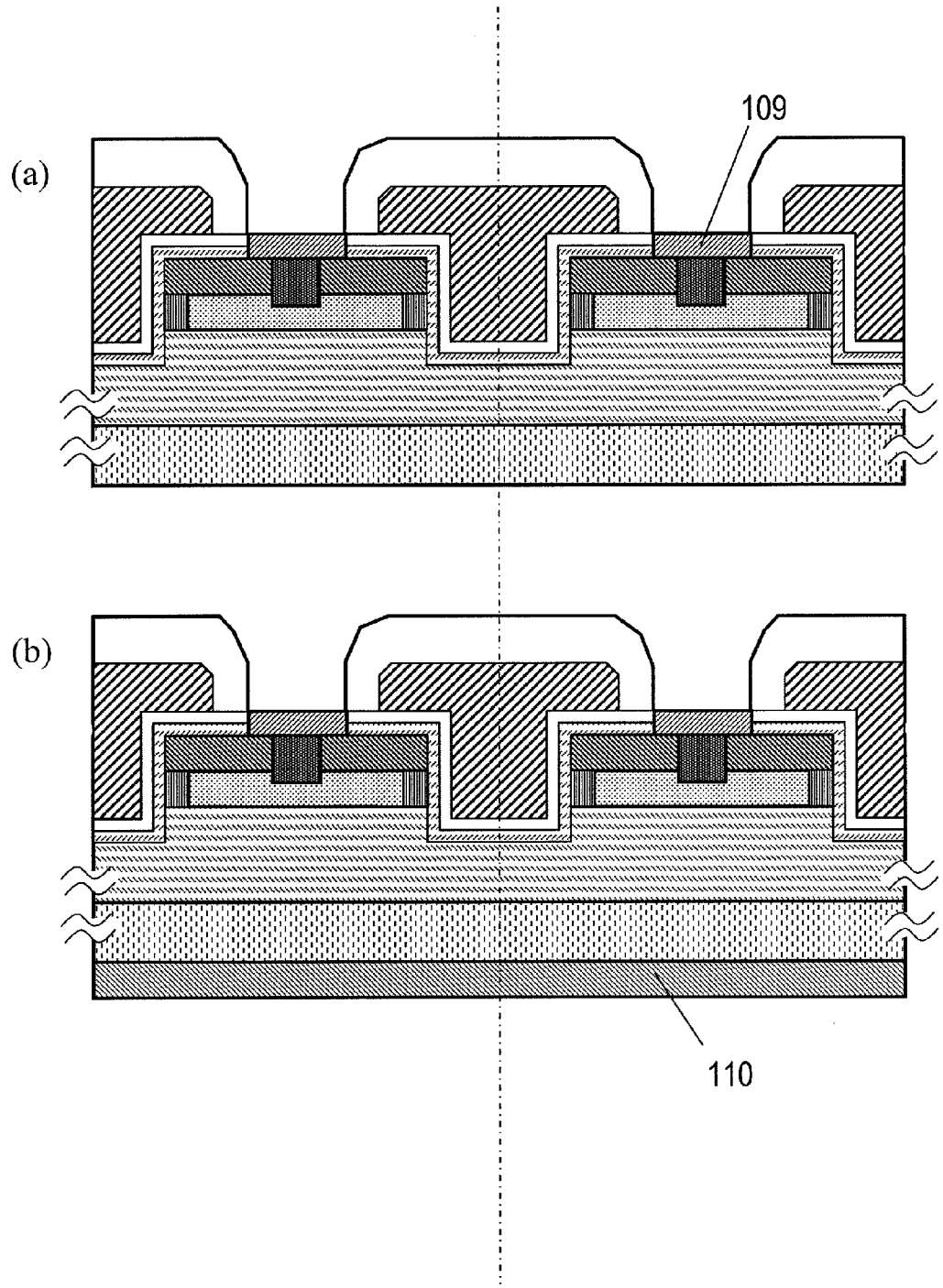
FIGS. 7 (*a*) and (*b*) are process cross-sectional views illustrating the method for manufacturing the semiconductor device shown in FIG. 1.

With the semiconductor device 311 of the present embodiment, Vth and Vf0 can be controlled independently. FIG. 2 shows simulation results showing the relationship of the impurity concentration of the second silicon carbide semiconductor layer 106 and the thickness thereof with respect to the threshold voltage Vth of the transistor and the absolute value |Vf0| of the rising voltage of the channel diode, where the thickness of the gate insulating film 107 is set to 70 nm and the impurity concentration of the first body region 103a to $1\times10^{19}$ cm$^{-3}$, as an example. From FIG. 2, where the absolute value |Vf0| of the rising voltage Vf0 of the channel diode is to be set to about 1 V, if the impurity concentration of the second silicon carbide semiconductor layer 106 is set to about $2.5\times10^{17}$ cm$^{-3}$ and the thickness of the second silicon carbide semiconductor layer 106 to about 70 nm, Vth of the semiconductor device 311 will be about 3.5 V. If the impurity concentration of the second silicon carbide semiconductor layer 106 is set to about $1.5\times10^{18}$ cm$^{-3}$ and the thickness of the second silicon carbide semiconductor layer 106 to about 30 nm, Vth of the semiconductor device 311 can be set to about 6.1 V while maintaining |Vf0| to be about 1 V. Note that in the semiconductor device of the present embodiment, the relationship of the rising voltage |Vf0| of the channel diode and the threshold voltage Vth of the transistor with respect to the dopant concentration of the body region exhibits a similar tendency to that of FIG. 48.

In the semiconductor device of the present embodiment, the concentration of the first body region 103a is desirably $1\times10^{18}$ cm$^{-3}$ or more, for example. More desirably, the concentration of the first body region 103a is $5\times10^{18}$ cm$^{-3}$ or more. Then, in the depletion layer expanding between the body region 103 and the channel region 106c, the expansion of the depletion layer on the side of the body region 103 can be suppressed, and it is therefore possible to decrease the potential barrier at the interface between the gate insulating film and the channel layer.

The thickness of the first body region 103a in the direction parallel to the substrate surface, which is defined between the interface at which the first body region 103a contacts the second silicon carbide semiconductor layer 106 and the interface at which the first body region 103a contacts the second body region 103b, is desirably such that the depletion layer expanding from the interface between the first body region 103a and the second silicon carbide semiconductor layer 106 into the first body region 103a stays within the first body region 103a with 0 V applied to the gate electrode 108. For example, the thickness of the first body region 103a in the direction parallel to the substrate surface is 50 nm or more.

Where the interface, perpendicular to the substrate surface, at which the impurity region 104 contacts the first ohmic electrode 109 is denoted as F1, and the interface at which the impurity region 104 contacts the second silicon carbide semiconductor layer 106 as F2, the thickness of the first body region 103a in the direction parallel to the substrate surface is preferably smaller than the length defined by F1 and F2 in the direction parallel to the substrate surface.

Thus, it is possible to suppress the influence of the increase in the resistance of the impurity region 104 resulting from the counter doping on the first body region 103a. Particularly, where the first body region 103a is formed by an ion implantation with a high implantation dose, it is possible to more effectively reduce the occurrence of a leak current in the semiconductor device.

The first body region 103a is desirably in contact with the impurity region 104 and the first silicon carbide semiconductor layer 102. If the concentration is increased over the entire area of a portion of the body region 103 that is in contact with the second silicon carbide semiconductor layer 106, the threshold voltage and the rising voltage can be designed independently of the second body region 103b.

With the semiconductor device 311 of the present embodiment, the impurity concentration of the first body region 103a can be increased independently of the second body region 103b. Therefore, by setting both the impurity concentration of the first body region 103a and the impurity concentration of the second silicon carbide semiconductor layer 106 to be high, the absolute value of Vf0 can be set to be smaller than the absolute value of Vf at which a current starts to flow through the body diode formed by the first silicon carbide semiconductor layer 102 and the second body region 103b. Specifically, where the MISFET is in the OFF state, 0 V≤Vgs<Vth, and Vds<0 V, it is possible to allow a current to flow through the channel diode before a current starts to flow through the body diode.

In the semiconductor device 311 of the present embodiment, the second silicon carbide semiconductor layer 106 is formed so as to be in contact with the first body region 103a, which can be controlled independently. Therefore, by appropriately controlling the impurity concentration of the first body region 103a and the impurity concentration and the thickness of the second silicon carbide semiconductor layer 106, the amount of a current to flow through the channel diode when Vds is negative can be set to a value generally equal to the amount of an ON current to flow through the transistor when Vds is positive. For example, the reverse current to flow through the channel diode for current is set to be ⅕ or more and twice or less the rated ON current of the transistor. Therefore, even if Vds is negative (reverse direction), the current to flow through the body diode formed between the second body region 103b and the first silicon carbide semiconductor layer 102 can be reduced significantly (or to zero), and it is possible to allow more current to flow through the channel diode. That is, with the semiconductor device 311 of the present embodiment, the function of a so-called free-wheeling diode connected anti-parallel with a MISFET provided in a common inverter circuit can be built in the MISFET in the semiconductor device 311.

Conversely, with a MISFET in which the first body region is not in contact with the second silicon carbide semiconductor layer, such settings cannot be done, and it is difficult to realize a channel diode that functions as a free-wheeling diode under appropriate conditions.

Next, the impurity concentration of the second body region 103b will be described.

The average impurity concentration of the second body region 103b of the semiconductor device 311 is set so that an intended withstand voltage is ensured.

The withstand voltage of the semiconductor device 311 is determined primarily by the pn junction formed by the second body region 103b and the first silicon carbide semiconductor layer 102.

By setting the dopant concentration of the second body region 103b to be larger than the absolute value of the dopant concentration of the drift region 102d, the withstand voltage of the semiconductor device 311 is designed primarily by the dopant concentration of the first silicon carbide semiconductor layer 102. In order to realize a semiconductor device having a high withstand voltage of some hundreds of volts or more, the dopant concentration of the drift region 102d is preferably smaller than $1\times10^{17}$ cm$^{-3}$. Therefore, in the semiconductor device of the present embodiment, the concentration of the second body region 103b is desirably $1\times10^{17}$ cm$^{-3}$ or more and less than or equal to the concentration of the first body region. By setting the dopant concentration of the second body region 103b to be smaller than the dopant concentration of the first body region 103a, it is possible to suppress the leak current, which may possibly occur if the concentration of the body region is increased.

Now, the relationship between the first body region 103a and the second body region 103b will be described.

In the semiconductor device 311 of the present embodiment, the body region 103 is divided into the first body region 103a and the second body region 103b. Therefore, the impurity concentration of the first body region 103a and the impurity concentration of the second body region 103b can be adjusted independently. Specifically, the rising voltage Vf0 of the channel diode can be controlled by adjusting the impurity concentration of the first body region 103a, whereas the withstand voltage of the semiconductor device 311 can be controlled by adjusting the impurity concentration of the second body region 103b. Therefore, the semiconductor device 311 of the present embodiment can realize both a low rising voltage Vf0 of the channel diode and a high withstand voltage.

In order to set the rising voltage Vf0 of the channel diode to be low while setting the withstand voltage to be high, the average impurity concentration of the first body region 103a is desirably small, and the average impurity concentration of the first body region is preferably higher than the average impurity concentration of the second body region 103b. For example, the average impurity concentration of the first body region 103a is set to be $1\times10^{18}$ cm$^{-3}$ or more and $1\times10^{20}$ cm$^{-3}$ or less, and the average impurity concentration of the second body region 103b is set to be $1\times10^{17}$ cm$^{-3}$ or more and $1\times10^{19}$ cm$^{-3}$ or less. More preferably, the average impurity concentration of the first body region 103a is twice or more the average impurity concentration of the second body region 103b.

Thus, with the semiconductor device 311 of the present embodiment, the function of a so-called free-wheeling diode connected anti-parallel with a MISFET provided in a common inverter circuit can be provided by the channel diode of the semiconductor device 311. That is, the MISFET in the semiconductor device 311 includes a free-wheeling diode built therein.

Since the absolute value of the rising voltage Vf0 of the channel diode can be set to be smaller than the absolute value of the rising voltage of the body diode, it is possible to reduce the power loss at the inverter circuit. Moreover, since the current flowing through the body diode can be dramatically reduced, it is possible to suppress the crystalline deterioration of the semiconductor device 311 and to maintain the high withstand voltage characteristics. Therefore, the semiconductor device 311 has a high reliability.

[Method for Manufacturing Semiconductor Device 311]

Next, referring to FIGS. 3 to 7, an example of a method for manufacturing the semiconductor device 311 of the present embodiment will be described in detail. Note that the following description is merely illustrative, and the present invention is not limited to particular processes, conditions, concentrations, thicknesses, etc.

First, the semiconductor substrate 101 is prepared. The semiconductor substrate 101 is, for example, an n-type 4H—SiC off-cut semiconductor substrate having a low resistance (resistivity 0.02 Ωcm).

As shown in FIG. 3(a), the first silicon carbide semiconductor layer 102 having a high resistance is epitaxially grown on the semiconductor substrate 101. For example, the first silicon carbide semiconductor layer 102 is of n-type 4H—SiC, and the impurity concentration and the thickness thereof are $1\times10^{16}$ cm$^{-3}$ and 10 μm, respectively. A buffer layer of silicon carbide having a high impurity concentration may be deposited on the semiconductor substrate 101 before the formation of the first silicon carbide semiconductor layer 102. For example, the impurity concentration of the buffer layer is $1\times10^{18}$ cm$^{-3}$, and the thickness thereof is 1 μm.

Next, as shown in FIG. 3(b), a second body region 103b' of the second conductivity type is formed on the first silicon carbide semiconductor layer 102. The second body region 103b' is formed by implanting ion onto the first silicon carbide semiconductor layer 102. Alternatively, the second body region 103b' can be formed by epitaxial growth on the first silicon carbide semiconductor layer 102. An example where the second body region 103b' is formed by ion implantation will now be described. An area of the first silicon carbide semiconductor layer 102 other than the second body region 103b' is the drift region 102d.

For example, Al ion is implanted onto the first silicon carbide semiconductor layer 102. An area of the second body region 103b' formed herein where a first body region 103a' is not formed in a subsequent step becomes the second body region 103b of the semiconductor device 311. Note that the second body region 103b' formed in this step only needs to be formed at least in an area to be the second body region 103b of the semiconductor device 311 after the subsequent activation step.

FIG. 3(b) shows only a cross section of the unit cell, and the second body region 103b' is formed across the entire unit cell. Therefore, although a mask for patterning is not shown in the figure, where a peripheral structure for relaxing the electric field localization around a plurality of MISFETs is formed in a ring shape (where a plurality of 103f of FIG. 8(c) to be discussed later are formed so as to form an FLR structure 116), for example, a mask made of SiO$_2$, for example, may be formed in this step, and the second body region 103b' patterned into a peripheral portion (corresponds to 103f of FIG. 8(c)) may be formed. Where Al is used as the impurity species, the change in the concentration profile due to diffusion can be substantially ignored because the diffusion coefficient is small. Where B (boron) is used as an impurity of the body region, one can grasp the activation rate and the diffusion coefficient in advance, and can select the energy and the dose of ion implantation so that an intended impurity concentration profile is obtained. Where the activation rate is assumed to be 100%, and the second body region 103b is formed by using aluminum, for example, the aluminum ion implantation energy and dose are as follows.

30 keV: $6.0\times10^{12}$ cm$^{-2}$
70 keV: $1.2\times10^{13}$ cm$^{-2}$
150 keV: $2.5\times10^{13}$ cm$^{-2}$
350 keV: $6.0\times10^{13}$ cm$^{-2}$ After the ion implantation, a mask 201 is formed as shown in FIG. 3(c), and then aluminum, for example, is ion-implanted into the second body region 103b' using the mask 201, thereby forming the first body region 103a'. The impurity concentration of the first body region 103a' is inevitably higher than the impurity concentration of the second body region 103b' due to the ion implantation into the second body region 103b'. The implantation energy is set to be equal to that for the second body region 103b', for example, and the dose is adjusted to be five times more, for example. In this case, the dose to be implanted additionally is about four times more, and the aluminum ion implantation energy and dose are as follows.

30 keV: $2.4\times10^{13}$ cm$^{-2}$
70 keV: $4.8\times10^{13}$ cm$^{-2}$
150 keV: $1.0\times10^{14}$ cm$^{-2}$
350 keV: $2.4\times10^{14}$ cm$^{-2}$ In the first body region 103a' formed as described above, the trench 120 is formed in a subsequent step, and the remaining region is activated to be the first body region 103a of the semiconductor device 311. Where the width of the first body region 103a' after this step is denoted as W1 and the width of the trench 120 as W2, the width W3 of the first body region 103a after the formation of the semiconductor device 311 is (W1−W2)/2. The width W3 of the first body region 103a is determined based on the concentration/thickness of the second silicon carbide semiconductor layer 106 to be formed later and the thickness of the gate insulating film. It is only needed that the depletion layer expanding from the interface between the second silicon carbide semiconductor layer 106 and the first body region 103a into the first body region 103a stays within the first body region 103a with 0 V applied to the gate electrode 108. For this, within the range of applications of the present embodiment, it is only needed that the width W3 (thickness) of the first body region 103a is 100 nm or more. That is, it is only needed that W1≥W2+100×2 (nm).

Then, after removing the mask 201, a mask 202 is formed, and an impurity region 104' of the first conductivity type is formed as shown in FIG. 4(a). The mask 202 may be formed by etching a portion of the mask 201. The impurity region 104' of the first conductivity type can be formed by ion implantation using nitrogen, for example.

The mask 202 is removed after the ion implantation, and then Al is implanted after a mask 203 is formed as shown in FIG. 4(b), thus forming a contact region 105'.

After these ion implantations, the mask 203 is removed and activation annealing is performed, thus forming the first body region 103a, the second body region 103b, the impurity region 104, and the contact region 105 as shown in FIG. 4(c). By forming the first body region 103a and the second body region 103b using the same implantation energy, the depth of the first body region 103a and that of the second body region 103b can be made generally equal to each other. When formed with the implantation energy of the above example, the depth of the first body region 103a and the second body region 103b with respect to the surface S of the impurity region 104 is about 500 nm. The ion implantation profile is determined so that the average impurity concentration of the first body region 103a is about $1\times10^{19}$ cm$^{-3}$. The ion implantation profile is adjusted so that the average impurity concentration of the second body region 103b is about $2\times10^{18}$ cm$^{-3}$. The depth of the impurity region 104 is adjusted to be 250 nm, for example, with respect to the surface S. The ion implantation profile is adjusted so that the average impurity concentration of the impurity region 104 is about $5\times10^{19}$ cm$^{-3}$. Now, the first body region 103a and the second body region 103b are defined as regions where the p-type impurity concentration is $5\times10^{17}$ cm$^{-3}$ or more, for example. The impurity region 104 is defined as a region where the n-type impurity concentration is $5\times10^{17}$ cm$^{-3}$ or more, for example.

The depth of the contact region 105 is 400 nm, for example, with respect to the surface S, and the average impurity concentration is about $1\times10^{20}$ cm$^{-3}$, for example. The contact region 105 is defined as a region where the p-type impurity concentration is $5\times10^{17}$ cm$^{-3}$ or more, for example. Note that a surface layer of the first silicon carbide semiconductor layer 102 may be removed for surface cleaning of the first silicon carbide semiconductor layer 102 after the activation annealing. Where a surface layer of the first silicon carbide semiconductor layer 102 is removed by 50 nm, for example, the depths of the first body region 103a, the second body region 103b, the impurity region 104 and the contact region 105 are all reduced by 50 nm to be 450 nm, 450 nm, 200 nm and 350 nm, respectively.

Next, as shown in FIG. 5(a), a mask 204 is formed, and the trench 120 is formed, running through the impurity region 104 and the first body region 103a so as to expose the first silicon carbide semiconductor layer 102. The trench 120 is formed by dry-etching portions of the impurity region 104, the first body region 103a and the first silicon carbide semiconductor layer 102, using a mixed gas of Freon and oxygen, for example. The width W2 of the trench 120 is about 1 μm, for example, and the depth is about 1.1 μm, for example. The mask 204 is made of a material that is resistant against this dry etching (e.g., aluminum). Alternatively, if the resistance is insufficient, the mask 204 having a sufficient thickness is formed.

Next, after the mask 204 is removed and the semiconductor substrate 101 is washed sufficiently, the second silicon carbide semiconductor layer (channel epi layer) 106 is grown using silicon carbide on the first body region 103a, the impurity region 104, and exposed surfaces of the contact region 105 and the first silicon carbide semiconductor layer 102, as shown in FIG. 5(b). Thus, at least the side surface 120c of the trench 120 is covered by the second silicon carbide semiconductor layer 106. In the present embodiment, the impurity concentration N (cm$^{-3}$) and the thickness d (nm) of a portion of the second silicon carbide semiconductor layer 106 that is in contact with the first body region 103a are adjusted so as to satisfy the following conditions, for example.

N=$2\times10^{18}$
d=30

Next, after dry-etching a predetermined area of the second silicon carbide semiconductor layer 106, the gate insulating film 107 is formed on the surface of the second silicon carbide semiconductor layer 106 as shown in FIG. 5(b) by thermal oxidation, for example. Where the gate insulating film 107 is formed by thermal oxidation of the second silicon carbide semiconductor layer 106, the surface region of the second silicon carbide semiconductor layer 106 is oxidized to be the gate insulating film 107. Therefore, taking into consideration the thickness to be lost through the thermal oxidation, the thickness of the second silicon carbide semiconductor layer 106 to be epitaxially grown is adjusted so as to achieve the thickness d after the formation of the gate insulating film 107.

Then, a polycrystalline silicon film doped with about $7\times10^{20}$ cm$^{-3}$ of phosphorus, for example, is deposited on the surface of the gate insulating film 107. The thickness of the polycrystalline silicon film is about 500 nm, for example.

Thus, the inside of the trench 120 formed in the first silicon carbide semiconductor layer 102 is filled with the polycrystalline silicon film.

Next, the gate electrode 108 is formed in an intended region by dry-etching the polycrystalline silicon film using a mask (not shown) as shown in FIG. 5(c).

Then, as shown in FIG. 6(a), the interlayer insulating film 111 using $SiO_2$, for example, is deposited by a CVD method so as to cover the surface of the gate electrode 108 and a portion of the gate insulating film 107 that is not covered by the gate electrode 108. The thickness of the interlayer insulating film 111 is 1.5 μm, for example.

Next, as shown in FIG. 6(b), portions of the interlayer insulating film 111, the gate insulating film 107 and the second silicon carbide semiconductor layer are removed by dry etching using a mask (not shown) so that the surface of the contact region 105 and a portion of the surface of the impurity region 104 are exposed, thereby forming the contact hole (opening portion) 111c.

Then, as shown in FIG. 6(c), a metal film 109' having a thickness of about 50 nm, for example, and made of nickel, for example, is formed on the interlayer insulating film 111 and on the contact region 105 and the impurity region 104 exposed through the contact hole 111c. Then, a heat treatment is performed in an inert atmosphere at 950° C. for 5 minutes, for example, so as to react nickel with the silicon carbide surface, thereby forming the first ohmic electrode 109 of nickel silicide, and the metal film 109' on the interlayer insulating film 111 is removed, thereby obtaining the structure shown in FIG. 7(a).

Then, as shown in FIG. 7(b), nickel, for example, is also deposited across the entire surface of the reverse surface of the semiconductor substrate 101, and is reacted with silicon carbide similarly through a heat treatment, thereby forming the second ohmic electrode 110.

Then, aluminum having a thickness of about 4 μm, for example, is deposited on the interlayer insulating film 111 and the contact hole 111c and is etched into an intended pattern, thereby obtaining the upper wiring electrode 112 shown in FIG. 1(a). Note that although not shown in the figures, a gate line (or a gate pad) to be in contact with the gate electrode at the chip edge is also formed in another area. Moreover, a layer of Ti/Ni/Ag, for example, is deposited on the reverse surface of the second ohmic electrode 110 as the reverse surface wiring electrode 113 for die-bonding (the Ti side in contact with the second ohmic electrode 110). Thus, the semiconductor device 311 shown in FIG. 1 is obtained.

As shown in FIG. 1(a), the semiconductor device 311 of the present embodiment includes the first body region 103a and the second body region 103b having different average impurity concentrations. Thus, it is possible to independently control the second body region 103b, which influences the withstand voltage, and the first body region 103a, which influences the threshold voltage Vth of the transistor and the rising voltage Vf0 of the channel diode.

However, it is desirable that the average impurity concentration of the second body region 103b is kept smaller than the average impurity concentration of the first body region 103a as described above in order to maintain the rising voltage |Vf0| of the channel diode to be small (preferably 1 V or less, and more preferably 0.6 V or less) and the threshold voltage Vth of the transistor to be positive (preferably 2 V or more and 8 V or less) while maintaining the withstand voltage. Designing the rising voltage of the channel diode to be 1 V or less allows for substitution of a Schottky diode made of SiC which is a candidate of a free-wheeling diode, and designing the rising voltage of the channel diode to be 0.6 V or less allows for substitution of a fast recovery diode made of Si. That is, it is possible to realize the function of a free-wheeling diode with only a MISFET without using these free-wheeling diodes.

The threshold voltage Vth of the forward current is preferably 2 V or more. A MISFET typically used in an inverter circuit which is a power circuit is preferably normally-OFF (Vth>0V). This is because it is safe as the drain current can be cut off even if the gate control circuit fails for some reason and the gate voltage becomes 0 V. The threshold voltage of a MISFET decreases at higher temperatures. For example, with an SiC-MOSFET, it may decrease by about 1 V for a temperature increase of 100° C. Now, where the noise margin is 1 V so that the gate is not turned ON by noise, Vth at room temperature is preferably set to be 2 V (1 V+1 V) or more. If the threshold voltage is too high, the gate voltage when turning ON the transistor will be accordingly high, thereby imposing many restrictions for the power source for generating the gate voltage. Therefore, in practice, the threshold voltage is preferably 8 V or less.

In the semiconductor device 311 of the present embodiment, the average impurity concentration of the first body region 103a and the average impurity concentration of the second body region can be controlled independently. This facilitates the process design for an electric field localization relaxing structure in a peripheral portion 100fl of the MISFET. This will be described below.

Embodiment 1-2

FIG. 8(a) is a diagram showing a semiconductor device 321 of Embodiment 1-2 as seen from the side of the upper wiring electrode 112. The semiconductor device 321 of the present embodiment includes a plurality of unit cells 100u as in Embodiment 1-1. The semiconductor device 321 is often cut out as a four-sided chip as seen from the principal surface of the semiconductor substrate, as shown in FIG. 8(a). The semiconductor device 321 includes an unit cell placement section 100ul and the peripheral portion 100fl. The unit cells shown in FIGS. 1(b) and 1(c) are arranged in the unit cell placement section 100ul. The peripheral portion 100fl is arranged so as to surround the periphery of the unit cell placement section 100ul. FIG. 8(b) is the unit cell 100u of the semiconductor device 311, already shown in FIG. 1(a). FIG. 8(c) shows a cross-sectional view taken along line E-F of FIG. 8(a). The peripheral portion 100fl includes a second conductivity type region 103d of the second conductivity type arranged in the first silicon carbide semiconductor layer 102. The second conductivity type region 103d is primarily arranged along the outermost periphery of the unit cell 100u, and is defined by a similar planar shape to the unit cell 100u (e.g., a four-sided shape shown in FIG. 1(b)).

The peripheral portion 100fl includes an FLR (Field Limited Ring) structure 116 arranged in the first silicon carbide semiconductor layer 102. The FLR structure 116 surrounds, in a ring shape, the unit cell placement section 100ul and the second conductivity type region 103d on a surface parallel to the principal surface of the semiconductor substrate 101, and is formed by a singular or a plurality of ring regions 103f. A depletion suppressing region 104f of the first conductivity type is provided outside the FLR structure 116 so as to further surround the FLR structure 116. The depletion suppressing region 104f is connected to a metal ring 112f formed by a similar process to the upper wiring electrode 112 via a metal 109f formed by a similar process to the first ohmic electrode 109.

The second conductivity type region 103d and the FLR structure 116 are desirably of the opposite conductivity type (p-type) to the conductivity type (herein, n-type) of the first silicon carbide semiconductor layer 102. The impurity concentrations of the second conductivity type region 103d and the FLR structure 116 are set based on the intended withstand voltage. The second conductivity type region 103d and the FLR structure 116 serve to increase the withstand voltage and relax the electric field localization at the edge portion of the semiconductor device 321.

At least one of the second conductivity type region 103d and the FLR structure 116 can be formed simultaneously with the formation of the body region 103 in the semiconductor device 311. This makes it possible to simplify the manufacturing process of the semiconductor device 321, and also to reduce the process cost. In FIG. 8(c), for example, when producing the semiconductor device 311, at least one of the second conductivity type region 103d and the ring region 103f can be formed simultaneously in the process of forming the second body region 103b' shown in FIG. 3(b). Thus, the second conductivity type region 103d can be given the same impurity concentration profile as that of the second body region 103b. Similarly, the FLR structure 116 can also be given the same impurity concentration profile as that of the second body region 103b.

In order to suppress the withstand deterioration of the semiconductor device 321, it is preferred to relax the electric field localization at the peripheral portion 100fl. Herein, for relaxing the electric field localization, the design of the second conductivity type region 103d and the FLR structure 116 is important. For example, the width, the interval, the number, and the impurity concentration of the ring regions 103f formed as the FLR structure 116 are designed optimally. Then, a mask set is produced for realizing a semiconductor process based on this design. Electric field localization primarily occurs at a pn junction, and in the peripheral portion 100fl, electric field localization is likely to occur at the bottom of the second conductivity type region 103d and the FLR structure 116. With the semiconductor device 321 of the present embodiment, even when the second conductivity type region 103d and the FLR structure 116 of the peripheral portion 100fl are formed simultaneously with the second body region 103b in the unit cell placement section 100ul, the impurity concentrations of these regions can be set independently of the first body region 103a. Therefore, the impurity concentration of the second body region 103b, the second conductivity type region 103d and the ring region 103f of the FLR structure 116, which influences the withstand voltage can be set, while arbitrarily making a process design for the impurity concentration of the first body region 103a. As a result, it is possible to realize the semiconductor device 321 having preferred Vth and |Vf0| while suppressing the withstand deterioration. That is, there is also an advantageous effect of providing a degree of freedom in the process design while using the same device design, without changing the device design (re-producing masks) due to changes in the impurity concentration of the body region. Controlling the concentration of the body region 1030 in the conventional semiconductor device shown in FIG. 47, for example, is expected to give a similar effect to that of controlling the concentration of the first body region 103a in FIG. 1(a). However, forming the second conductivity type region 103d and the ring region 103f of the peripheral structure simultaneously with the body region 1030 requires a redo of the design for relaxing electric field localization at the peripheral structure as necessary, thus leading to a cost increase, and forming the peripheral structure in a separate process increases the number of steps, thus also leading to an increase in the production cost.

Embodiment 1-3

The present invention is not limited Embodiment 1-1 described above, but various modifications can be made thereto.

Figure 9:
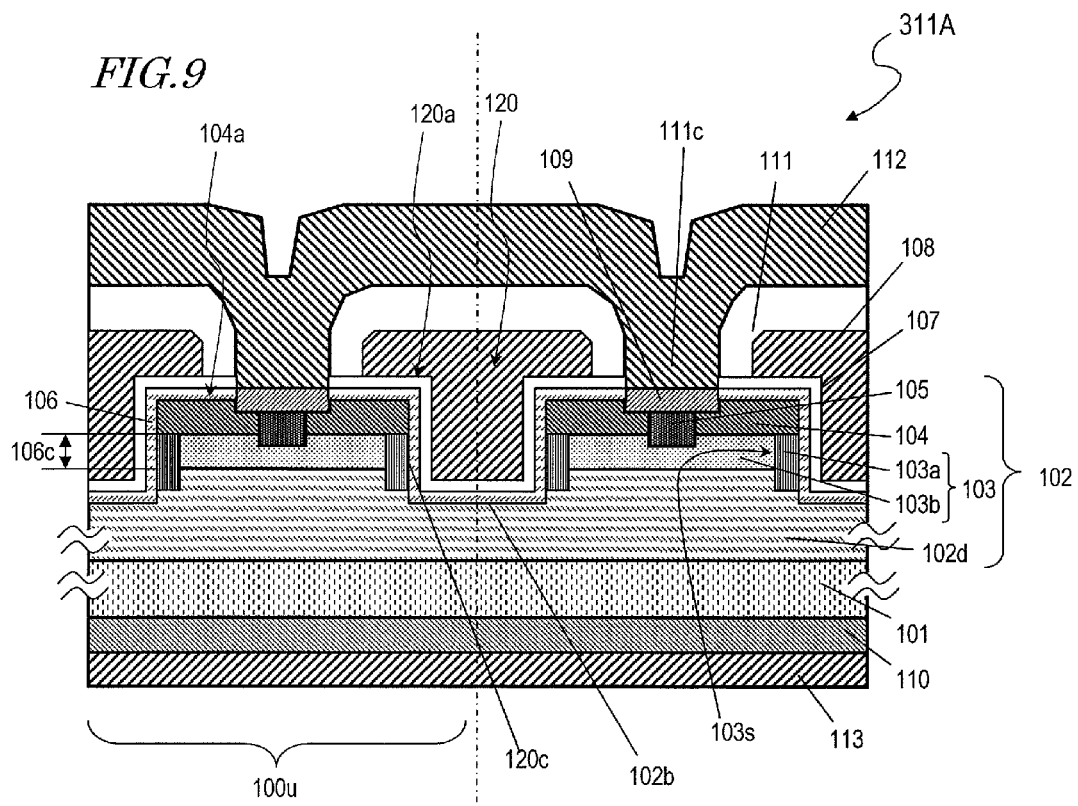
FIG. 9 A cross-sectional view showing a semiconductor device according to another example of Embodiment 1-1.

For example, the present invention can be embodied as a semiconductor device 311A having a structure shown in FIG. 9. The semiconductor device 311A is different from the semiconductor device 311 of the embodiment described above in that the depth of the second body region 103$b$ is greater than the depth of the first body region 103$a$ in the direction perpendicular to the principal surface of the semiconductor substrate 101. The semiconductor device 311A is formed by setting the depth of the second body region 103$b'$ to be greater than the depth of the first body region 103$a'$ in the ion implantation step shown in FIG. 3($c$) in the method for manufacturing the semiconductor device 311 described above. Specifically, it can be formed by setting the implantation energy of the second body region 103$b$ to be larger than the implantation energy of the first body region 103$a$.

Figure 10:
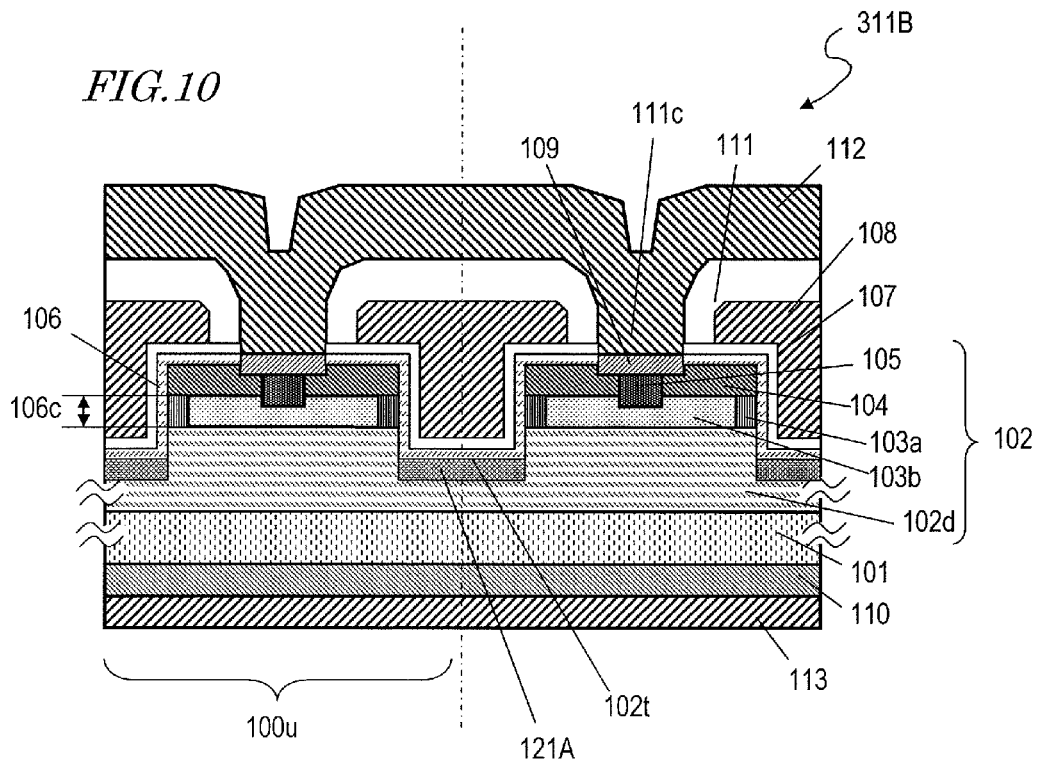
FIG. 10 A cross-sectional view showing a semiconductor device according to another example of Embodiment 1-1.

For example, the present invention can be embodied as a semiconductor device 311B having a structure shown in FIG. 10. The semiconductor device 311B is different from the semiconductor device 311 of the embodiment described above in that an electric field relaxing region 121A of the second conductivity type is provided on the bottom surface 102$b$ of the trench 120. The electric field relaxing region 121A relaxes the electric field localization occurring in the second silicon carbide semiconductor layer 106 on the bottom surface 120$b$ of the trench 120.

Figure 11:
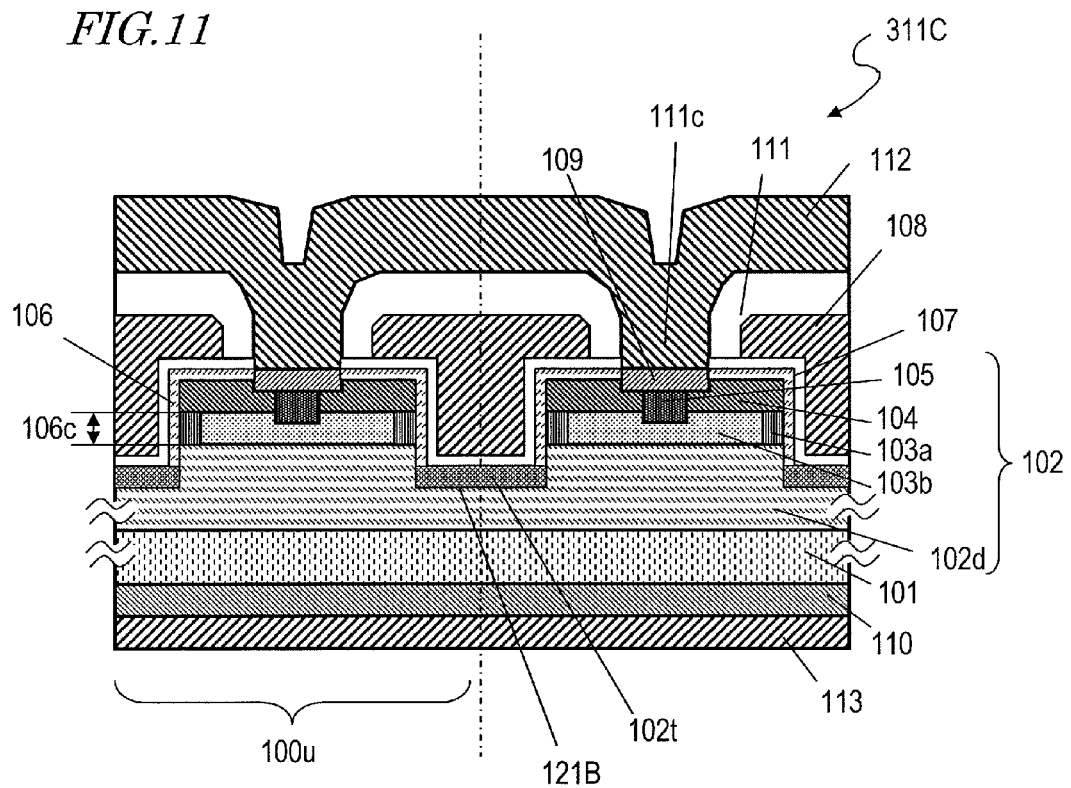
FIG. 11 A cross-sectional view showing a semiconductor device according to another example of Embodiment 1-1.

The present invention can be embodied as a semiconductor device 311C having a structure shown in FIG. 11. The semiconductor device 311C is different from the embodiment described above in that the second silicon carbide semiconductor layer is removed on the bottom surface 120$b$ of the trench 120 and an electric field relaxing region 121B of the second conductivity type is provided on the bottom surface 120$b$. These electric field relaxing regions 121A and 121B can be formed by implanting and activating an impurity of the second conductivity type (e.g., aluminum) at a position of the first silicon carbide semiconductor layer 102 corresponding to the bottom of the trench 120. The impurity concentration of the electric field relaxing regions 121A and 121B can be appropriately selected and is about $1 \times 10^{17}$ to $1 \times 10^{19}$ cm$^{-3}$, for example.

Thus, with semiconductor devices of Embodiments 1-1, 1-2 and 1-3, by forming the body region including two regions, it is possible to independently control the impurity concentration of the first body region for adjusting the threshold, and the impurity concentration of the second body region which forms a pn junction with the first silicon carbide semiconductor layer. Thus, it is possible to provide a semiconductor device of which the rising voltage of the channel diode is lower than the body diode and which has a high device withstand voltage.

Embodiment 2-1

Configuration of Semiconductor Device 312

Figure 12:
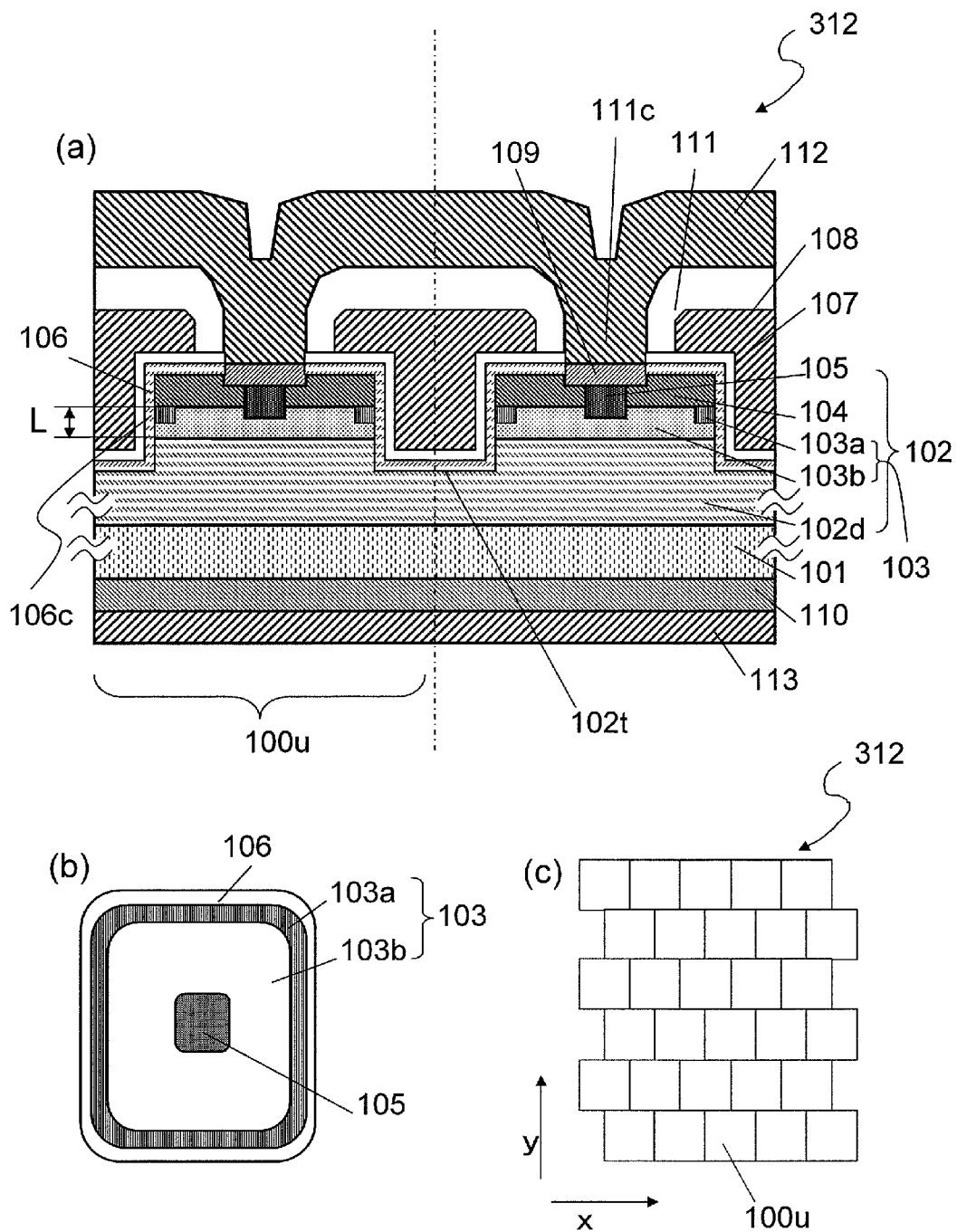
FIG. 12 (*a*) is a cross-sectional view of a semiconductor device of Embodiment 2-1, (*b*) is a top view of a body region in the semiconductor device, and (*c*) is a plan view showing an example of an arrangement of unit cells in the semiconductor device.
Figure 14:
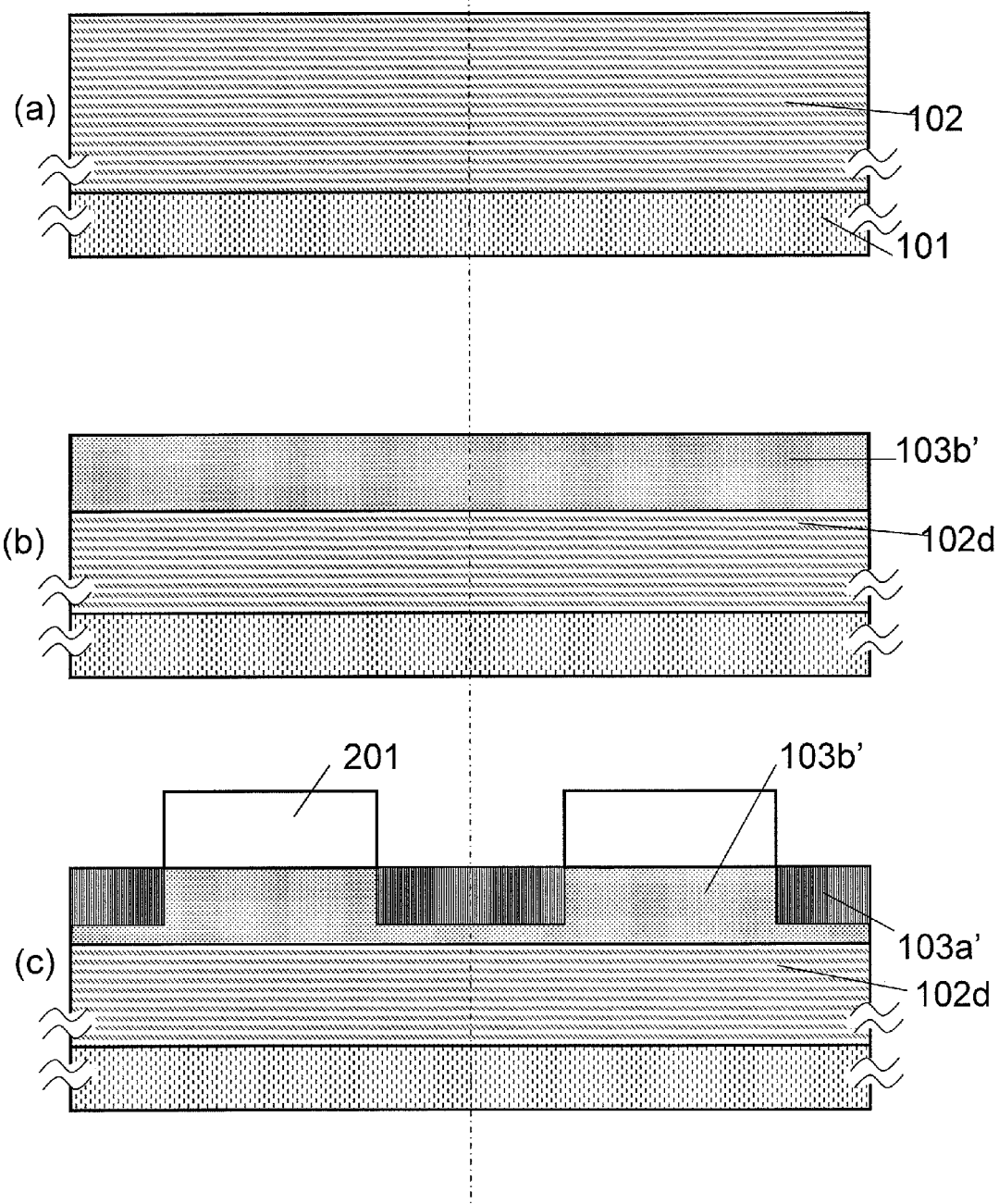
FIGS. 14 (*a*) to (*c*) are process cross-sectional views each illustrating a method for manufacturing the semiconductor device shown in FIG. 12.
Figure 15:
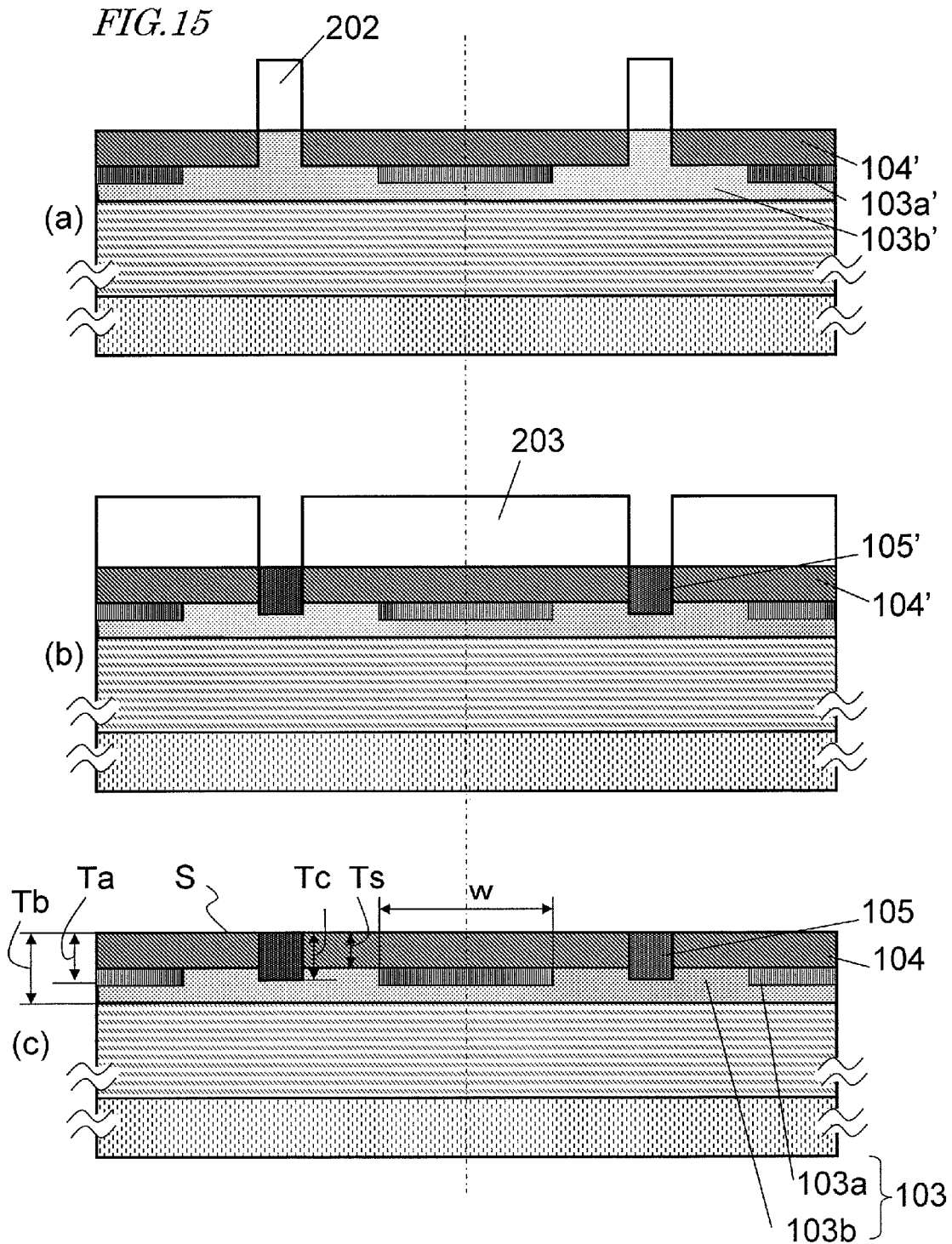
FIGS. 15 (*a*) to (*c*) are process cross-sectional views each illustrating a method for manufacturing the semiconductor device shown in FIG. 12.
Figure 16:
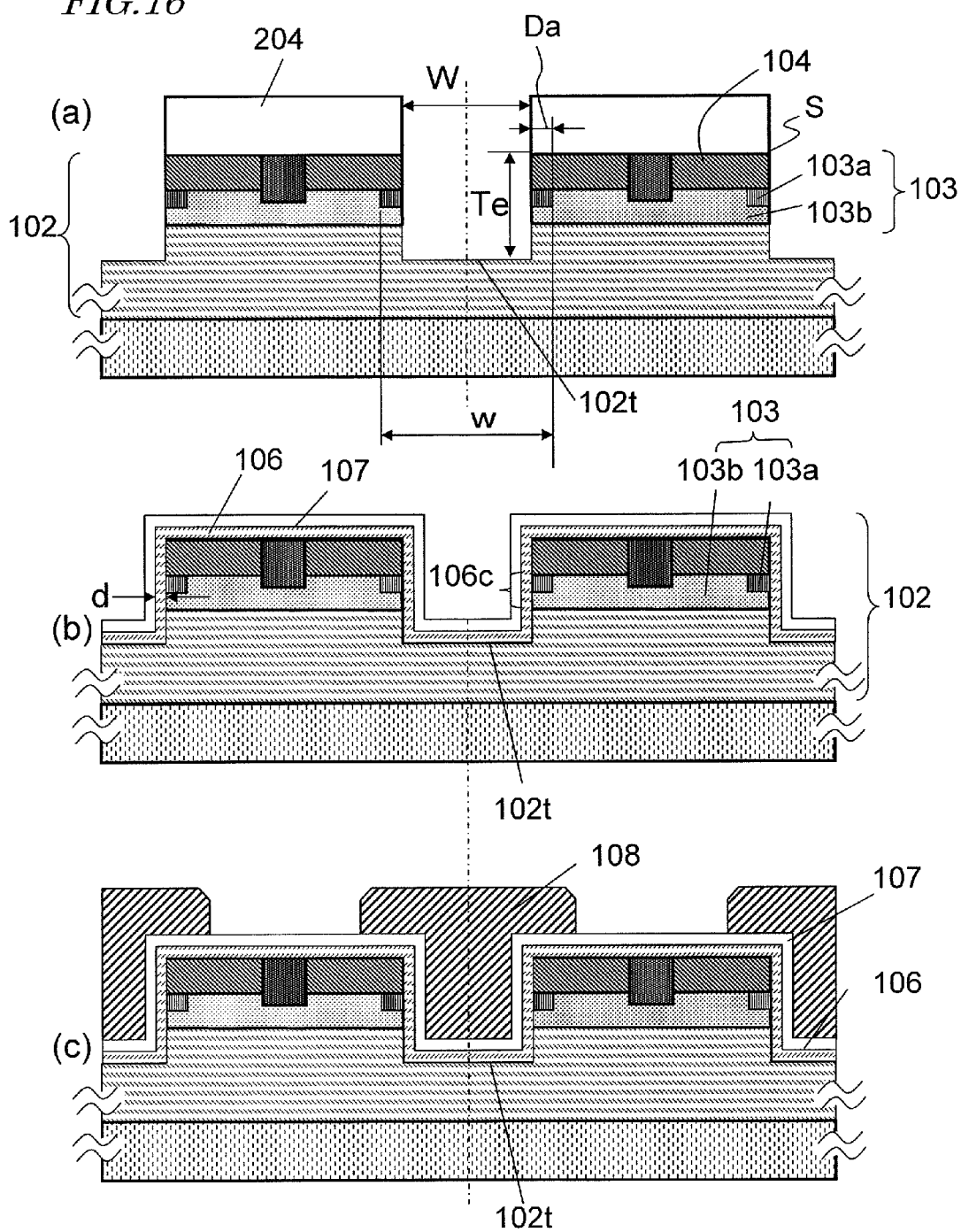
FIGS. 16 (*a*) to (*c*) are process cross-sectional views each illustrating a method for manufacturing the semiconductor device shown in FIG. 12.
Figure 17:
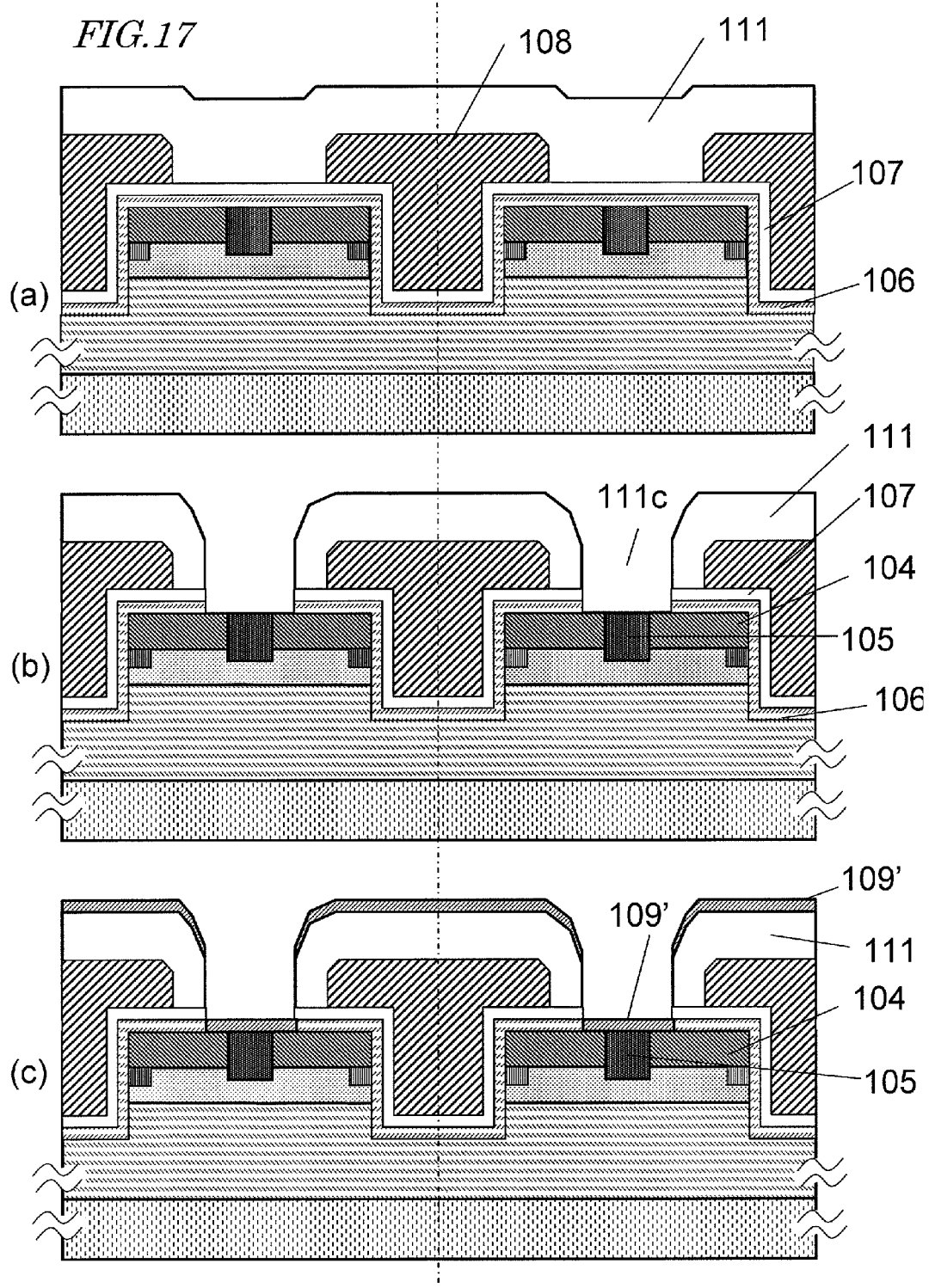
FIGS. 17 (*a*) to (*c*) are process cross-sectional views each illustrating a method for manufacturing the semiconductor device shown in FIG. 12.
Figure 18:
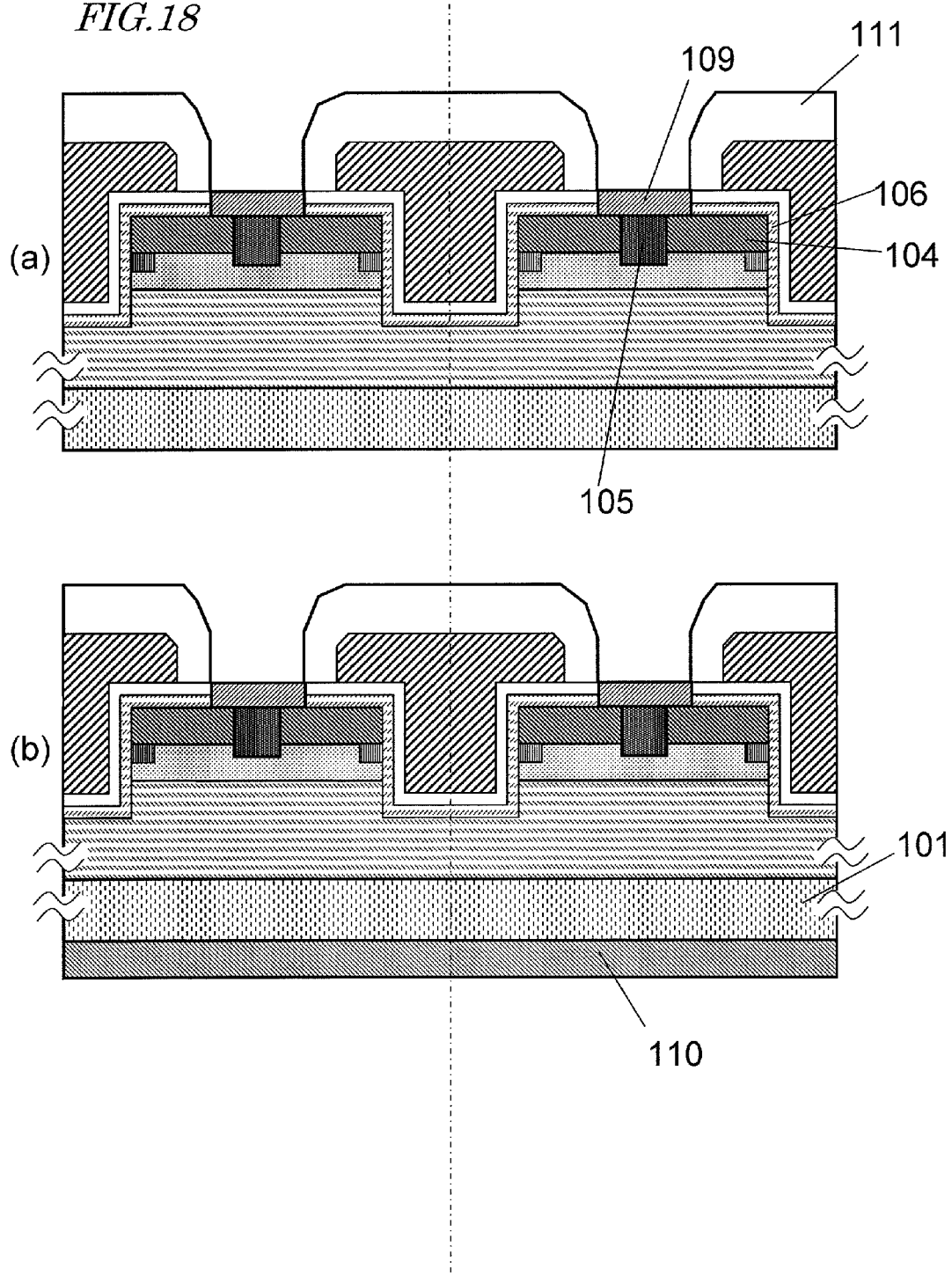
FIGS. 18 (*a*) and (*b*) are process cross-sectional views each illustrating a method for manufacturing the semiconductor device shown in FIG. 12.

FIG. 12($a$) is a cross-sectional view of a semiconductor device 312, and FIG. 12($b$) is a plan view showing the upper surface of the body region 103 in the semiconductor device 312. FIG. 12($c$) is a plan view illustrating an arrangement of unit cells in the semiconductor device 312.

The semiconductor device 312 of Embodiment 2-1 has a similar structure to that of the semiconductor device 311 of Embodiment 1-1, except for the body region 103. Therefore, part of the description of the semiconductor device 312 according to the present embodiment that is redundant with the description of Embodiment 1-1 may be omitted. For example, the description of FIG. 12($a$), FIG. 12($c$) and FIG. 13($b$) may be redundant with the description of FIG. 1($a$), FIG. 1($b$) and FIG. 1($c$), respectively. Specifically, the semiconductor device 312 according to the present embodiment is different from the semiconductor device 311 according to Embodiment 1-1 in terms of the structure of the body region 103, and the description of other configurations, arrangements, etc., may be omitted.

The semiconductor device 312 includes a plurality of unit cells 100$u$ arranged in two dimensions. Each unit cell 100$u$ includes the semiconductor substrate 101, and the first silicon carbide semiconductor layer 102 arranged on the surface of the semiconductor substrate 101. The first silicon carbide semiconductor layer 102 includes the drift region 102$d$ of the first conductivity type.

The body region 103 located on the drift region 102$d$ and the impurity region 104 of the first conductivity type located on the body region 103 are arranged in the first silicon carbide semiconductor layer 102. The body region 103 includes the first body region 103$a$ of the second conductivity type, and the second body region 103$b$ of the second conductivity type. The first body region 103$a$ includes an impurity of the second conductivity type at a higher concentration than the second body region 103$b$. That is, the average value of the concentration (dopant concentration) of the impurity of the second conductivity type of the first body region 103$a$ is higher than the average value of the concentration (dopant concentration) of the impurity of the second conductivity type of the second body region 103$b$. Herein, the average value of the dopant concentration is referred to as the "average dopant concentration".

A trench 102$t$ running through the body region 103 is provided in the first silicon carbide semiconductor layer 102. In the illustrated example, the side surface of the trench 102$t$ is formed by the drift region 102$d$, the second body region 103$b$, the first body region 103$a$, and the impurity region 104, in this order from bottom.

The second silicon carbide semiconductor layer 106 is arranged in the trench 102$t$. The second silicon carbide semiconductor layer 106 may be of the second conductivity type (e.g., n$^-$-type). The second silicon carbide semiconductor layer 106 is arranged so as to be in contact with both the first and second body region 103$a$ and 103$b$ on the side surface of the trench 102$t$. A portion of the second silicon carbide semiconductor layer 106 that is in contact with the first body region 103$a$ and the second body region 103$b$ is the channel region 106$c$. Therefore, in the ON state of the semiconductor device 312, the impurity region 104 and the drift region 102$d$ can be connected to each other via the channel region 106$c$ of the second silicon carbide semiconductor layer 106.

The second silicon carbide semiconductor layer 106 is preferably arranged so as to be in contact with the drift region 102$d$, the first body region 103$a$, the second body region 103$b$, and the impurity region 104, on the side surface of the trench 102$t$. This makes it possible to reliably connect the impurity region 104 and the drift region 102$d$ together.

In the present embodiment, the second silicon carbide semiconductor layer 106 is in contact with both the first body region 103$a$ and the second body region 103$b$ on the side surface of the trench 102*t*. The upper surface of the second body region 103*b* is in contact with the impurity region 104 and the lower surface thereof with the drift region 102*d*. Therefore, by adjusting the dopant concentration of the first body region 103*a* independently of the dopant concentration of the second body region 103*b*, it is possible to control the threshold voltage Vth and the rising voltage Vf0 without decreasing the device withstand voltage. Since the pn junction is formed by the second body region 103*b* and the drift region 102*d* having a low dopant concentration, it is possible to suppress the influence of crystal defects due to ion implantation and to reduce the occurrence of a leak current. In order to more effectively reduce a leak current due to crystal defects, it is preferred that the first body region 103*a* and the drift region 102*d* are not in contact with each other. Moreover, the second body region 103*b* is in contact with at least a portion of the lower surface of the impurity region 104. Thus, it is possible to prevent the entire lower surface of the impurity region 104 from being in contact with the first body region 103*a* having a high concentration, and it is therefore possible to prevent the resistance of the impurity region 104 from becoming high at the interface between the body region 103 and the impurity region 104.

In the example shown in FIG. 12(*b*), on the upper surface of the body region 103, the first body region 103*a* is arranged only on the side of the second silicon carbide semiconductor layer 106 so as to surround the second body region 103*b*. The first body region is in contact with the impurity region 104. Note that the configuration of the body region 103 is not limited to that shown in the figure.

Hereinafter, the second silicon carbide semiconductor layer 106 of the present embodiment will be referred to as the "channel layer". The length (channel length) L of the channel region 106*c* is defined by the distance between the impurity region 104 and the drift region 102*d* on the side surface of the trench 102*t* as shown in FIG. 12(*a*). Herein, on the side surface of the trench 102*t*, the channel length L is the distance from the interface between the first body region 103*a* and the impurity region 104 to the interface between the second body region 103*b* and the drift region 102*d*.

As shown in FIG. 12(*c*), the unit cells 100*u* of the semiconductor device 312 may be arranged two-dimensionally in the x direction and in the y direction perpendicular to the x direction as seen from the normal direction to the semiconductor substrate 101. Each unit cell 100*u* may have a generally rectangular shape or a square shape, or may be another polygonal shape.

Note that the unit cell 100*u* may have a stripe-shaped planar shape extending in one direction (e.g., the y direction). FIGS. 13(*a*) and 13(*b*) are a top view of the body region 103 and a plan view of the semiconductor device 312, respectively, in a case where the semiconductor device 312 includes stripe-shaped unit cells 100*u*. As shown in FIG. 13(*b*), a plurality of unit cells 100*u* are arranged in the x direction perpendicular to the y direction, for example. The cross-sectional structure is similar to the structure shown in FIG. 12(*a*), and will not be shown in the figure. Also in this example, on the upper surface of the body region 103, the first body region 103*a* is arranged only in the vicinity of the second silicon carbide semiconductor layer 106.

In the semiconductor device 312, similar to the semiconductor device 311 of Embodiment 1-1, when a voltage greater than or equal to the threshold voltage is applied to the gate electrode 108 (Vgs≥Vth), where Vds>0 V, the second ohmic electrode 110 and the first ohmic electrode 109 are electrically conducted together via the second silicon carbide semiconductor layer 106, thereby allowing for an ON current to flow from the second ohmic electrode 110 to the first ohmic electrode 109. On the other hand, the second silicon carbide semiconductor layer 106 and the body region 103 are configured so that where 0 V≤Vgs<Vth is satisfied, a current flows from the first ohmic electrode 109 to the second ohmic electrode 110 through the second silicon carbide semiconductor layer 106 before a current starts to flow from the body region 103 to the drift region 102*d*, as Vds becomes less than 0 volt.

The rising voltage Vf0 of the diode and the threshold voltage Vth of the transistor are each primarily determined by the dopant concentration of the first body region 103*a*, the dopant concentration of the second body region 103*b*, the dopant concentration and the thickness of the second silicon carbide semiconductor layer 106, and the thickness of the gate insulating film 107. On the other hand, the withstand voltage of the semiconductor device 312 is primarily determined by the pn junction formed by the second body region 103*b* and the drift region 102*d*.

In the conventional semiconductor device 1000 (FIG. 47), an n-type channel layer 1060 or a p-type channel layer is formed on the side surface portion of the trench 1020*t*, and the device withstand voltage and the threshold voltage Vth of the transistor are controlled independently. The channel layer 1060 is set to a certain concentration, and the device withstand voltage, the rising voltage Vf0 of the diode, and the threshold voltage Vth of the transistor cannot be controlled independently of one another.

In contrast, in the present embodiment, the body region 103 is divided into a plurality of regions including the first body region 103*a* and the second body region 103*b*, as in Embodiment 1-1, and the concentrations of the body regions 103*a* and 103*b* are controlled independently. The second silicon carbide semiconductor layer 106 is arranged on the side surface of the trench 102*t* so as to be in contact with these body regions 103*a* and 103*b*. Therefore, with the semiconductor device 312, it is possible to adjust the threshold voltage Vth by controlling the dopant concentration of the first body region 103*a* and to adjust the withstand voltage of the semiconductor device 312 by controlling the dopant concentration of the second body region 103*b*.

In the present embodiment, the average dopant concentration of the first body region 103*a* is designed so that the rising voltage Vf0 of the diode and the threshold voltage Vth of the transistor in the semiconductor device 312 are each of an intended value. Particularly, the rising voltage Vf0 of the diode is set to be smaller than the rising voltage Vf of the pn junction diode formed by the body region 103 and the first silicon carbide semiconductor layer 102.

The rising voltage Vf0 of the diode and the threshold voltage Vth of the transistor are both primarily determined by the dopant concentration of the first body region 103*a* of the body region 103 which is in contact with the second silicon carbide semiconductor layer 106, the dopant concentration and the thickness of the second silicon carbide semiconductor layer 106, and the thickness of the gate insulating film 107.

The relationship of the dopant concentration and the thickness of the second silicon carbide semiconductor layer 106 with respect to the threshold voltage Vth of the transistor and the absolute value |Vf0| of the rising voltage of the channel diode is similar to that of the simulation results illustrated in FIG. 2 of Embodiment 1-1.

Thus, in the present embodiment, the threshold voltage Vth, the rising voltage Vf0, and the device withstand voltage can be controlled independently by independently adjusting the dopant concentration of the first body region 103*a*, the dopant concentration and the thickness of the second silicon carbide semiconductor layer 106, the thickness of the gate insulating film 107, and the dopant concentration of the second body region 103b.

With the semiconductor device 312 of the present embodiment, it is possible to allow more current to flow through the channel diode. Therefore, it is possible to suppress crystal defects of silicon carbide due to a current flow through the body diode. The function of a so-called free-wheeling diode connected anti-parallel with a MISFET provided in a common inverter circuit can be built in the semiconductor device 312. Moreover, since the channel diode operates in a unipolar operation, the reverse recovery current when the diode transitions from the ON state to the OFF state is reduced. Thus, it is possible to suppress the decrease in the recovery loss or the switching speed, for example.

In the present embodiment, in order to allow a current to flow through the channel diode, the dopant concentration of the first body region 103a is preferably large. On the other hand, in order to ensure the device withstand voltage, it is necessary to also appropriately control the dopant concentration of the second body region 103b. In order to achieve both of these, the dopant concentration of the first body region 103a is set to be larger than the dopant concentration of the second body region 103b. Thus, it is possible to suppress the progression of crystal defects of silicon carbide by suppressing the amount of current to flow through the body diode while ensuring the device withstand voltage.

In the present embodiment, the concentration of the first body region 103a is desirably $1 \times 10^{18}$ cm$^{-3}$ or more, for example. Then, in the depletion layer expanding between the body region 103 and the channel region 106c, the expansion of the depletion layer on the side of the body region 103 can be suppressed, and it is therefore possible to decrease the potential barrier at the interface between the gate insulating film and the channel layer. Note that in the semiconductor device of the present embodiment, the relationship of the rising voltage |Vf0| of the channel diode and the threshold voltage Vth of the transistor with respect to the dopant concentration of the body region exhibits a similar tendency to that of FIG. 48. Therefore, the concentration of the first body region 103a is desirably $5 \times 10^{18}$ cm$^{-3}$ or more.

The thickness of the first body region 103a in the direction parallel to the substrate surface is desirably such that the depletion layer expanding from the interface between the first body region 103a and the second silicon carbide semiconductor layer 106 into the first body region 103a stays within the first body region 103a with 0 V applied to the gate electrode 108. For example, the thickness of the first body region 103a in the direction parallel to the substrate surface is 50 nm or more. Note that the thickness in the direction parallel to the substrate surface means the thickness defined between the interface at which the first body region 103a contacts the second silicon carbide semiconductor layer 106 and the interface, opposing this interface, at which the first body region 103a contacts the second body region 103b.

The average impurity concentration of the second body region 103b is set so that an intended withstand voltage is ensured. The average impurity concentration of the second body region 103b in the present embodiment is set to be generally equal to the impurity concentration of the second body region 103b described in Embodiment 1-1. That is, the concentration of the second body region 103b is desirably $1 \times 10^{17}$ cm$^{-3}$ or more and less than the concentration of the first body region.

While the first body region 103a is in contact with the impurity region 104 in the example shown in FIG. 12, the first body region 103a does not need to be in contact with the impurity region 104. Note however that the lower surface of the first body region 103a is preferably located above the lower surface of the second body region 103b. This provides benefits as follows.

Where the body region 103 is formed by ion implantation, it may not be possible to completely remove crystal defects in SiC occurring due to the ion implantation if the amount of impurity ion implantation is large. If the pn junction is formed in this state, a leak current may occur when a reverse bias is applied to the pn junction. In contrast, if the arrangement is such that the lower surface of the first body region 103a is above the lower surface of the second body region 103b, the second body region 103b having a low concentration can be present between the first body region 103a having a high concentration and the drift region 102d. Therefore, the second body region 103b and the drift region 102d having a low concentration together form the pn junction. This reduces the possibility that a leak current occurs when a reverse bias is applied to the pn junction.

[Method for Manufacturing Semiconductor Device 312]

Next, referring to FIGS. 14 to 18, an example of a method for manufacturing the semiconductor device 312 of the present embodiment will be described. Note that the following description is merely illustrative, and the present invention is not limited to particular processes, conditions, concentrations, thicknesses, etc. Description of part of the method for manufacturing the semiconductor device 312 according to the present embodiment that is common to the method for manufacturing the semiconductor device 311 according to Embodiment 1-1 may be omitted.

First, as shown in FIG. 14(a), the first silicon carbide semiconductor layer 102 having a high resistance is formed on the principal surface of the semiconductor substrate 101. In this step, a similar method to that described above with reference to FIG. 3(a) of Embodiment 1-1 can be used.

Next, as shown in FIG. 14(b), the second body region 103b' of the second conductivity type is formed in a surface region of the first silicon carbide semiconductor layer 102. The second body region 103b' is formed by performing ion implantation on the first silicon carbide semiconductor layer 102. Alternatively, the second body region 103b' can be formed by epitaxial growth on the first silicon carbide semiconductor layer 102. An example where the second body region 103b' is formed by ion implantation will now be described.

A p-type impurity ion (e.g., Al ion) is implanted into a surface region of the first silicon carbide semiconductor layer 102, thereby forming, on the first silicon carbide semiconductor layer 102, the second body region 103b' which is later to be the second body region 103b of the semiconductor device 312. A region of the first silicon carbide semiconductor layer 102 where the second body region 103b' is not formed becomes the drift region 102d.

Herein, since the second body region 103b' is formed across the entire surface of the unit cell 100u, a mask for patterning is not shown in the figure. Note that as in Embodiment 1-1, an impurity region patterned into a ring shape may be formed in the peripheral portion.

In this implantation step, a similar method to that described above with reference to FIG. 3(b) of Embodiment 1-1 can be used.

Then, as shown in FIG. 14(c), the mask 201 for the formation of the first body region is formed on the first silicon carbide semiconductor layer 102, and aluminum, for example, is ion-implanted into portions of the second body region 103b' using the mask 201. Thus, the first body region 103a' is formed. In this step, since the first body region 103a' is formed by further implanting p-type impurity ion into the second body region 103b', the impurity concentration (p-type impurity concentration) of the first body region 103a' is inevitably higher than the impurity concentration of the second body region 103b'. The implantation energy in this process may be set in multiple steps as is the implantation energy for forming the second body region 103b' (multi-step implantation), for example. Note however that implantation conditions are preferably set so that the lower surface of the first body region 103a' is located above (arranged at a shallower position than) the lower surface of the second body region 103b'. Thus, a portion of the second body region 103b' that is deeper than the first body region 103a' (a portion that has not been implanted with p-type impurity in this step) becomes the second body region 103b of the semiconductor device 312 through a subsequent activation step.

The dose of the first body region 103a' can be adjusted so as to be five times, for example, the dose when forming the second body region 103b'. In this case, the dose to be implanted additionally in this step is about four times more. Therefore, the Al ion implantation energy and dose are set as follows, for example.

30 keV: $2.4 \times 10^{13}$ cm$^{-2}$
70 keV: $4.8 \times 10^{13}$ cm$^{-2}$
150 keV: $3.4 \times 10^{14}$ cm$^{-2}$ After the mask 201 is removed, the impurity region 104' is formed as shown in FIG. 15(a). In this step, a similar method to that described above with reference to FIG. 4(a) of Embodiment 1-1 can be used. It is understood that the mask 202 may be formed by leaving a portion of the mask 201.

After the mask 202 is removed, the contact region 105' is formed as shown in FIG. 15(b). In this step, a similar method to that described above with reference to FIG. 4(b) of Embodiment 1-1 can be used. The dose of the contact region 105' is set to be higher than the dose of the first body region 103a' and the second body region 103b'.

After the mask 203 is removed, activation annealing is performed, thereby activating the impurity ions which have been implanted into different regions. Thus, the first body region 103a, the second body region 103b, the impurity region 104 and the contact region 105 are formed as shown in FIG. 15(c). The first body region 103a and the second body region 103b are referred to collectively as "the body region 103".

The depths Ta and Tb of the first body region 103a and the second body region 103b with respect to the surface S of the first silicon carbide semiconductor layer 102 can be controlled individually by varying the implantation energy therebetween. For example, the depths Ta and Tb of the first body region 103a and the second body region 103b are about 500 nm and about 750 nm, respectively.

The ion implantation profile of the first body region 103a is determined so that the average dopant concentration of the first body region 103a is about $1 \times 10^{19}$ cm$^{-3}$, for example. The ion implantation profile of the second body region 103b is adjusted so that the average dopant concentration of the second body region 103b is about $2 \times 10^{18}$ cm$^{-3}$, for example. The preferred width w of the first body region 103a will be discussed later. Note that the second body region 103b is assumed herein to be a region whose dopant concentration is $5 \times 10^{17}$ cm$^{-3}$ or more, for example. While the second body region 103b has a dopant concentration that decreases as the depth increases past a predetermined depth, the position at which the dopant concentration reaches $5 \times 10^{17}$ cm$^{-3}$, for example, is defined as the lower surface of the second body region 103b and the depth from the surface S to this lower surface is defined as the "depth Tb". The first body region 103a is defined as a region where the dopant concentration is $1 \times 10^{18}$ cm$^{-3}$ or more, for example.

The ion implantation profile of the impurity region 104 and the contact region 105 is set to a similar depth and average impurity concentration to those of Embodiment 1-1, for example. Note that a surface layer of the first silicon carbide semiconductor layer 102 may be removed for surface cleaning of the first silicon carbide semiconductor layer 102 after the activation annealing. Where a surface layer of the first silicon carbide semiconductor layer 102 is removed by a thickness of 50 nm, for example, the depths Ta, Tb, Ts and Tc of the bottom surfaces of the first body region 103a, the second body region 103b, the impurity region 104 and the contact region 105 are all reduced by 50 nm to be 450 nm, 700 nm, 200 nm and 350 nm, respectively.

Next, as shown in FIG. 16(a), the trench 102t is formed on the first silicon carbide semiconductor layer 102. In this step, a similar method to that described above with reference to FIG. 5(a) of Embodiment 1-1 can be used.

Now, a preferred range of the width w of the first body region 103a before forming the trench 102t will be described. The width w may vary depending on the concentration and thickness of the channel layer and the thickness of the gate insulating film to be formed later. It is only required that the depletion layer expanding from the interface between the channel layer and the first body region 103a (toward the side of the first body region 103a) stays within the first body region 103a with 0 V applied to the gate electrode to be formed later. For this, the depth (thickness) Da of the first body region 103a from the side surface of the trench 102t is preferably 50 nm or more. Assuming that the width of the trench 102t in the substrate surface is W, the width w of the first body region 103a in the substrate surface is preferably W+50×2 (nm) or more. On the other hand, the thickness Da is preferably less than the distance from the side surface of the trench 102t to the contact region 105 in the substrate surface. Thus, since it is possible to suppress the contact area between the impurity region 104 and the first body region 103a to be small, it is possible to suppress the increase in the source sheet resistance and to further decrease the ON resistance.

After the mask 204 is removed and the surface of the first silicon carbide semiconductor layer 102 is washed sufficiently, silicon carbide is epitaxially grown on the surface of the first silicon carbide semiconductor layer 102 as shown in FIG. 16(b), thereby obtaining the second silicon carbide semiconductor layer 106. Herein, the second silicon carbide semiconductor layer 106 is formed across the entire surface of the first silicon carbide semiconductor layer 102 so as to be in contact with the first body region 103a, the second body region 103b, the impurity region 104, the drift region 102d and the contact region 105. Note that the second silicon carbide semiconductor layer 106 only needs to be formed so as to at least cover the first body region 103a and the second body region 103b exposed on the side surface of the trench 102t. This allows the impurity region 104 and the drift region 102d to be connected together via the second silicon carbide semiconductor layer 106.

In the present embodiment, the impurity concentration N and the thickness d of a portion (channel region) 106c of the second silicon carbide semiconductor layer 106 that is adjacent to the first body region 103a and the second body region 103b are adjusted to $2 \times 10^{18}$ cm$^{-3}$ and 30 nm, respectively. Note that the impurity concentration N and the thickness d of the channel region 106c are not limited to the values mentioned above, but may be appropriately set so that the rising voltage Vf0 of the channel diode of the semiconductor device 312 is of a predetermined value.

Next, although not shown in the figure, a predetermined portion of the second silicon carbide semiconductor layer 106 is removed by dry etching as necessary.

Then, as shown in FIG. 16(b), the gate insulating film 107 (thickness: 70 nm, for example) is formed on the surface of the second silicon carbide semiconductor layer 106. In this step, a similar method to that described above with reference to FIG. 5(b) of Embodiment 1-1 can be used.

In the example shown in FIG. 16(b), the upper surface of the body region 103 is in contact with the impurity region 104, and the lower surface of the body region 103 is in contact with the drift region 102d. The upper surface of the body region 103 is defined by the upper surface of the first body region 103a and the upper surface of the second body region 103b. In this example, since the lower surface of the first body region 103a is above the lower surface of the second body region 103b, the lower surface of the body region 103 is defined only by the second body region 103b. Therefore, the first body region 103a is not in contact with the drift region 102d.

Then, as shown in FIG. 16(c), the gate electrode 108 is formed in the trench 102t. In this step, a similar method to that described above with reference to FIG. 5(c) of Embodiment 1-1 can be used.

Then, as shown in FIG. 17(a), the interlayer insulating film 111 is formed so as to cover the gate electrode 108 and the gate insulating film 107.

Next, as shown in FIG. 17(b), the interlayer insulating film 111, the gate insulating film 107 and the second silicon carbide semiconductor layer 106 are etched by using a mask (not shown) to form the contact hole (opening portion) 111c for exposing the contact region 105 and the impurity region 104. Herein, the contact hole 111c for exposing the entire upper surface of the contact region 105 and a portion of the upper surface of the impurity region 104 is formed by dry etching.

Then, as shown in FIG. 17(c), the metal film 109' is formed on the interlayer insulating film 111 and in the contact hole 111c. Then, as shown in FIG. 18(a), the first ohmic electrode 109 is formed. In this step, a similar method to that described above with reference to FIGS. 6(c) to 7(b) of Embodiment 1-1 can be used.

Then, as shown in FIG. 18(b), the second ohmic electrode 110 is formed on the reverse surface of the semiconductor substrate 101.

Then, although not shown in the figure, a source line (upper wiring electrode) is formed on the interlayer insulating film 111 and in the contact hole 111c.

Moreover, although not shown in the figure, a gate line (or a gate pad) is formed, which is in contact with the gate electrode 108. A reverse surface electrode for die-bonding is formed on the reverse surface of the second ohmic electrode 110. Thus, the semiconductor device 312 shown in FIG. 12 is obtained.

According to the present embodiment, the body region 103 can be formed by the first body region 103a and the second body region 103b having different dopant concentrations from each other. Since the second body region 103b is arranged so as to be in contact with the drift region 102d, it gives a more significant influence to the device withstand voltage. On the other hand, the first body region 103a is arranged so as to be in contact with the channel region 106c, and it gives an influence to the threshold voltage Vth of the transistor and the rising voltage Vf0 of the channel diode. Therefore, it is possible to realize intended device characteristics by controlling the first and second body regions 103a and 103b independently of each other.

In the present embodiment, the average dopant concentration of the first body region 103a is set to be larger than the average dopant concentration of the second body region 103b. Then, it is possible to suppress the rising voltage |Vf0| of the channel diode to be small and to maintain the threshold voltage Vth of the transistor to be positive (Vth>0), while maintaining a high device withstand voltage.

As in Embodiment 1-1, the rising voltage |Vf0| of the channel diode is preferably designed to be 1 V or less, and is more preferably designed to be 0.6 V or less.

As in Embodiment 1-1, the threshold voltage Vth of the forward current of the semiconductor device 312 is preferably 2 V or more and 8 V or less.

In order to set the rising voltage Vf0 and the threshold voltage Vth within the ranges mentioned above while ensuring the device withstand voltage, the average dopant concentration of the second body region 103b is set to be $1 \times 10^{17}$ cm$^{-3}$ or more and less than the concentration of the first body region, for example. Note that the preferred average dopant concentrations of these regions may vary depending on the concentration, the thickness, etc., of the second silicon carbide semiconductor layer 106 and the drift region 102d of the semiconductor device 312, and are therefore not limited to the ranges.

Embodiment 2-2

When manufacturing a semiconductor chip as the semiconductor device 312 of Embodiment 2-1, the process design for an electric field localization relaxing structure in a peripheral portion of the semiconductor chip is also facilitated. A configuration of a semiconductor device (semiconductor chip) of Embodiment 2-1 will now be described with reference to the drawings. Note that part of the description of the present embodiment that is redundant with the description of Embodiment 2-1 will be omitted.

In the present embodiment, a plurality of semiconductor devices (semiconductor chips) 322 are manufactured using a single silicon carbide wafer. In the present specification, a "silicon carbide wafer" refers to a substrate obtained by cutting and polishing, into a predetermined size, monocrystalline SiC produced by the modified Lely method or the sublimation method. Then, the silicon carbide wafer, on which a plurality of semiconductor devices 312 have been formed, is diced into a predetermined chip size, thereby separating the semiconductor devices 322 from one another.

Figure 19:
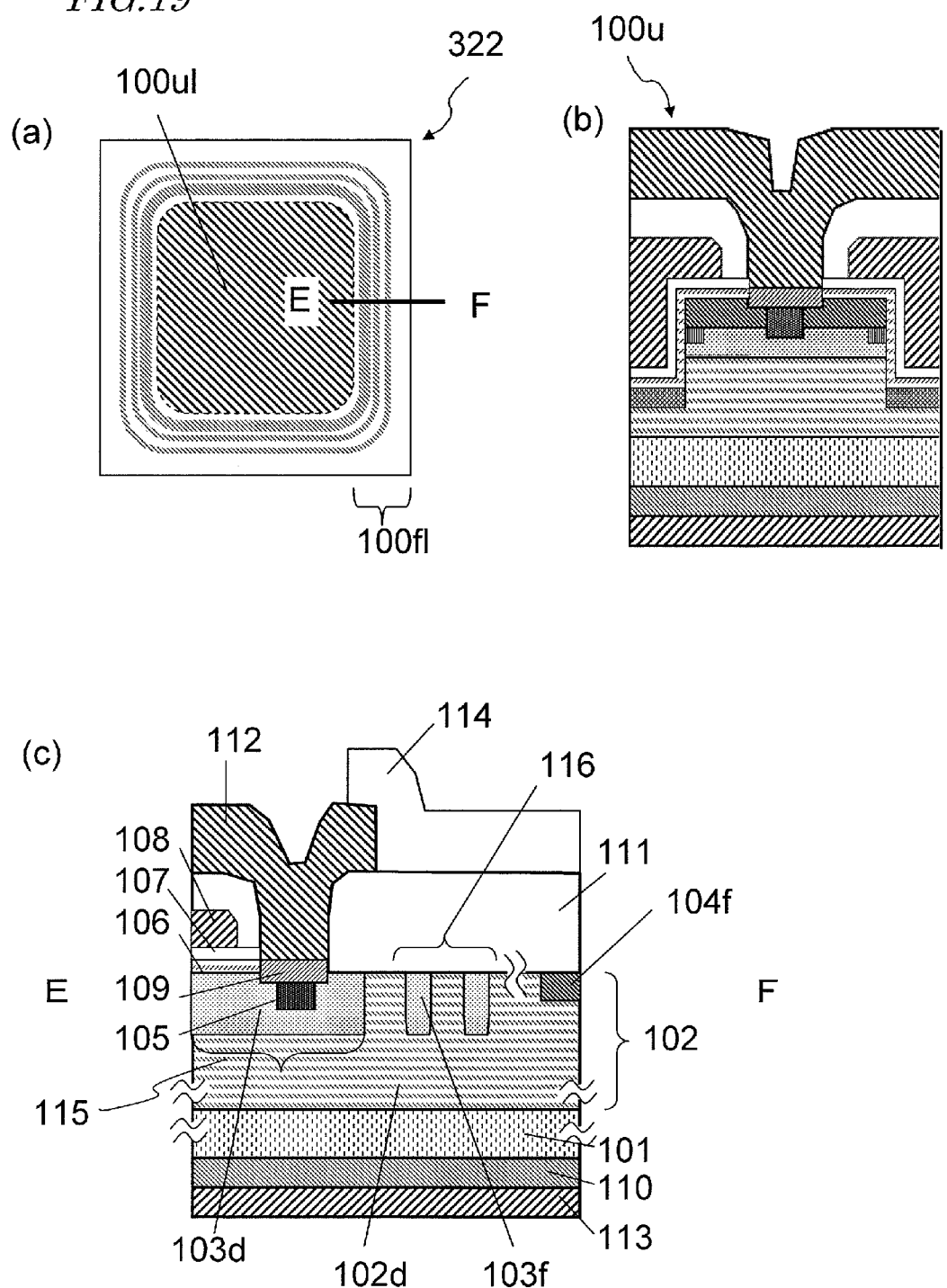
FIG. 19 (*a*) is a top view showing a semiconductor device of Embodiment 2-2, (*b*) is a cross-sectional view of a unit cell, and (*c*) is a cross-sectional view showing a peripheral portion of the semiconductor device.

FIG. 19(a) is a schematic plan view of the semiconductor device 322 cut out from the silicon carbide wafer.

As shown in FIG. 19(a), the semiconductor device 322 is cut out in a rectangular shape, for example. The semiconductor device 322 includes the unit cell placement section 100ul including a plurality of unit cells therein, and the peripheral portion 100fl. The unit cell placement section 100ul includes a plurality of unit cells 100u arranged therein as described above with reference to FIG. 12. The peripheral portion 100fl is arranged so as to surround the unit cell placement section 100ul, for example, as seen from the normal direction to the principal surface of the semiconductor substrate 101.

FIG. 19(b) is a cross-sectional view showing one of the plurality of unit cells 100u arranged in the unit cell placement section 100ul. The unit cell 100u shown in the figure has a similar configuration to that of the unit cell described above with reference to FIG. 12, and therefore will not be described below.

FIG. 19(c) is a cross-sectional view taken along line E-F shown in FIG. 19(a), showing a configuration of the peripheral portion 100fl. As shown in the figure, the peripheral portion 100fl includes an implantation region 115 and the FLR structure 116 of the second conductivity type arranged in the first silicon carbide semiconductor layer 102. The implantation region 115 is arranged along the outermost periphery of the unit cell placement section 100ul, and includes the second conductivity type region 103d. The FLR structure 116 is arranged further on the outside of the implantation region 115. The FLR structure 116 includes a singular or a plurality of ring regions 103f of the second conductivity type arranged on the surface of the first silicon carbide semiconductor layer 102 so as to surround the unit cell placement section 100ul and the FLR structure 116. These ring regions 103f together form an FLR (Field Limiting Ring).

The semiconductor device 322 of the present embodiment may include the depletion suppressing region 104f of the first conductivity type arranged further on the outside of the FLR structure 116. The depletion suppressing region 104f is arranged in a surface region of the first silicon carbide semiconductor layer 102 so as to surround the ring-shaped FLR structure 116, for example.

The implantation region 115 and the FLR structure 116 are provided for the purpose of ensuring the device withstand voltage, and serve to relax the electric field localization at the peripheral portion 100fl of the semiconductor device 322. It is possible to relax the electric field localization at the peripheral portion 100fl by properly designing the implantation region 115 and the FLR structure 116 having the opposite conductivity type (herein, the p-type) to the drift region 102d designed to have an intended withstand voltage. The implantation region 115 and the FLR structure 116 are preferably formed in the same step as the body region 103. Then, it is possible to easily realize the process design and to reduce the process cost.

In the example shown in FIG. 19(c), in the ion implantation step described above with reference to FIG. 14(b), an impurity implantation region to be the second conductivity type region 103d and the ring region 103f is formed simultaneously with the formation of the second body region 103b'. These impurity implantation regions become the second conductivity type region 103d and the ring region 103f, respectively, through the activation annealing step shown in FIG. 15(c). Therefore, the impurity concentration profile in the depth direction of the second conductivity type region 103d and the ring region 103f is the same as the impurity concentration profile in the depth direction of the second body region 103b.

Simultaneously forming the second body region 103b in the unit cell placement section 100ul and the second conductivity type region 103d and the ring region 103f in the peripheral portion 100fl not only facilitates the process design, but also gives an advantage that deterioration of the device withstand voltage can be suppressed, as will be described below.

In order to suppress the deterioration of the device withstand voltage, it is preferred to relax the electric field localization at the peripheral portion 100fl. In order to relax the electric field localization, the design of the second conductivity type region 103d and the ring region 103f is important. For example, the width, the interval, the number of the dopant concentration, etc., of the ring region 103f are designed so that the device withstand voltage can be ensured. Since electric field localization occurs primarily at a pn junction, if a region of the second conductivity type is arranged in the peripheral portion, electric field localization is likely to occur at the bottom thereof. In the present embodiment, since the second conductivity type region 103d and the ring region 103f of the peripheral portion 100fl have the same dopant concentration and thickness as those of the second body region 103b, it is possible to relax the electric field localization at the bottom of the pn junction in the peripheral portion 100fl, as in the unit cell placement section 100ul. Moreover, the dopant concentration of the first body region 103a can be set arbitrarily while the dopant concentration of these regions of the second conductivity type (the second body region 103b, the second conductivity type region 103d, the ring region 103f) is set such that the device withstand voltage can be ensured. Therefore, it is possible to realize a preferred threshold voltage Vth and rising voltage |Vf0| while suppressing the deterioration of the device withstand voltage.

The present embodiment also provides an advantage that even if the dopant concentration of the body region 103 (particularly, the dopant concentration of the first body region 103a) is changed, it is not necessary to change the device design and re-produce masks. Therefore, it is possible to give a degree of freedom in the process design using the same device design. For example, in the conventional semiconductor device 1000 shown in FIG. 47, it is possible to control the threshold voltage Vth and the rising voltage Vf0 by adjusting the dopant concentration of the body region 1030. Where the second conductivity type region and the ring region of the peripheral portion are formed simultaneously with the body region 1030, it may be necessary to re-design the second conductivity type region and the ring region of the peripheral portion in order to relax the electric field localization at the peripheral structure each time the dopant concentration of the body region 1030 is adjusted. This may possibly increase the production cost. Also when the regions of the peripheral structure are formed in a separate process from the body region 1030, the number of production steps and the production cost increase. In contrast, according to the present embodiment, it is possible to control the threshold voltage Vth and the rising voltage Vf0 by adjusting the dopant concentration of the first body region 103a, or the like, while ensuring the device withstand voltage, without increasing the number of production steps and the production cost.

The configuration of the semiconductor device of Embodiments 2-1 and 2-2 is not limited to those shown in FIGS. 12 to 19.

Embodiment 2-3

Figure 20:
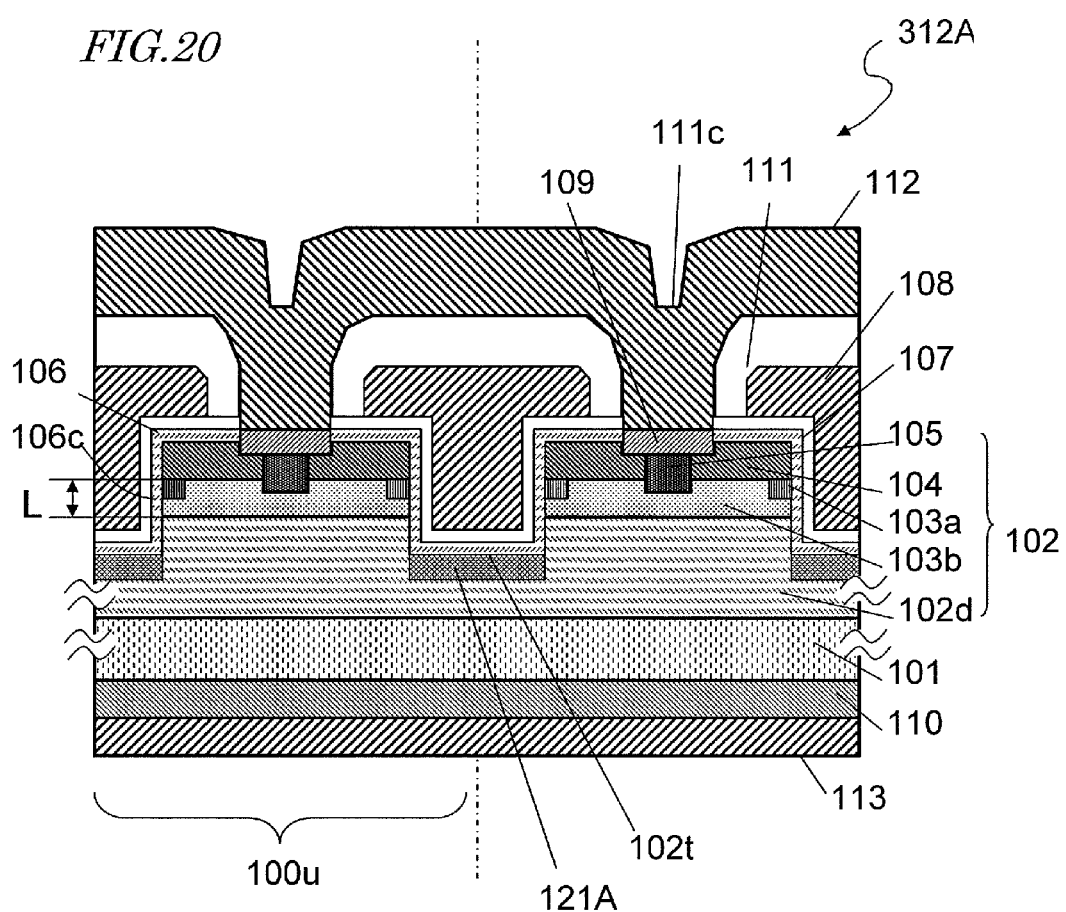
FIG. 20 A cross-sectional view showing a semiconductor device according to another example of Embodiment 2-1.
Figure 21:
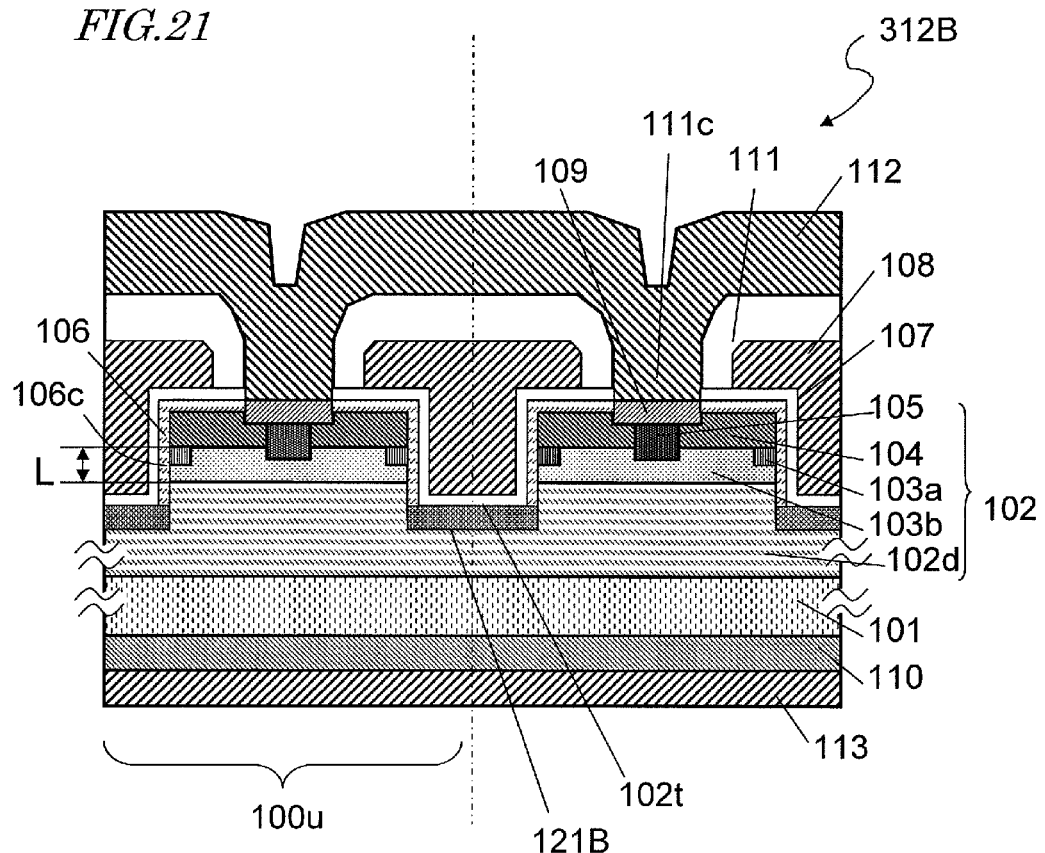
FIG. 21 A cross-sectional view showing a semiconductor device according to another example of Embodiment 2-1.
Figure 22:
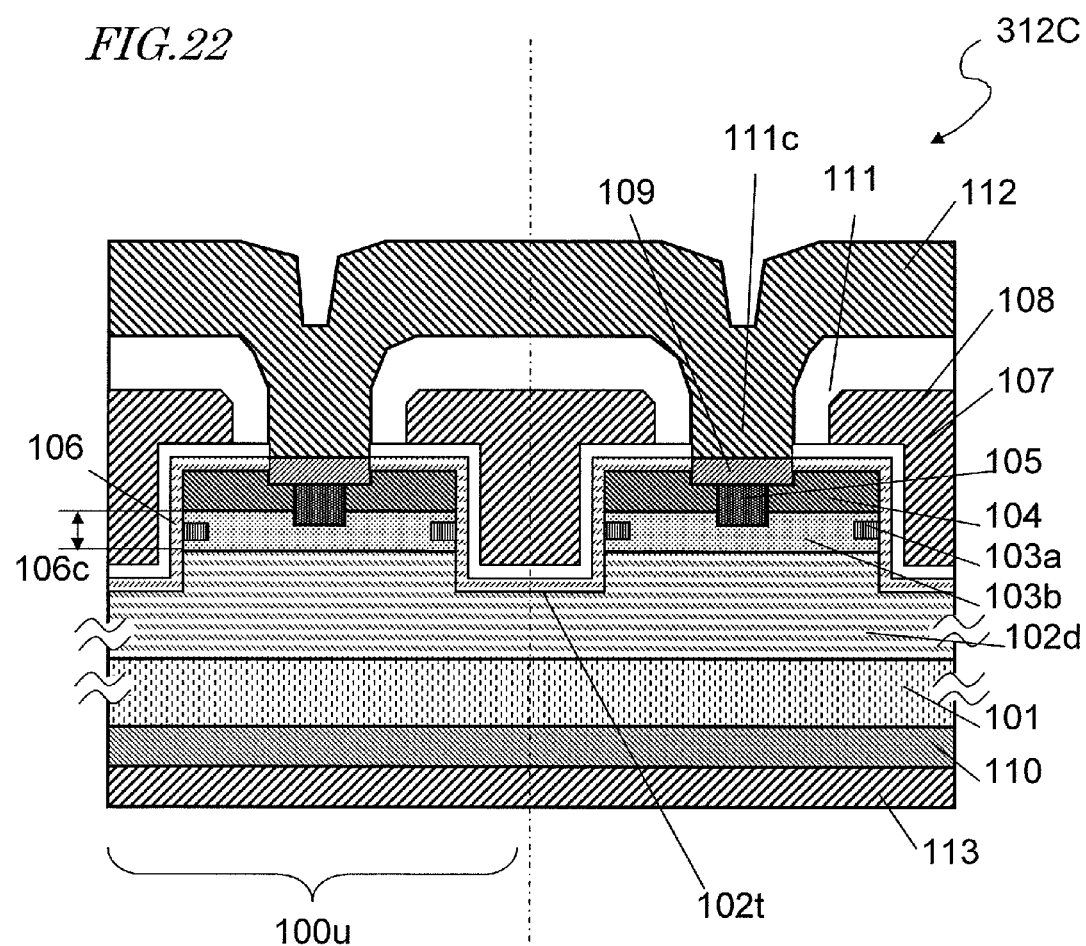
FIG. 22 A cross-sectional view showing a semiconductor device according to another example of Embodiment 2-1.

FIGS. 20 to 22 are cross-sectional views showing semiconductor devices 312A, 312B and 312C, respectively, according to other embodiments of Embodiment 2-1. Specifically, they are various modifications described above in Embodiment 1-3 added to Embodiment 2-1. Therefore, description of portions similar to those of Embodiment 1-3 may be omitted.

The semiconductor device 312A shown in FIG. 20 is different from the semiconductor device 312 shown in FIG. 12 in that the electric field relaxing region 121A of the second conductivity type (herein, the p-type) is included on the bottom portion of the trench 102t. In the semiconductor device 312A, the electric field relaxing region 121A is arranged between the second silicon carbide semiconductor layer 106 arranged on the bottom surface of the trench 102t and the drift region 102d. The electric field relaxing region 121A is provided to reduce the electric field intensity occurring on the bottom surface of the trench 102t.

As shown in FIG. 21, the second silicon carbide semiconductor layer 106 may be arranged only on the side surface of the trench 102t, and does not need to be arranged on the bottom surface of the trench 102t. Also in such a case, the electric field relaxing region 121B of the second conductivity type (herein, the p-type) may be arranged on the bottom portion of the trench 102t. In the semiconductor device 312B shown in FIG. 21, the electric field relaxing region 121B is arranged between the gate insulating film 107 arranged on the bottom surface of the trench 102t and the drift region 102d.

The first body region 103a of the present embodiment only needs to be in contact with the channel region 106c, and does not need to be in contact with the impurity region 104. For example, in the semiconductor device 312C shown in FIG. 22, the first body region 103a is arranged between the upper surface and the lower surface of the second body region 103b so as to be in contact with the channel region 106c. The first body region 103a is preferably not in contact with the drift region 102d. Note that it is preferred that the first body region 103a is arranged at a shallower position, in which case it is possible to better reduce the influence of crystal defects due to ion implantation.

While the embodiments described above are directed to cases where the side surface of the trench 102t is vertical, similar advantageous effects can be realized also when the trench groove is tapered. While the gate insulating film 107 is formed by oxidizing the surface of silicon carbide in the method described above, it may be formed by using a CVD method, or the like, instead. Moreover, while the first and second body regions 103a and 103b are formed by ion implantation on the first silicon carbide semiconductor layer 102 in the method described above, the second body region 103b may be formed by epitaxial growth, for example. Note however that it is preferred that the second body region 103b is formed by ion implantation, in which case it is possible to simultaneously form the peripheral structure (e.g., the ring region) in that ion implantation step.

Thus, with the semiconductor devices of Embodiments 2-1, 2-2 and 2-3, the body region is formed by the first body region for adjusting the threshold voltage and the second body region having a lower dopant concentration than the first body region for ensuring the device withstand voltage. Since the dopant concentrations of these body regions can be controlled independently of each other, it is possible to realize an intended threshold voltage while suppressing withstand voltage defects and leak defects of the semiconductor device. Moreover, it is possible to control the rising voltage of the channel diode to an intended value, and to allow more diode current to flow through the channel. As a result, it is possible to reduce the current flowing in the forward direction through the SiC pn junction, and to suppress the increase in crystal defects. It is also possible to suppress the increase in the source sheet resistance and to reduce the ON resistance.

Embodiment 3-1

Embodiment 3-1 of the semiconductor device of the present invention will now be described with reference to the drawings. As in Embodiment 1-1, the semiconductor device of the present embodiment is a vertical silicon carbide MISFET having a trench structure.

[Configuration of Semiconductor Device 313]

FIG. 23(a) is a cross-sectional view of a semiconductor device 313, and FIG. 23(b) is a plan view showing the upper surface of the body region 103 in the semiconductor device 313. FIG. 23(c) is a plan view illustrating an arrangement of unit cells in the semiconductor device 313.

Figure 24:
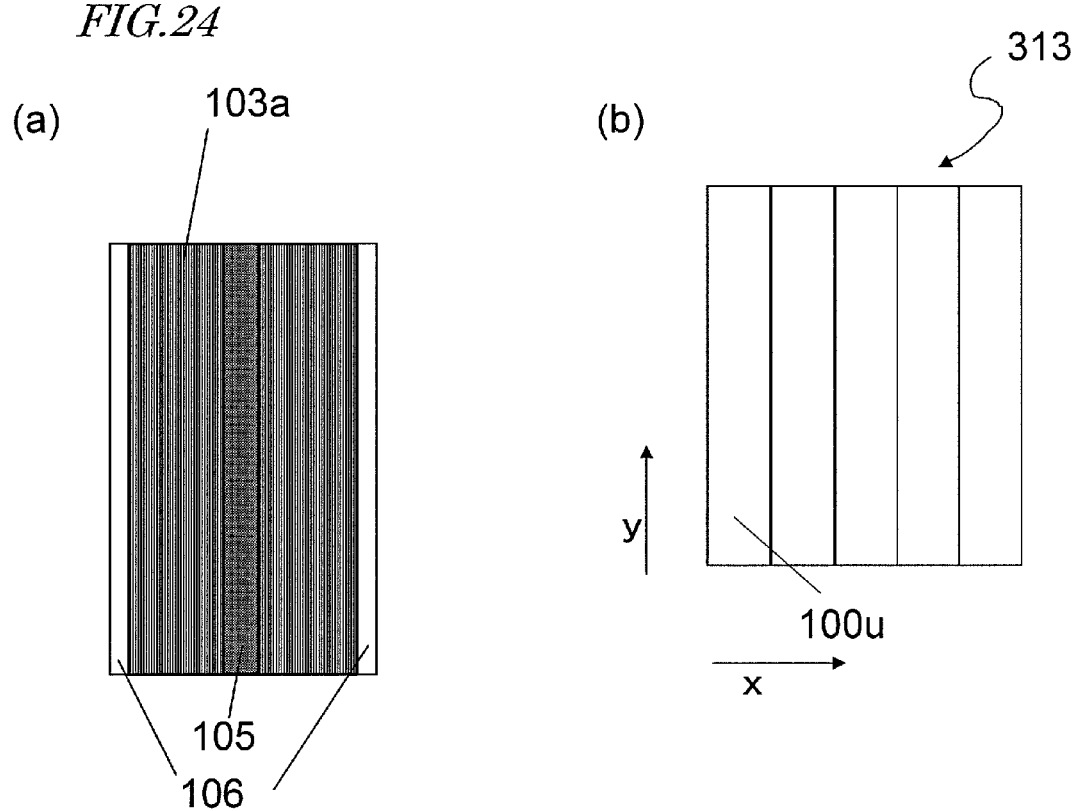
FIGS. 24 (*a*) and (*b*) are, respectively, a top view of a body region where unit cells have a stripe shape, and a plan view showing an example of an arrangement of unit cells in the semiconductor device.

The semiconductor device 313 of Embodiment 3-1 includes a similar structure to the semiconductor device 311 of Embodiment 1-1 or the semiconductor device 312 of Embodiment 2-1, except for the body region 103. Therefore, part of the description of the semiconductor device 313 according to the present embodiment that is redundant with the description of Embodiment 1-1 or Embodiment 2-1 may be omitted. For example, the description of FIG. 23(a), FIG. 23(c) and FIG. 24(b) may be redundant with the description of FIG. 12(a), FIG. 12(c) and FIG. 13(b), respectively. Specifically, the semiconductor device 313 according to the present embodiment is different from the semiconductor device 311 according to Embodiment 1-1 or the semiconductor device 312 according to Embodiment 2-1 in terms of the structure of the body region 103, and the description of other configurations, arrangements, etc., may be omitted.

The semiconductor device 313 includes a plurality of unit cells 100u arranged in two dimensions. Each unit cell 100u includes the semiconductor substrate 101, and the first silicon carbide semiconductor layer 102 arranged on the surface of the semiconductor substrate 101. The first silicon carbide semiconductor layer 102 includes the drift region 102d of the first conductivity type.

The body region 103 located on the drift region 102d and the impurity region 104 of the first conductivity type located on the body region 103 are arranged in the first silicon carbide semiconductor layer 102. The body region 103 includes the first body region 103a of the second conductivity type, and the second body region 103b of the second conductivity type arranged under the first body region 103a. The first body region 103a includes an impurity of the second conductivity type at a higher concentration than the second body region 103b. That is, the average value of the concentration (dopant concentration) of the impurity of the second conductivity type of the first body region 103a is higher than the average value of the concentration (dopant concentration) of the impurity of the second conductivity type of the second body region 103b. In the present specification, the average value of the dopant concentration is referred to as the "average dopant concentration".

The trench 102t running through the body region 103 is provided in the first silicon carbide semiconductor layer 102. The second silicon carbide semiconductor layer 106 is arranged in the trench 102t.

In the present embodiment, the second silicon carbide semiconductor layer 106 is in contact with both the first body region 103a and the second body region 103b on the side surface of the trench 102t. Therefore, similar advantageous effects to those of Embodiment 2-1 can be realized.

Moreover, in the present embodiment, the first body region 103a is in contact with the contact region 105. This makes it possible to connect the contact region 105 and the channel region 106c together by the first body region 103a having a high concentration, and it is therefore possible to quickly move the carriers occurring in the channel when turned ON or OFF toward the side of the contact region, thereby improving the switching delay. The first body region 103a is located in a surface region of the body region 103, and is in contact with the impurity region 104. With such a configuration, it is possible to sufficiently ensure a contact area between the first body region 103a and the contact region 105, and it is therefore possible to more reliably improve the switching delay.

The advantageous effects described above can be realized as long as the first body region 103a is arranged so as to be in contact with each of the second silicon carbide semiconductor layer 106 (the channel region 106c), the impurity region 104 and the contact region 105. Note that the first body region 103a may be arranged across an entire cross section of the body region 103 parallel to the semiconductor substrate 101. This makes it possible to more effectively increase the switching property. For example, as shown in FIG. 23(b), the first body region 103a may be arranged across the entire upper surface of the body region 103.

As seen from the normal direction to the semiconductor substrate 101, the unit cells 100u of the semiconductor device 313 may be arranged two-dimensionally in the x direction and in the y direction perpendicular to the x direction as shown in FIG. 23(c), or may be arranged in a strip pattern as shown in FIG. 24(b).

As is the semiconductor device 312 of Embodiment 2-1, the rising voltage Vf0 of the diode and the threshold voltage Vth of the transistor of the semiconductor device 313 are each primarily determined by the dopant concentration of the first body region 103a, the dopant concentration of the second body region 103b, the dopant concentration and the thickness of the second silicon carbide semiconductor layer 106, and the thickness of the gate insulating film 107. On the other hand, the withstand voltage of the semiconductor device 313 is primarily determined by the pn junction formed by the second body region 103b and the drift region 102d. In the present embodiment, the average dopant concentration of the first body region 103a is designed so that the rising voltage Vf0 of the diode and the threshold voltage Vth of the transistor in the semiconductor device 313 are each of an intended value. Particularly, the rising voltage Vf0 of the diode is set to be smaller than the rising voltage Vf of the pn junction diode formed by the body region 103 and the first silicon carbide semiconductor layer 102.

As is the semiconductor device 312 of Embodiment 2-1, the semiconductor device 313 is designed so that the dopant concentration of the first body region 103a is larger than the dopant concentration of the second body region 103b. Thus, it is possible to suppress the progression of crystal defects of silicon carbide by suppressing the amount of current to flow through the body diode while ensuring the device withstand voltage.

[Method for Manufacturing Semiconductor Device 313]

Figure 25:
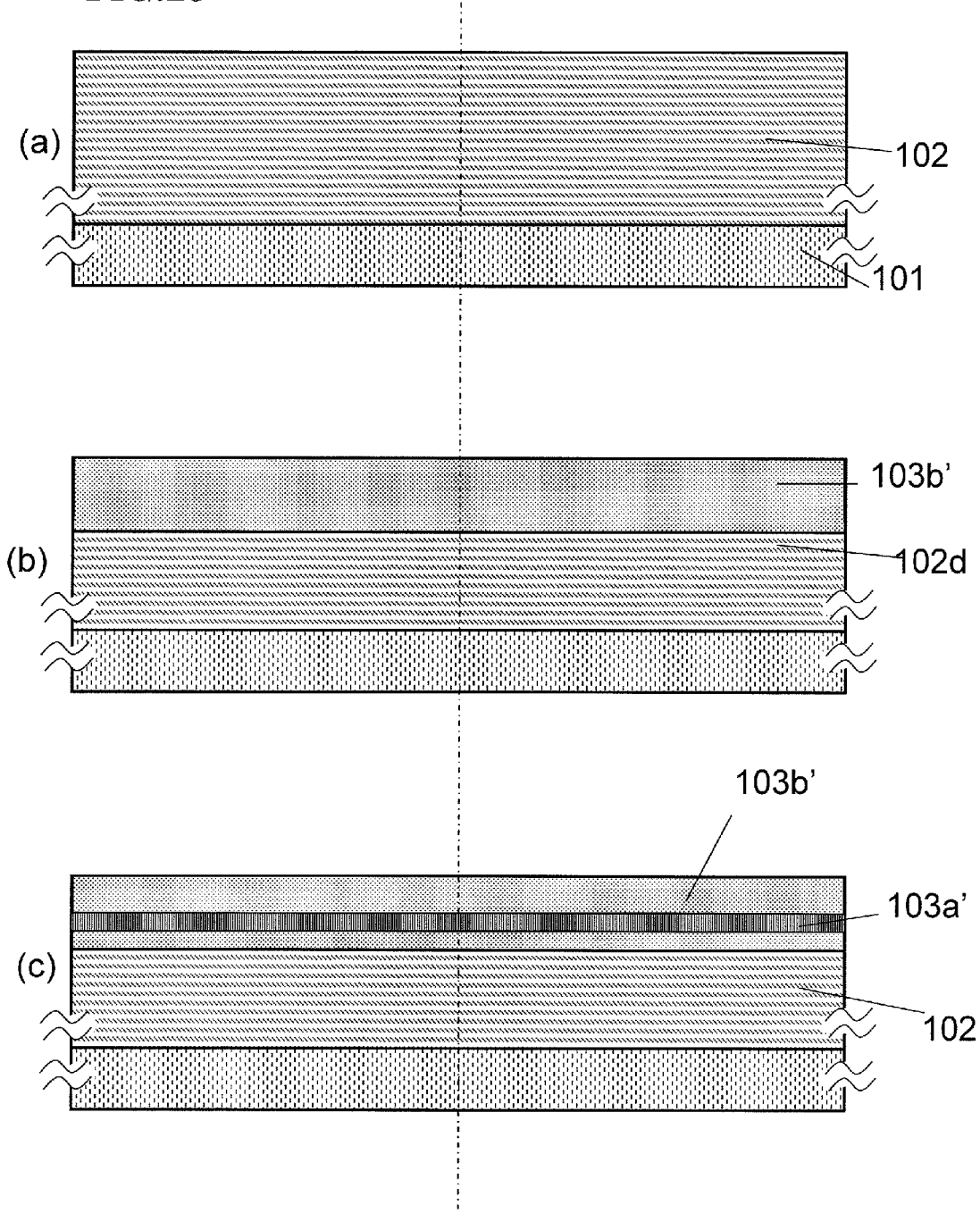
FIGS. 25 (*a*) to (*c*) are process cross-sectional views each illustrating a method for manufacturing a semiconductor device shown.
Figure 26:
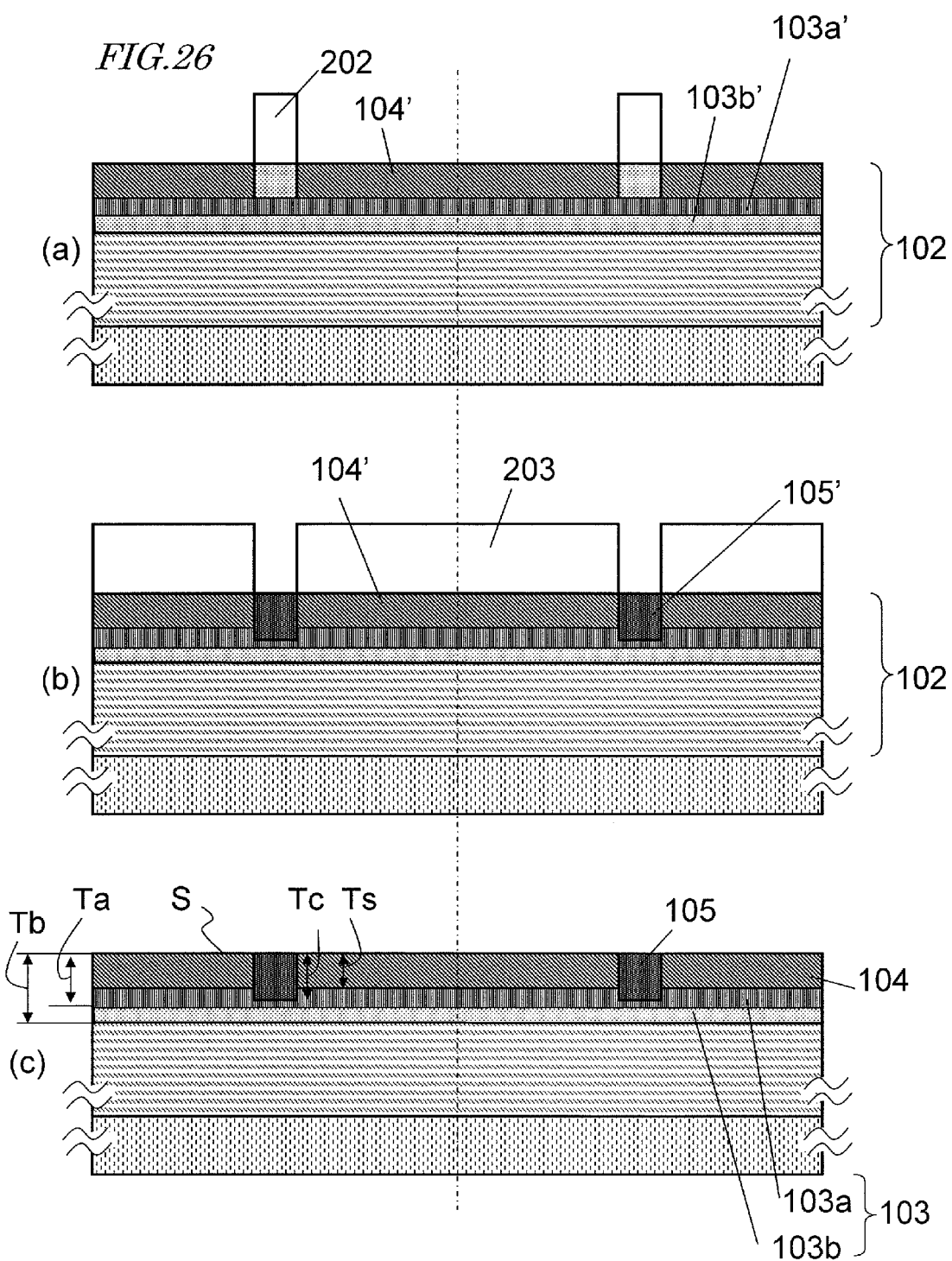
FIGS. 26 (*a*) to (*c*) are process cross-sectional views each illustrating a method for manufacturing the semiconductor device.
Figure 27:
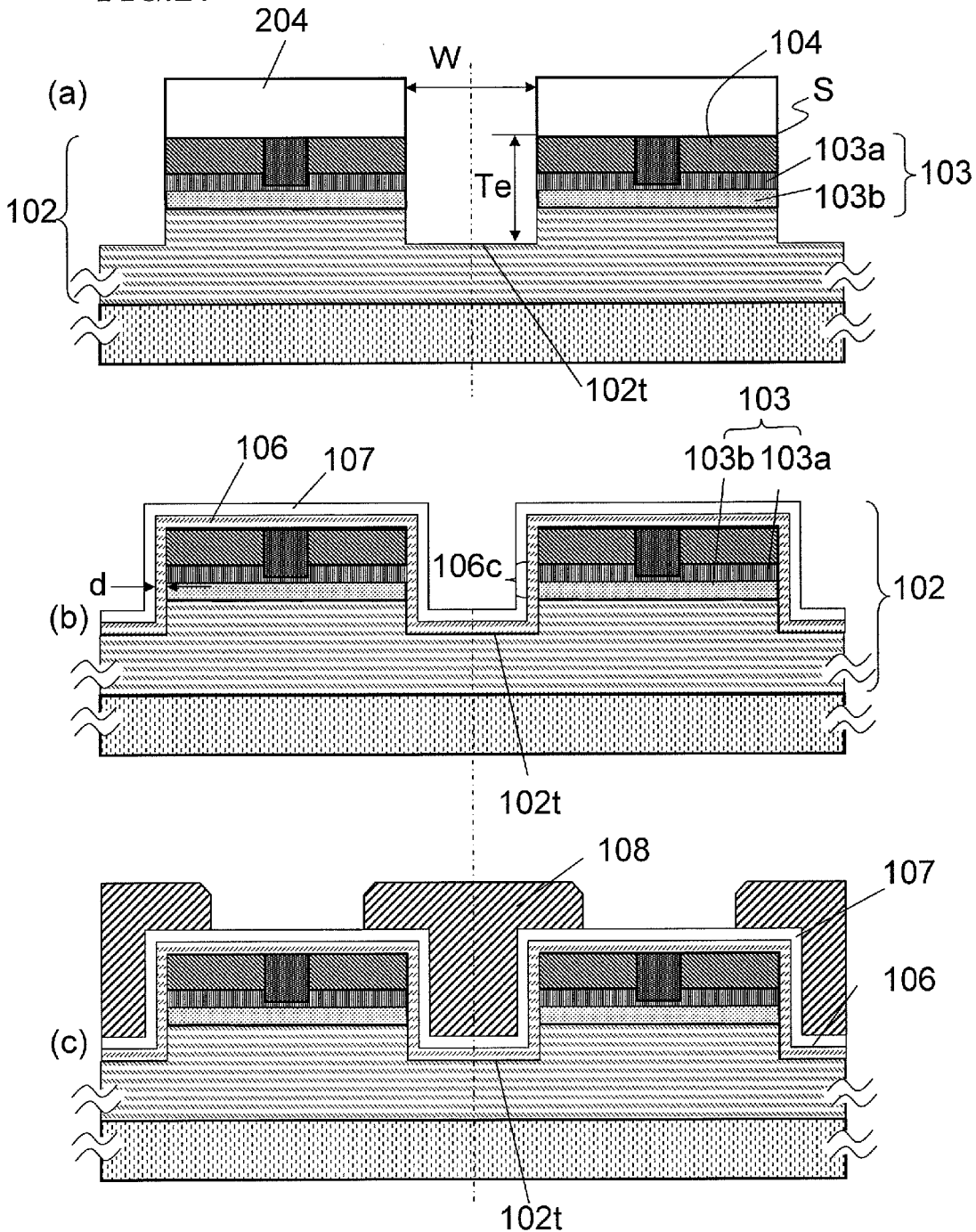
FIGS. 27 (*a*) to (*c*) are process cross-sectional views each illustrating a method for manufacturing the semiconductor device.
Figure 28:
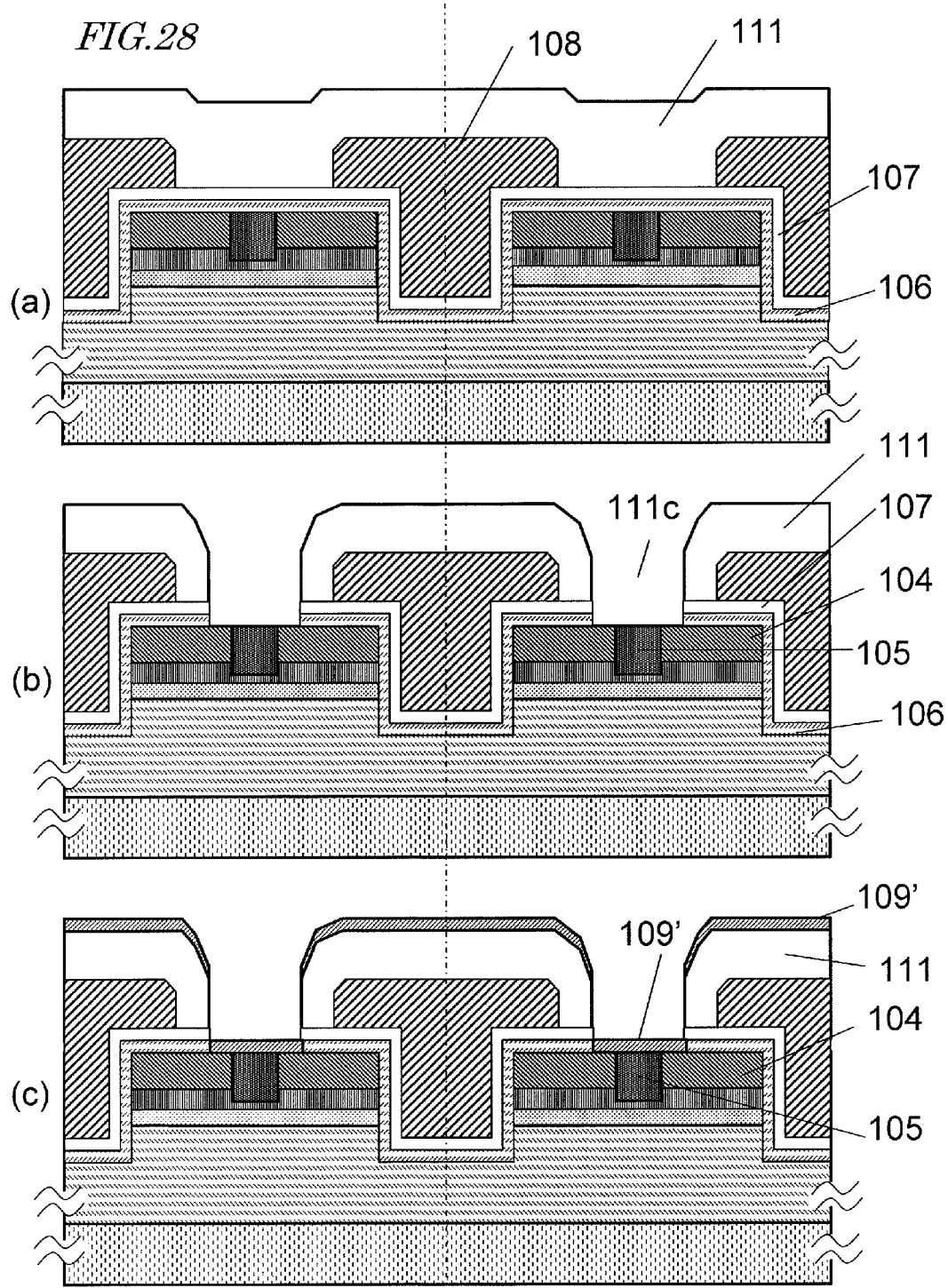
FIGS. 28 (a) to (c) are process cross-sectional views each illustrating a method for manufacturing the semiconductor device.
Figure 29:
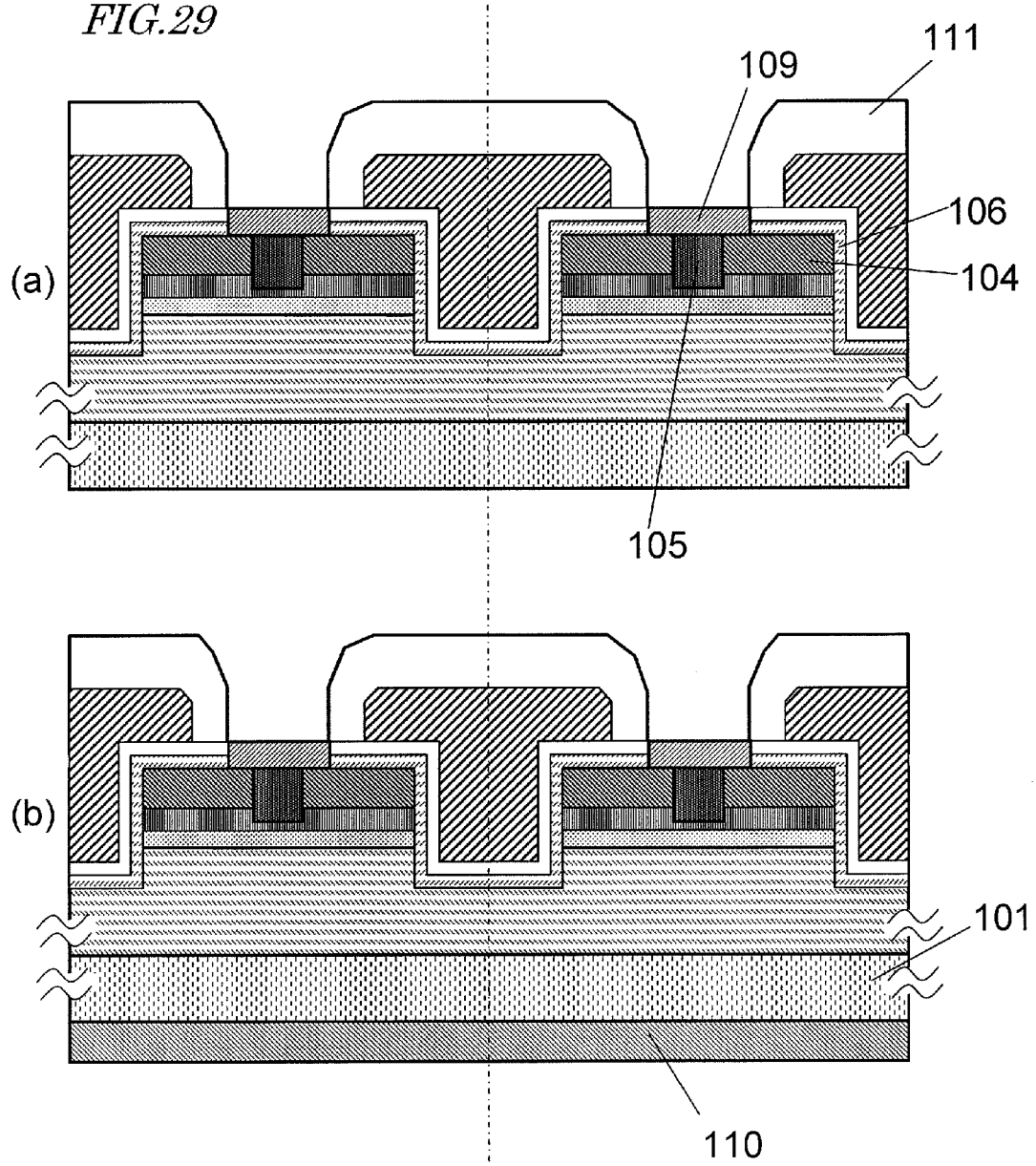
FIGS. 29 (a) and (b) are process cross-sectional views each illustrating a method for manufacturing the semiconductor device.

Next, referring to FIGS. 25 to 29, an example of a method for manufacturing the semiconductor device 313 of the present embodiment will be described. Note that the following description is merely illustrative, and the present invention is not limited to particular processes, conditions, concentrations, thicknesses, etc. Part of the description of the method for manufacturing the semiconductor device 313 according to the present embodiment that is common to the method for manufacturing the semiconductor device 311 according to Embodiment 1-1 or the method for manufacturing the semiconductor device 312 according to Embodiment 2-1 may be omitted. For example, the descriptions of FIGS. 25 to 29 in the present embodiment respectively correspond to the descriptions of FIGS. 14 to 18 in Embodiment 2-1. A similar method can be employed for the present embodiment, except that the step shown in FIG. 25(c) is partially different from the step shown in FIG. 14(c) of Embodiment 2-1.

First, as shown in FIG. 25(a), the first silicon carbide semiconductor layer 102 having a high resistance is formed on the principal surface of the semiconductor substrate 101. Then, as shown in FIG. 25(b), the second body region 103b' of the second conductivity type is formed on the first silicon carbide semiconductor layer 102.

Then, as shown in FIG. 25(c), p-type impurity ion is implanted into a portion of the first silicon carbide semiconductor layer 102, thereby forming the first body region 103a'. A portion of the second body region 103b' where the first body region 103a' has not been formed (a portion that has not been implanted with the p-type impurity in this step) becomes the second body region 103b of the semiconductor device 313 through a subsequent activation step. In this step, the implantation conditions are set so that the lower surface of the first body region 103a' is located above (arranged at a shallower position than) the lower surface of the second body region 103b'.

Next, the impurity region 104' is formed as shown in FIG. 26(a). Then, after the mask 202 is removed, the contact region 105' is formed as shown in FIG. 26(b).

After the mask 203 is removed, activation annealing is performed, thereby forming the first body region 103a, the second body region 103b, the impurity region 104 and the contact region 105 as shown in FIG. 26(c). The first body region 103a and the second body region 103b are referred to collectively as "the body region 103".

The depths Ta and Tb and the ion implantation profiles of the first body region 103a and the second body region 103b are similar to the conditions described above in Embodiment 2-1, for example.

In order to sufficiently ensure the contact area between the contact region 105 and the first body region 103a, it is preferred that the depth Tc of the contact region 105 is greater than the depth Ts of the impurity region 104 and is less than the depth Ta of the first body region 103a.

Next, as shown in FIG. 27(a), the trench 102t is formed on the first silicon carbide semiconductor layer 102. Then, as shown in FIG. 27(b), silicon carbide is epitaxially grown on the surface of the first silicon carbide semiconductor layer 102, thereby obtaining the second silicon carbide semiconductor layer 106. Then, as shown in FIG. 27(b), the gate insulating film 107 is formed on the surface of the second silicon carbide semiconductor layer 106.

In the example shown in FIG. 27(b), the upper surface of the body region 103 is in contact with the impurity region 104, and the lower surface of the body region 103 is in contact with the drift region 102d. The upper surface of the body region 103 is defined only by the upper surface of the first body region 103a. The lower surface of the body region 103 is defined only by the lower surface of the second body region 103b, and the first body region 103a is not in contact with the drift region 102d.

Then, as shown in FIG. 27(c), the gate electrode 108 is formed in the trench 102t. Then, as shown in FIG. 28(a), the interlayer insulating film 111 is formed so as to cover the gate electrode 108 and the gate insulating film 107.

Next, as shown in FIG. 28(b), the contact hole 111c is formed, which exposes the entire upper surface of the contact region 105 and a portion of the upper surface of the impurity region 104. Then, as shown in FIG. 28(c), the metal film 109' is formed on the interlayer insulating film 111 and in the contact hole 111c and a heat treatment is performed thereon, thereby forming the first ohmic electrode 109 as shown in FIG. 29(a).

Then, as shown in FIG. 29(b), the second ohmic electrode 110 is formed on the reverse surface of the semiconductor substrate 101. Then, a source line (upper wiring electrode) is formed on the interlayer insulating film 111 and in the contact hole 111c. Moreover, a gate line (or a gate pad) in contact with the gate electrode 108 is formed. A reverse surface electrode for die-bonding is formed on the reverse surface of the second ohmic electrode 110. Thus, the semiconductor device 313 shown in FIG. 23 is obtained.

Also in the present embodiment, since the body region 103 can be formed by the first body region 103a and the second body region 103b having different dopant concentrations from each other, similar advantageous effects to those of Embodiment 2-1 described above can be realized.

Embodiment 3-2

Moreover, when manufacturing a semiconductor chip as the semiconductor device 313, the process design for an electric field localization relaxing structure in a peripheral portion of the semiconductor chip is also facilitated.

A semiconductor device (semiconductor chip) of Embodiment 3-2 has a structure of the semiconductor device of Embodiment 3-1 where the peripheral portion of Embodiment 2-2 is provided.

FIG. 30(a) is a schematic plan view of the semiconductor device 323 cut out from the silicon carbide wafer. FIG. 30(b) is a cross-sectional view showing one of the plurality of unit cells 100u arranged in the unit cell placement section 100ul. FIG. 30(c) is a cross-sectional view taken along line E-F shown in FIG. 30(a), showing a configuration of the peripheral portion 100fl. FIGS. 30(a) and 30(c) respectively correspond to FIGS. 19(a) and 19(c) of Embodiment 2-2, and will not therefore be described below. FIG. 30(b) corresponds to FIG. 19(b) of Embodiment 2-2, and will not therefore be described below.

The configuration of the semiconductor device of Embodiments 3-1 and 3-2 is not limited to those shown in FIGS. 23 to 30.

Embodiment 3-3

Figure 31:
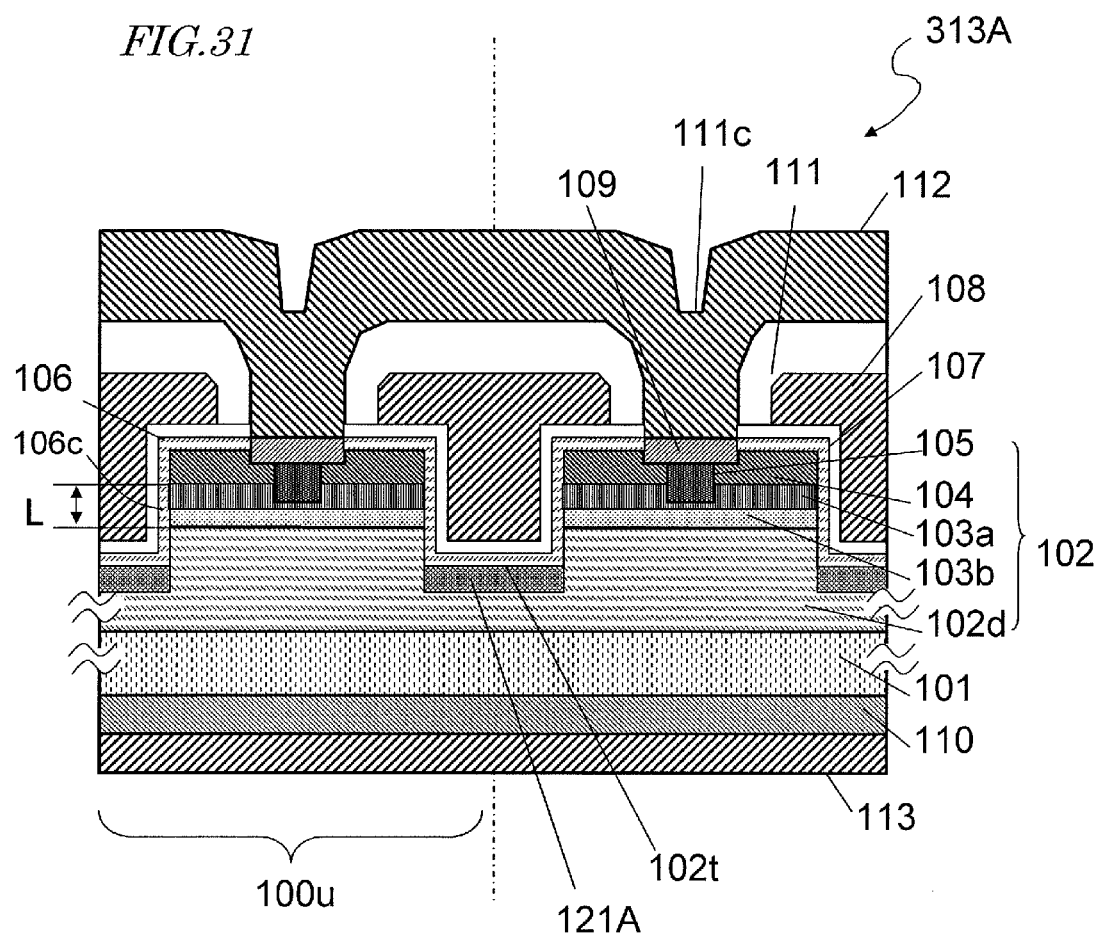
FIG. 31 A cross-sectional view showing a semiconductor device according to another example of Embodiment 3-1.
Figure 32:
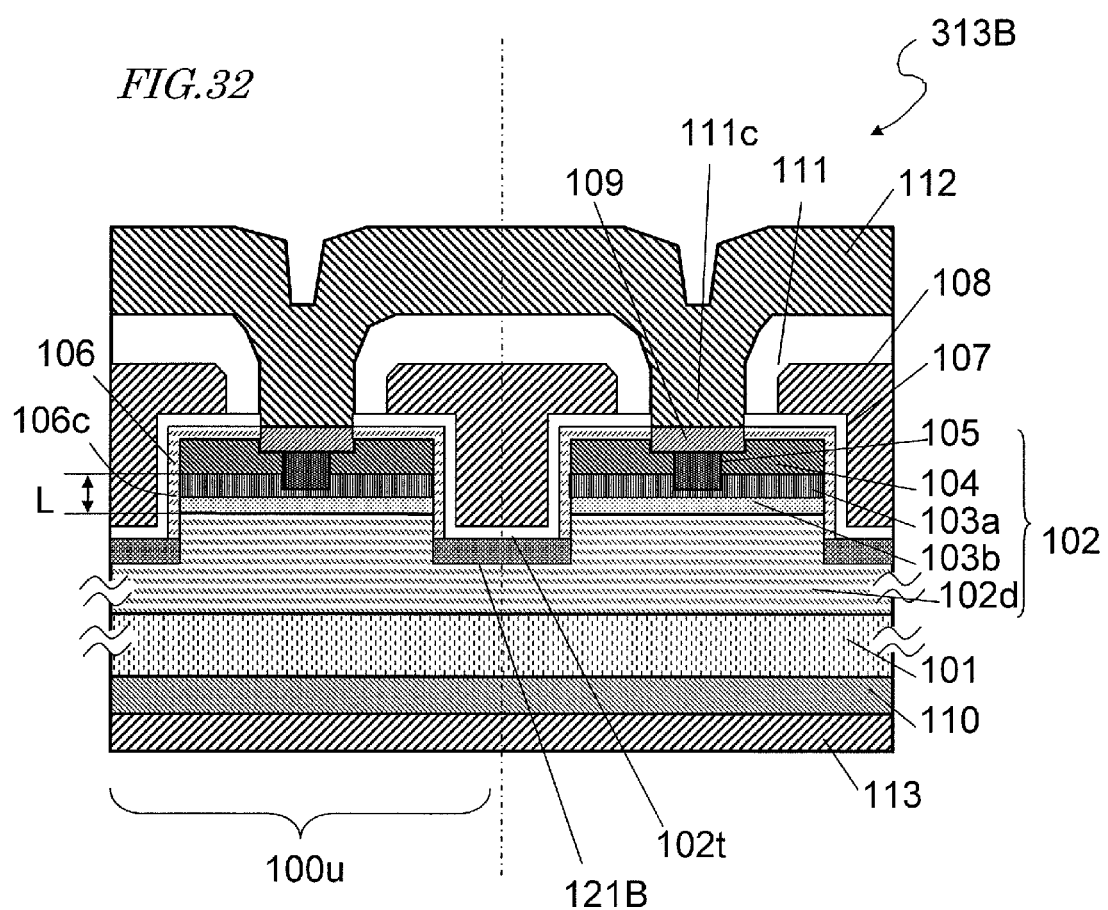
FIG. 32 A cross-sectional view showing a semiconductor device according to another example of Embodiment 3-1.

FIGS. 31 and 32 are cross-sectional views showing semiconductor devices 313A and 313B according to other embodiments of Embodiments 3-1 and 3-2. Specifically, the semiconductor device 313A has a structure of the semiconductor device 313 of Embodiment 3-1 where an electric field relaxing layer 121A of Embodiment 2-3 is provided, and a semiconductor device 313B has a structure of the semiconductor device 313 of Embodiment 3-1 where an electric field relaxing layer 121B of Embodiment 2-3 is provided. With the provision of the electric field relaxing regions 121A and 121B, it is possible to reduce the electric field intensity occurring on the bottom surface of the trench 102t, as in Embodiment 2-3.

Figure 33:
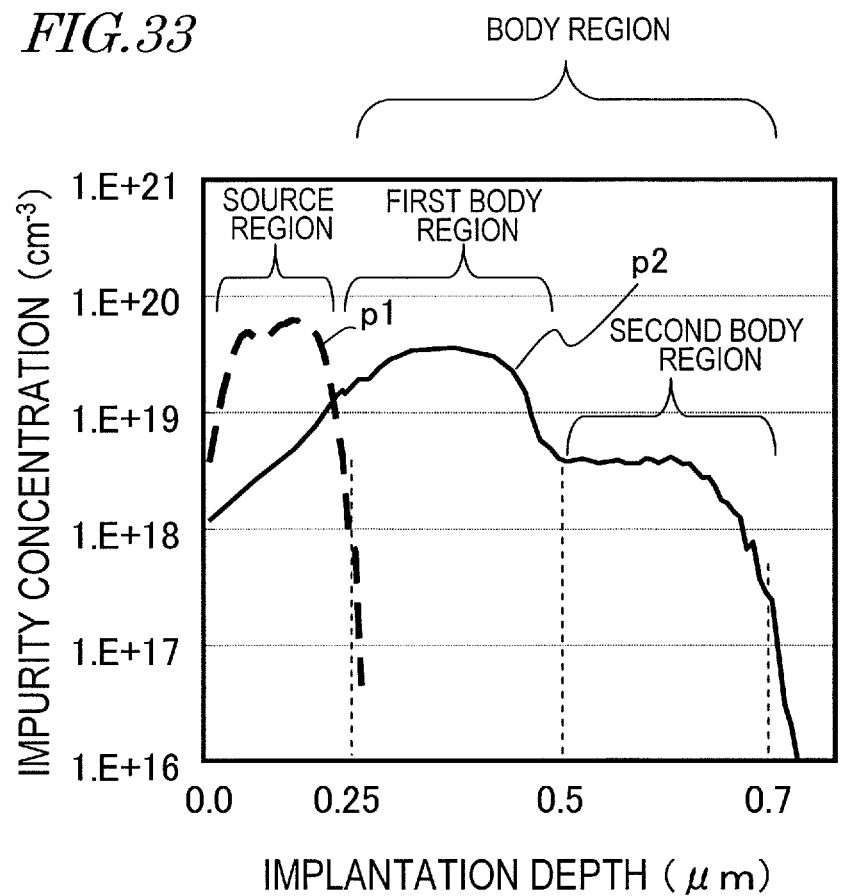
FIG. 33 A graph illustrating an impurity concentration profile in the depth direction for an impurity region and body regions in the semiconductor device of Embodiment 3-1.

FIG. 33 is a graph illustrating concentration profiles in the depth direction of the impurity region 104 and the body region 103. In this figure, the concentration profile p1 of the impurity region 104 and the total concentration profile p2 of the first body region 103a and the second body region 103b are laid over each other. In this example, the first body region 103a, the second body region 103b and the impurity region 104 are each formed by multi-step implantation.

If the first body region 103a and the second body region 103b are formed by multi-step implantation, the concentration profile can be made generally flat in these regions as shown in the figure. Therefore, in the concentration profile p2 of the p-type impurity in the depth direction, the generally flat region located in an upper position is the first body region 103a, and the position (depth) at which the concentration rapidly decreases is the interface between the first body region 103a and the second body region 103b. The generally flat region at a deeper position than the interface is the second body region 103b.

Typically, when the body region is formed by multi-step implantation, the implantation condition is set so that the impurity concentration profile of the body region is generally flat in the depth direction. At a position deeper than the body region, a region where the concentration decreases significantly (corresponding to the tail portion of the implantation profile in a lowest position) is formed. In contrast, in the present embodiment, generally flat regions having different concentrations are formed in two steps, respectively defining the first body region 103a and the second body region 103b.

While the embodiments described above are directed to cases where the side surface of the trench 102t is vertical, similar advantageous effects can be realized also when the trench groove is tapered. While the gate insulating film 107 is formed by oxidizing the surface of silicon carbide in the method described above, it may be formed by using a CVD method, or the like, instead. Moreover, while the first and second body regions 103a and 103b are formed by ion implantation on the first silicon carbide semiconductor layer 102 in the method described above, the second body region 103b may be formed by epitaxial growth, for example. Note however that it is preferred that the second body region 103b is formed by ion implantation, in which case it is possible to simultaneously form the peripheral structure (e.g., the ring region) in that ion implantation step.

Thus, with the semiconductor devices of Embodiments 3-1, 3-2 and 3-3 of the present invention, the body region is formed by the first body region for adjusting the threshold voltage, and the second body region having a lower dopant concentration than the first body region for ensuring the device withstand voltage. Since the dopant concentrations of these body regions can be controlled independently of each other, it is possible to realize an intended threshold voltage while suppressing withstand voltage defects and leak defects of the semiconductor device. Moreover, it is possible to control the rising voltage of the channel diode to an intended value, and to allow more diode current to flow through the channel. As a result, it is possible to reduce the current flowing in the forward direction through the SiC pn junction, and to suppress the increase in crystal defects. It is also possible to suppress the increase in the resistance of the surface of the body region, thereby suppressing the switching delay.

Embodiment 4-1

A semiconductor device of the present embodiment will now be described with reference to the drawings. Semiconductor devices of Embodiment 4-1 and Embodiments 4-1', 4-2 and 4-3 to follow have similar configurations to those of the semiconductor devices of Embodiments 1-1, 2-1, 1-2 and 1-3, where the width d1 of the first body region 103a forming a unit cell in the direction parallel to the semiconductor substrate is equal to the width d2 of the first body region 103a forming another unit cell opposing the unit cell with the trench interposed therebetween.

[Configuration of semiconductor device 314]

Figure 34:
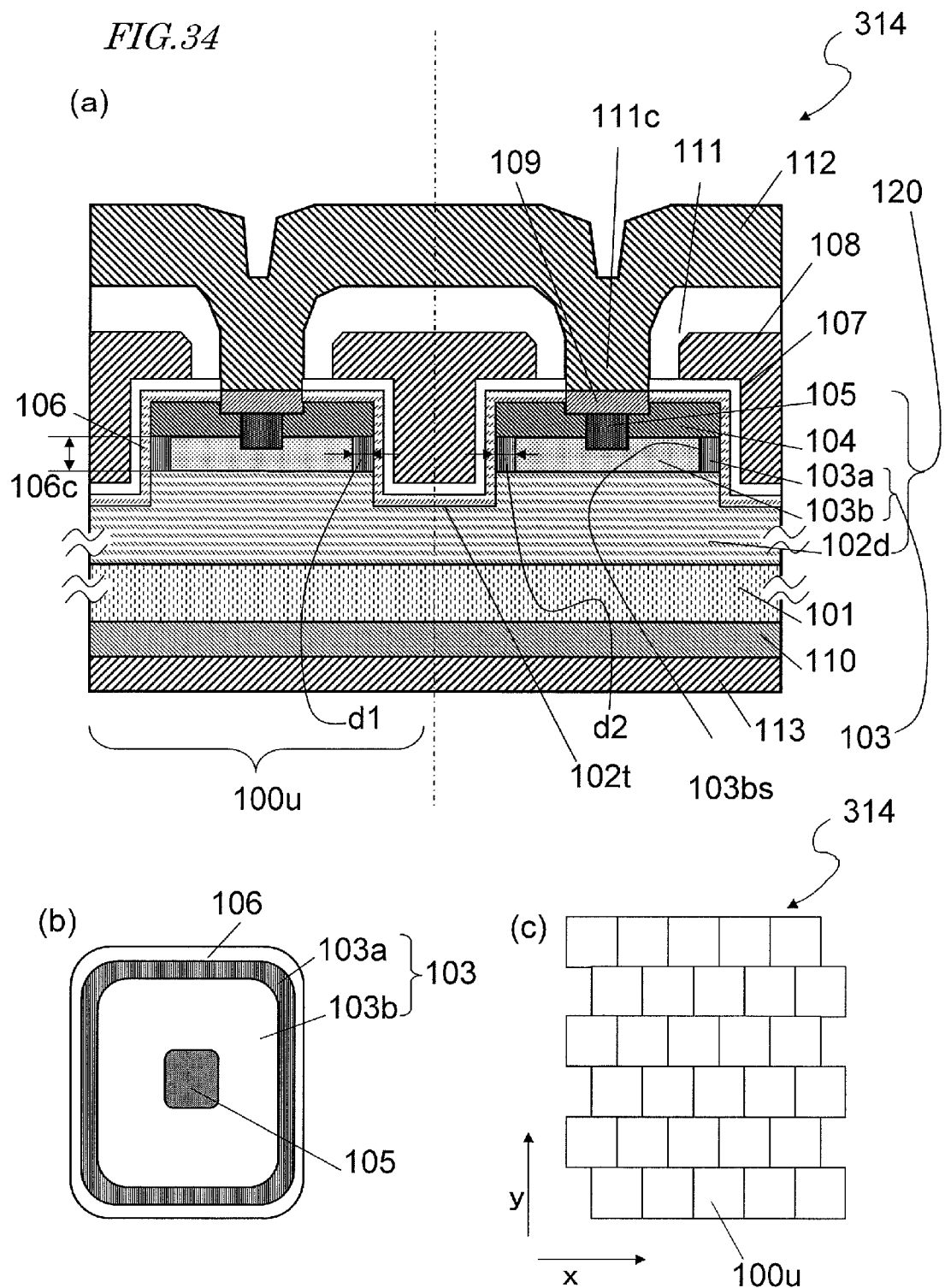
FIG. 34 (a) is a cross-sectional view of a semiconductor device of Embodiment 4-1, (b) is a top view of a body region in the semiconductor device, and (c) is a plan view showing an example of an arrangement of unit cells in the semiconductor device of Embodiment 4-1.
Figure 35:
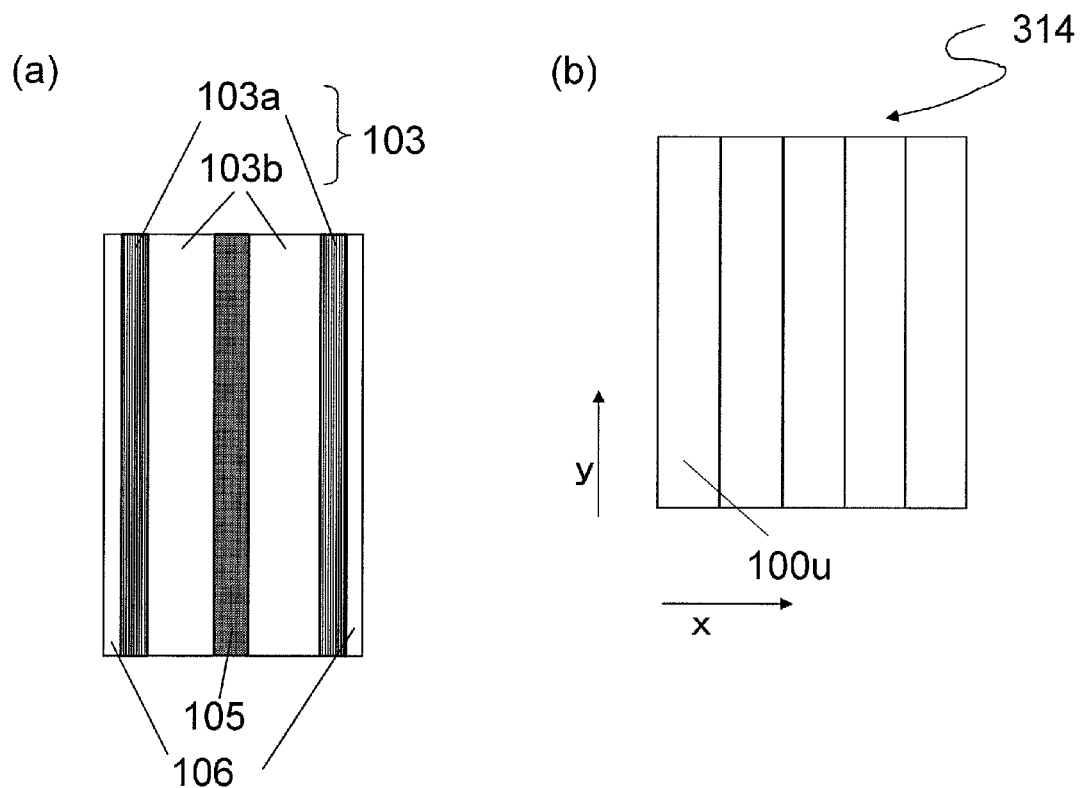
FIGS. 35 (a) and (b) are, respectively, a top view of a body region where unit cells have a stripe shape, and a plan view showing an example of an arrangement of unit cells in the semiconductor device of Embodiment 4-1.

FIG. 34(a) is a cross-sectional view of a semiconductor device 314, and FIG. 34(b) is a plan view showing the upper surface of the body region 103 in the semiconductor device 314. FIG. 34(c) is a plan view illustrating an arrangement of unit cells in the semiconductor device 314. FIGS. 35(a) and 35(b) are a top view of the body region 103 and a plan view of the semiconductor device 314 where the semiconductor device 314 has stripe-shaped unit cells.

Since the cross-sectional structure of the semiconductor device 314 in the present embodiment is a similar structure to the semiconductor device 311 of Embodiment 1-1, part of the description that is redundant will be omitted. The upper surface of the body region 103 of the semiconductor device 314 and the arrangement of unit cells in the present embodiment are similar to those of the semiconductor device 312 of Embodiment 2-1, and the description thereof will therefore be omitted.

A characteristic portion of the semiconductor device 314 of the present embodiment will now be described.

In the semiconductor device 314 of the present embodiment, the width of the first body region 103a of each unit cell 100u in the direction parallel to the semiconductor substrate 101 is equal to the width of the first body region 103a of another unit cell 100u adjacent thereto with the trench 102t interposed therebetween in the direction parallel to the semiconductor substrate 101. Herein, the "width of the first body region in the direction parallel to the substrate" means the thickness of the first body region in the direction parallel to the principal surface of the substrate. Typically, it corresponds to the distance from the interface at which the first body region and the second silicon carbide semiconductor layer are in contact with each other to the interface at which the first body region and the second body region are in contact with each other. In the example shown in FIG. 34(a), the width d1 of the first body region 103a forming a unit cell on the left side in the figure is equal to the width d2 of the first body region 103a forming another unit cell on the right side in the figure opposing the unit cell with the trench 102t interposed therebetween. That is, for the two opposing side surfaces of the trench 102t, the thicknesses of the first body regions forming the two side surfaces are equal to each other. This is because the first body region 103a is defined in a self-aligned manner with respect to the trench 102t as will be described below. In the present embodiment, the first body region 103a is defined in a self-aligned manner also with respect to the second body region 103b. The width d1 and the width d2 being equal to each other means that they are equal to each other within a margin of error that can exist in the process of manufacturing the semiconductor device 314, and it specifically encompasses cases where the width d1 and the width d2 are different from each other by an amount within the range of 0.1 μm or less.

The widths d1 and d2 of the first body region 103a in the direction parallel to the semiconductor substrate 101 are desirably such that the depletion layer expanding from the interface between the first body region 103a and the second silicon carbide semiconductor layer 106 into the first body region 103a stays within the first body region 103a with 0 V applied to the gate electrode 108. For example, the widths d1 and d2 of the first body region 103a in the direction parallel to the semiconductor substrate 101 are preferably 10 nm or more and 100 nm or less. Note that the widths d1 and d2 in the direction parallel to the semiconductor substrate 101 are defined between the interface at which the first body region 103a contacts the second silicon carbide semiconductor layer 106 and the interface at which the first body region 103a contacts the second body region 103b.

The first body region 103a is defined in a self-aligned manner with respect to the trench 102t. Therefore, the width d1 and the width d2 of the first body regions 103a of two unit cells 100u adjacent to each other with the trench 102t interposed therebetween in the direction parallel to the semiconductor substrate 101 are equal to each other. This suppresses variations in the threshold voltage and variations in the amount of current flowing through the channel region 106c between two unit cells sandwiching the trench 102t therebetween. Therefore, a plurality of unit cells 100u in the semiconductor device 314 can be operated in a well-timed manner with each other, and it is possible to realize a high switching speed. It also suppresses localization of the electric field at either one of the two unit cells sandwiching the trench 102t therebetween. This also suppresses variations in the withstand voltage between the plurality of unit cells 100u, and it is possible to realize a high withstand voltage.

[Method for Manufacturing Semiconductor Device 314]

Next, an example of a method for manufacturing the semiconductor device 314 of the present embodiment will be described with reference to FIGS. 36 to 41. Note that the following description is merely illustrative, and the method for manufacturing the semiconductor device 314 of the present embodiment is not limited to particular processes, conditions, concentrations, thicknesses, etc., to be illustrated below. Description of part of the method for manufacturing the semiconductor device 314 according to the present embodiment that is common to the method for manufacturing the semiconductor device 311 according to Embodiment 1-1 may be omitted. Particularly, the description of FIGS. 36(a), 40 and 41 in the present embodiment is similar to the description of FIGS. 3(a), 6 and 7 in Embodiment 1-1.

First, the semiconductor substrate 101 is prepared. Next, as shown in FIG. 36(a), the first silicon carbide semiconductor layer 102 having a high resistance is epitaxially grown on the semiconductor substrate 101.

Next, as shown in FIG. 36(b), the second body region 103b' is formed in the vicinity of the surface of the first silicon carbide semiconductor layer 102. The drift region 102d is defined in a region of the first silicon carbide semiconductor layer 102 other than the second body region 103b'. For the formation of the second body region 103b', ion implantation using Al (aluminum) as the impurity, for example, can be used. Where Al is used as the impurity, since the diffusion coefficient is small, the change in the concentration profile due to diffusion can be substantially ignored. Note that where B (boron) is used for the formation of the second body region 103b', the energy and dose of the ion implantation need to be selected so that an intended dopant concentration profile is obtained, by grasping the activation rate and the diffusion coefficient in advance. Assuming that the activation rate is 100%, the Al ion implantation energy and dose are as follows. Since a portion of the second body region 103b' becomes the second body region 103b of the semiconductor device 314 through a subsequent activation step, the impurity profile of the second body region 103b' is the impurity profile of the second body region 103b.

30 keV: $6.0 \times 10^{12}$ cm$^{-2}$
70 keV: $1.2 \times 10^{13}$ cm$^{-2}$
150 keV: $2.5 \times 10^{13}$ cm$^{-2}$
350 keV: $6.0 \times 10^{13}$ cm$^{-2}$ After the ion implantation, as shown in FIG. 37(a), the impurity region 104' of the first conductivity type is formed in the vicinity of the surface (surface portion) of the second body region 103b'. The impurity region 104' of the first conductivity type can be formed by ion implantation using N (nitrogen) as the n-type impurity, for example.

Then, as shown in FIG. 37(b), the mask 201 is formed on the first silicon carbide semiconductor layer 102, and Al is implanted using the mask 201 to form the contact region 105'. The contact region 105' preferably runs through the impurity region 104' of the first conductivity type to reach the second body region 103b'.

Next, as shown in FIG. 38(a) a polysilicon film having a thickness of 800 nm, for example, is formed by using an LP-CVD method, and dry etching is performed using a resist (not shown) as a mask, thereby forming the mask 202 defining a region including the trench 102t and the first body region 103a combined together. In the present embodiment, the mask 202 also defines the second body region 103b. Then, the resist mask (not shown) is removed, aluminum, for example, is ion-implanted into the second body region 103b' using the mask 202, thereby forming the first body region 103a' of the second conductivity type. Thus, a portion of the second body region 103b' under the mask 202 becomes the second body region 103b of the semiconductor device 314 through a subsequent activation step. A portion of the first body region 103a' becomes the first body region 103a of the semiconductor device 314 through a subsequent activation step. Due to the implantation into the second body region 103b', the impurity concentration of the first body region 103a' is inevitably higher than the impurity concentration of the second body region 103b'. The implantation energy in this step is set to an energy such that the position is at a depth equal to the second body region 103b', for example, and the dose is adjusted to be five times more, for example. In the present embodiment, the dose of the impurity implanted in this step is four times, for example, the dose when forming the second body region 103b'. Specifically, they are as follows.

30 keV: $2.4 \times 10^{13}$ cm$^{-2}$
70 keV: $4.8 \times 10^{13}$ cm$^{-2}$
150 keV: $1.0 \times 10^{14}$ cm$^{-2}$
350 keV: $2.4 \times 10^{14}$ cm$^{-2}$ The opening width W of the mask 202 is the total value of the width wt of the trench 102t shown in FIG. 34(a) and the widths d1 and d2 of two first body regions 103a sandwiching the trench 102t therebetween in the direction parallel to the semiconductor substrate 101. That is, the opening of the mask 202 defines the total of the trench 102t and the first body region 103a. The widths d1 and d2 of the first body region 103a are determined based on the concentration and the thickness of the second silicon carbide semiconductor layer 106 and the thickness of the gate insulating film 107 to be formed later. It is only required that the depletion layer expanding (toward the side of the second body region 103b) from the interface between the second silicon carbide semiconductor layer 106 and the first body region 103a stays within the first body region 103a with 0 V applied to the gate electrode 108. For this purpose, within the range of application of the present invention, the widths d1 and d2 is 15 nm or more and 20 nm or less.

As shown in FIG. 38(b), an insulating film, a conductive film or a metal film is formed across the entire principal surface of the first silicon carbide semiconductor layer 102 including the mask opening region, and a side wall 203 is formed on the side surface of the mask 202 by etch-back. Since the first body region 103a is defined below the side wall 203, the width of the side wall 203 in the direction parallel to the semiconductor substrate 101 is matched with d1 and d2. The width of the side wall 203 that can be formed is dependent on the height, the width and the aspect ratio of the side wall 203. Therefore, the thickness of the polysilicon film for the mask 202 and the thickness of the insulating film for the side wall 203 are adjusted so that the width of the side wall 203 formed by etch-back is d1 and d2. For example, an oxide film having a thickness of 500 nm is formed as an insulating film.

Next, using the mask 202 with the side wall 203 as a mask, the trench 102t running through the impurity region 104' and the first body region 103a' of the first conductivity type to expose the drift region 102d is formed as shown in FIG. 38(c). This trench can be formed by dry-etching the first silicon carbide semiconductor layer 102 using a mixed gas of Freon and oxygen, for example. The width wt of the trench 102t is about 1 μm, for example, and the depth is about 1.1 μm, for example.

Then, the mask 202 and the side wall 203 are completely removed by dry etching or HF-based wet etching.

The trench shape thus produced is as shown in FIG. 38(c), defining the first body region 103a' exposed through a pair of opposing side surfaces of the trench 102t. In the present embodiment, the widths d1 and d2 of the side wall 203 are 20 nm, for example, and dry etching using RIE with a strong anisotropy is performed to form the first body region 103a' whose widths d1 and d2 are 20 nm.

Then, the implanted impurity is activated by the subjecting first silicon carbide semiconductor layer 102 to a heat treatment, thereby forming the first body region 103a, the second body region 103b, the impurity region 104 and the contact region 105 as shown in FIG. 38(c).

The depth of the impurity region 104 with respect to the surface S of the first silicon carbide semiconductor layer 102 is 250 nm, for example, and the ion implantation profile is adjusted so that the average dopant concentration is about $5 \times 10^{19}$ cm$^{-3}$.

The depth of the second body region 103b is set to such a depth that a dopant concentration of $5 \times 10^{17}$ cm$^{-3}$, for example, can be obtained. The depth of the first body region 103a is set to such a depth that a dopant concentration of $2 \times 10^{19}$ cm$^{-3}$, for example, can be obtained. In the present embodiment, the depth of the first body region 103a and the second body region 103b with respect to the surface S of the first silicon carbide semiconductor layer 102 is 500 nm, for example. The depth of the impurity region 104 is set to such a depth that a dopant concentration of $5 \times 10^{17}$ cm$^{-3}$, for example, can be obtained. The depth of the contact region 105 is set to such a depth that a dopant concentration of $5 \times 10^{17}$ cm$^{-3}$, for example, can be obtained. In the present embodiment, the depth of the contact region 105 with respect to the surface S is 400 nm, for example, and the average dopant concentration is about $1 \times 10^{20}$ cm$^{-3}$.

Note that a surface layer of the first silicon carbide semiconductor layer 102 may be removed for surface cleaning of the first silicon carbide semiconductor layer 102 after activation annealing. Where a surface layer of the first silicon carbide semiconductor layer 102 is removed by 50 nm, for example, the depths of the second body region 103b, the impurity region 104 and the contact region 105 are all reduced by 50 nm to be 450 nm, 200 nm and 350 nm, respectively. In this case, the side surface of the trench 102t also recedes by about 50 nm, and the thicknesses d1 and d2 of the first body region 103a also become 15 nm.

Next, as shown in FIG. 39(a), the second silicon carbide semiconductor layer 106 (channel epi layer) is grown using silicon carbide across the entire surface of the drift layer 102d including the first body region 103a, the impurity region 104 and the contact region 105. Thus, at least the side surface 106 of the trench 102t is covered by the second silicon carbide semiconductor layer 106. In the present embodiment, the impurity concentration N (cm$^{-3}$) and the thickness d (nm) of a portion of the second silicon carbide semiconductor layer 106 of the semiconductor device 314 that is adjacent to the first body region 103a is adjusted so as to satisfy the following conditions, for example.

$N = 2 \times 10^{18}$
$d = 30$

Then, a predetermined area of the second silicon carbide semiconductor layer 106 is dry-etched as necessary, and then the gate insulating film 107 is formed on the surface of the second silicon carbide semiconductor layer 106 as shown in FIG. 39(a) by thermal oxidation, for example. Where the gate insulating film 107 is formed by thermal oxidation, a portion of the second silicon carbide semiconductor layer 106 becomes a gate insulating film. Therefore, taking into consideration the thickness to be lost through the thermal oxidation, the thickness of the second silicon carbide semiconductor layer 106 to be grown is adjusted so as to achieve the thickness d after the formation of the gate insulating film 107.

Then, a polycrystalline silicon film doped with about $7 \times 10^{20}$ cm$^{-3}$ of phosphorus, for example, is deposited on the surface of the gate insulating film 107. The thickness of the polycrystalline silicon film is about 500 nm, for example.

Thus, the inside of the trench 102t formed in the first silicon carbide semiconductor layer 102 is filled with the polycrystalline silicon film.

Next, as shown in FIG. 39(b), the polycrystalline silicon film is dry-etched using a mask (not shown), thereby forming the gate electrode 108 in an intended region.

Then, as shown in FIG. 40(a), the interlayer insulating film 111 is formed. Next, as shown in FIG. 40(b), the contact hole (opening portion) 111c is formed. Then, as shown in FIG. 40(c), the metal film 109' is formed on the interlayer insulating film 111, and a heat treatment is performed, thereby forming the first ohmic electrode 109 as shown in FIG. 41(a).

Then, as shown in FIG. 41(b), the second ohmic electrode 110 is formed also on the reverse surface of the semiconductor substrate 101. Then, as shown in FIG. 34(a), the upper wiring electrode (source line) 112 is formed. Moreover, the reverse surface wiring electrode 113 for die-bonding is deposited on the reverse surface of the second ohmic electrode 110. Thus, the semiconductor device 314 shown in FIG. 34 is obtained.

Figure 36:
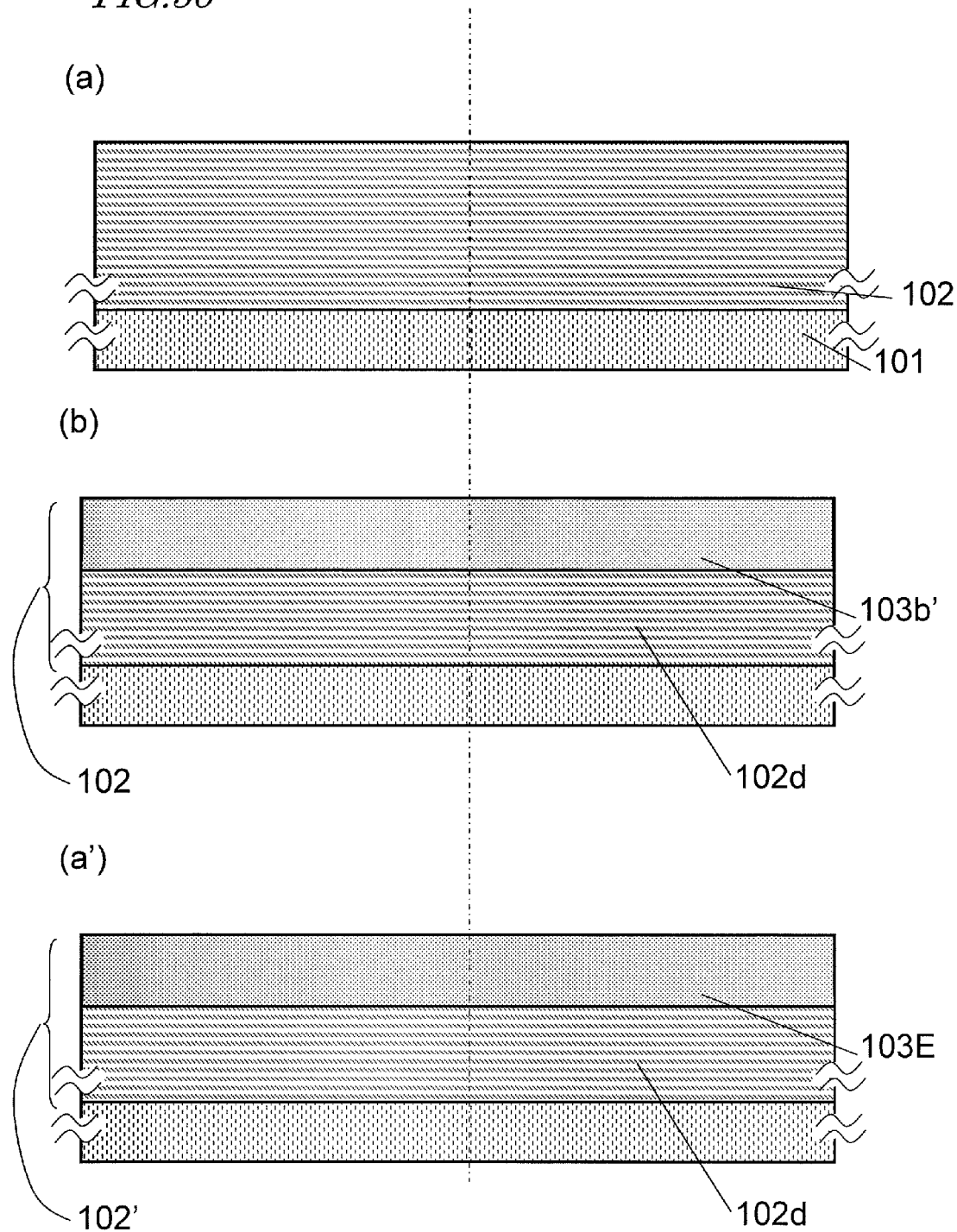
FIGS. 36 (a) and (b) are process cross-sectional views each illustrating a method for manufacturing the semiconductor device of Embodiment 4-1, and (a') is a process cross-sectional view according to another embodiment.
Figure 38:
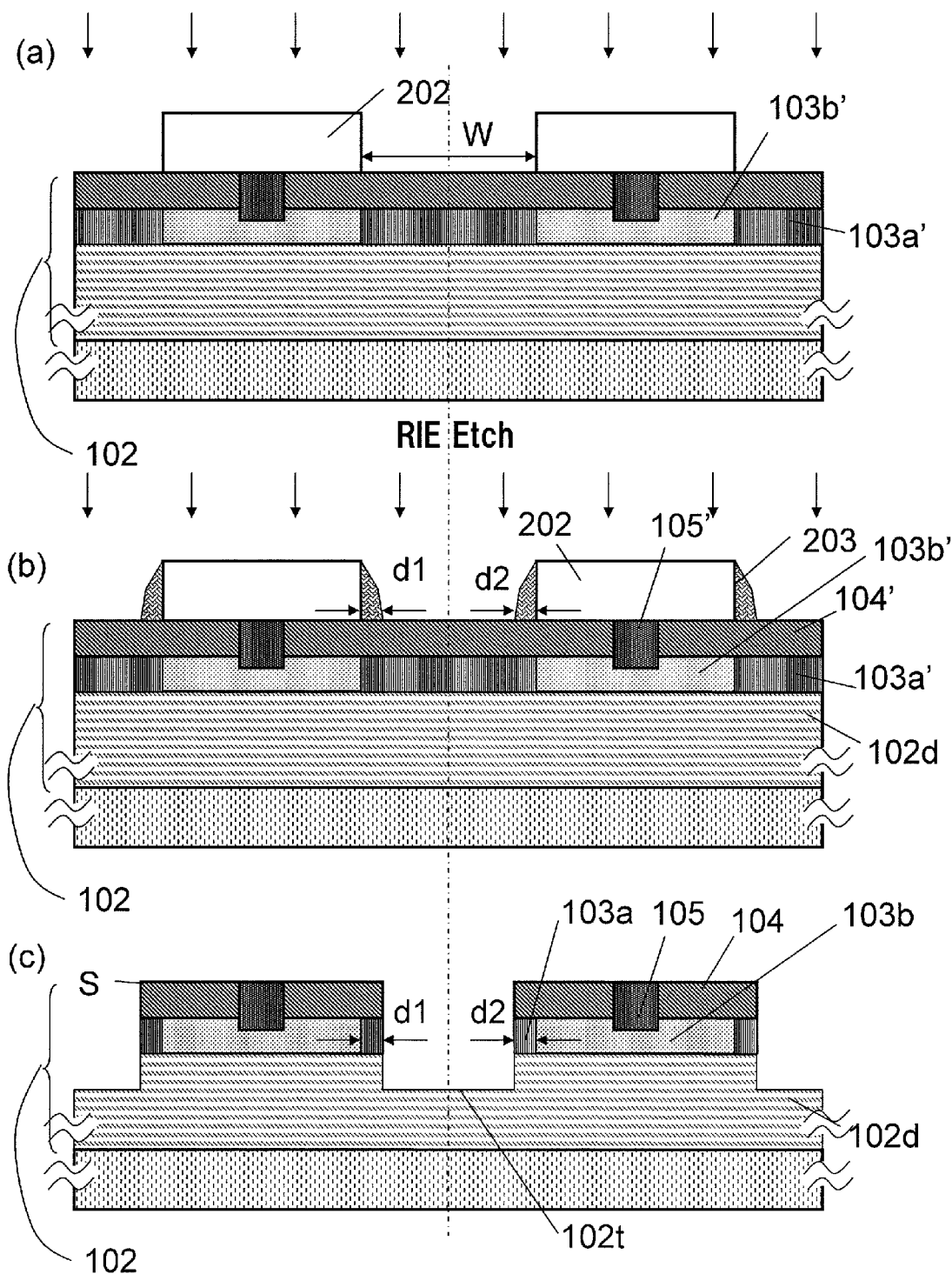
FIGS. 38 (a) to (c) are process cross-sectional views each illustrating a method for manufacturing the semiconductor device of Embodiment 4-1.
Figure 39:
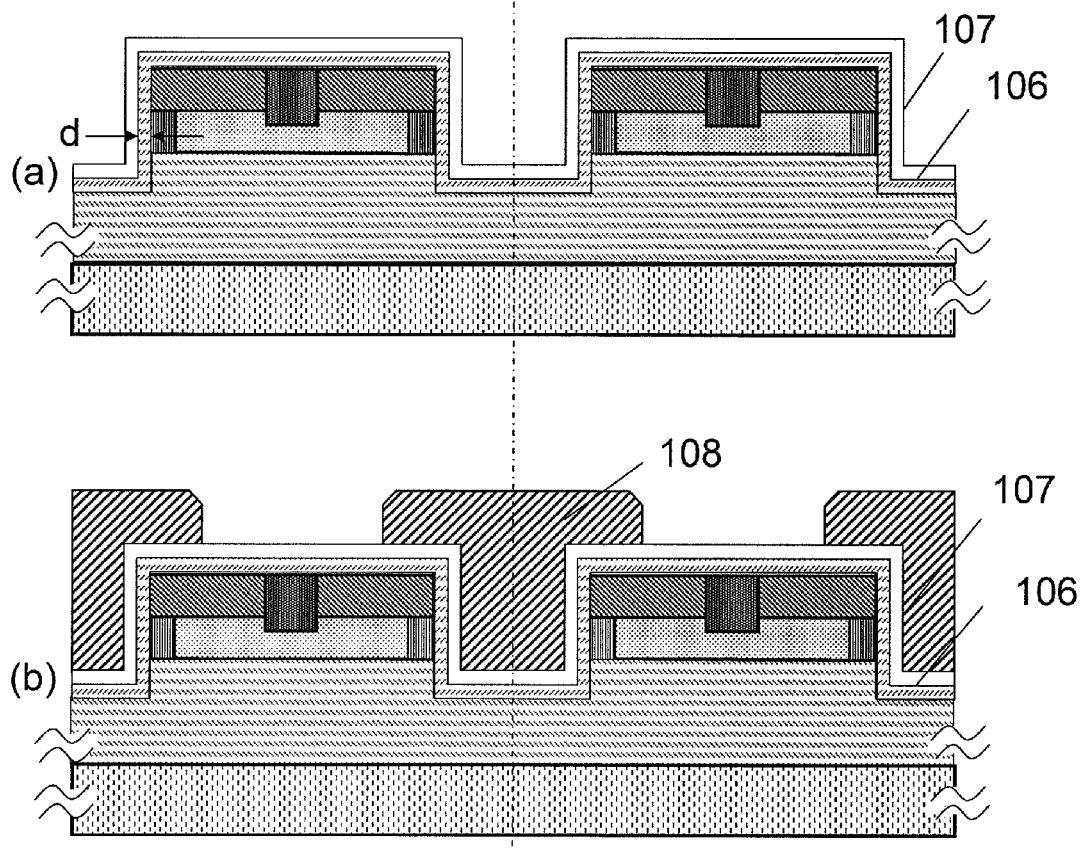
FIGS. 39 (a) and (b) are process cross-sectional views each illustrating a method for manufacturing the semiconductor device of Embodiment 4-1.
Figure 40:
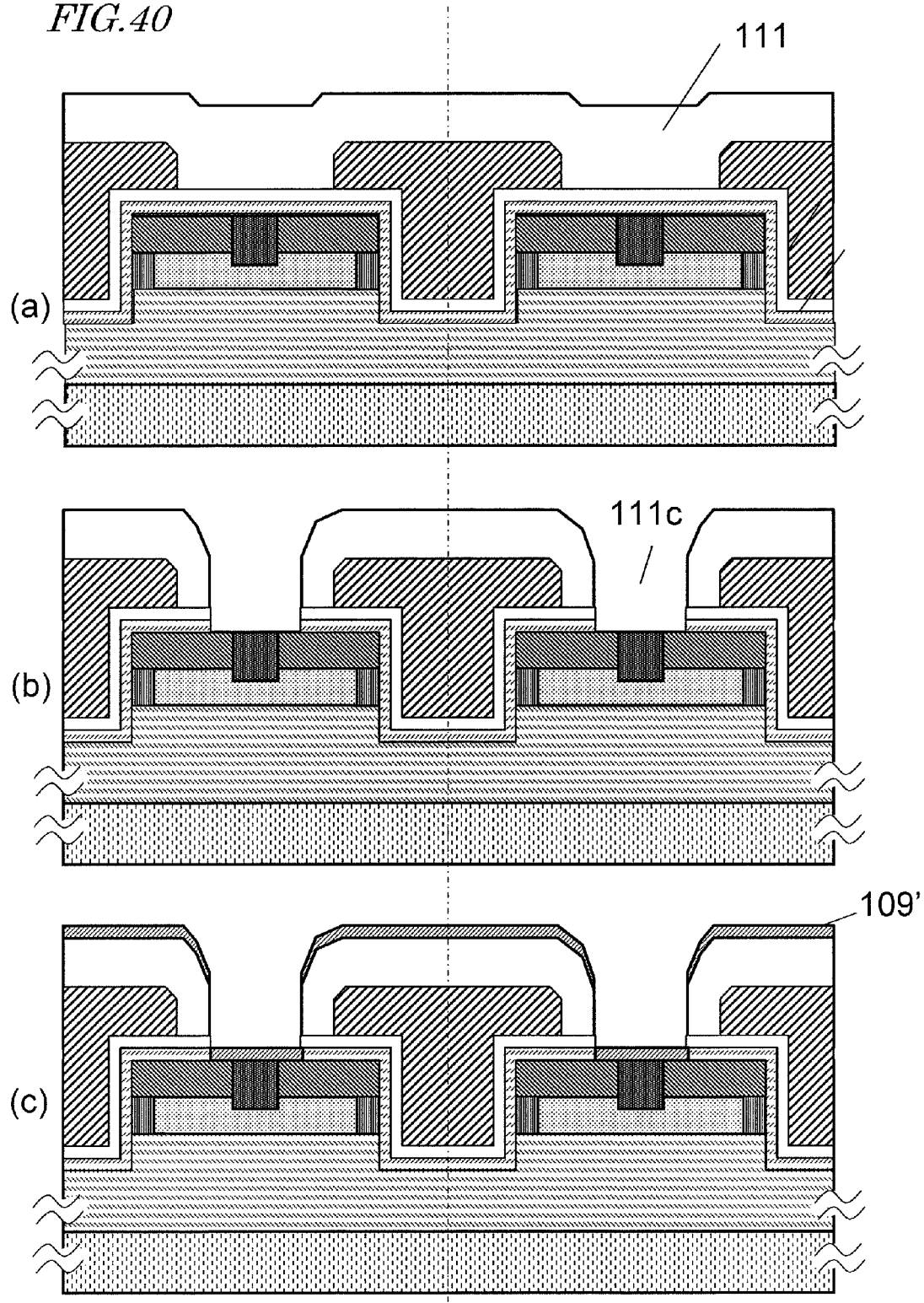
FIGS. 40 (a) to (c) are process cross-sectional views each illustrating a method for manufacturing the semiconductor device of Embodiment 4-1.
Figure 41:
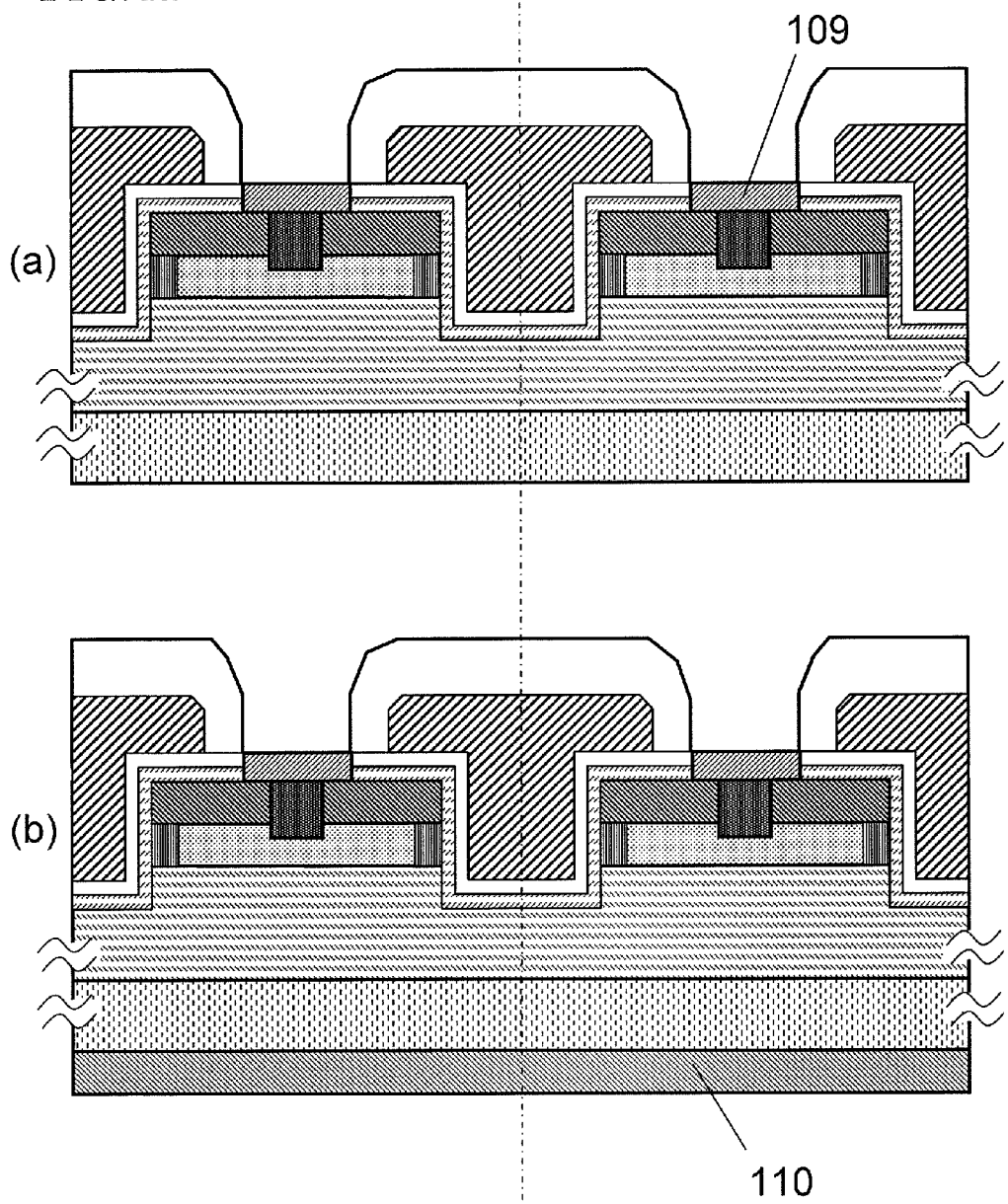
FIGS. 41 (a) and (b) are process cross-sectional views each illustrating a method for manufacturing the semiconductor device of Embodiment 4-1.

Note that in the present embodiment, the second body region 103b' and the impurity region 104' are formed in the first silicon carbide semiconductor layer 102 by ion implantation. However, regions corresponding to the second body region 103b' and the impurity region 104' may be formed by epitaxial growth. For example, as shown in FIG. 36(a'), a first silicon carbide semiconductor layer 102' including a second body region 103E and the drift region 102d may be formed by epitaxial growth on the semiconductor substrate 101, instead of the first silicon carbide semiconductor layer 102. In this case, the concentration of an impurity of the second conductivity type is adjusted during the epitaxial growth of the body region 103E so that the second body region 103E has an impurity concentration profile generally equal to that of the second body region 103b' described above.

After the formation of the first silicon carbide semiconductor layer 102', the impurity region 104' of the first conductivity type is formed as shown in FIG. 37(a), and subsequent steps are performed as described above, thus manufacturing the semiconductor device 314. Note however that since the impurity of the second body region 103E has been activated, the first body region 103a' is formed by ion-implanting aluminum into the second body region 103E using the mask 202 in the step shown in FIG. 38(a), and the second body region 103E of the second conductivity type located under the mask 202 is defined as the second body region 103b of the semiconductor device 314 through a subsequent activation step.

As shown in FIG. 37(a'), a first silicon carbide semiconductor layer 102" including an impurity region 104E of the first conductivity type, the second body region 103E of the second conductivity type and the drift region 102d may be formed by epitaxial growth on the semiconductor substrate 101, instead of the first silicon carbide semiconductor layer 102. The impurity region 104E of the first conductivity type preferably has an impurity concentration profile generally equal to that of the impurity region 104' of the first conductivity type. After the formation of the first silicon carbide semiconductor layer 102", the contact region 105' is formed as shown in FIG. 37(b), and the subsequent steps are performed as described above, thus manufacturing the semiconductor device 314. In this case, the trench 102t is formed in the first silicon carbide semiconductor layer 102" as shown in FIGS. 38(b) and 38(c), thereby defining the impurity region 104 in a region of the impurity region 104E other than the contact region 105'.

With the semiconductor device of the present embodiment, when forming the trench, a side wall is formed on a mask defining the second body region, and the first body region is defined in a self-aligned manner with respect to the trench. Therefore, first body regions formed on opposing trench side surfaces have generally an equal width. Thus, since the opposing trench side surfaces have generally an equal threshold (Vt), it is possible to reduce variations in the threshold voltage (Vt) for the device as a whole.

Embodiment 4-1'

Figure 42:
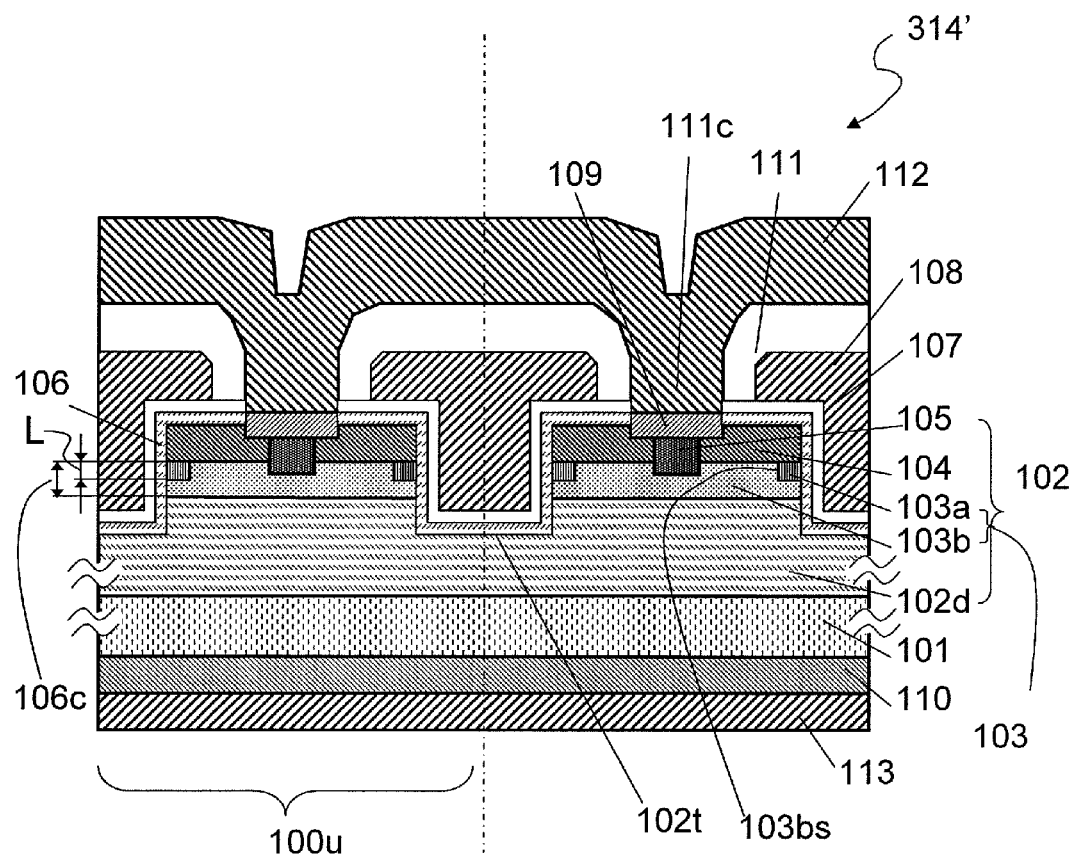
FIG. 42 A cross-sectional view of a semiconductor device according to another example of Embodiment 4-1 of the present invention.

A method for manufacturing a semiconductor device according to another example of Embodiment 4-1 will now be described with reference to the drawings. FIG. 42 is a cross-sectional view showing a semiconductor device 314' of the present embodiment. The semiconductor device 314' is different from Embodiment 4-1 in that the first body region 103a partially covers a side surface 103bs of the second body region 103b. As shown in FIG. 42, the first body region 103a is formed with a depth L in the body region 103, and is not in contact with the drift region 102d. Therefore, a portion of the side surface 103bs of the second body region 103b is not in contact with the first body region 103a, but is exposed on the side surface of the trench 102t and in contact with the second silicon carbide semiconductor layer 106.

As in Embodiment 4-1, the semiconductor device 314' having such a structure also includes the first body region 103a and the second body region 103b having different concentrations. Thus, it is possible to realize intended characteristics by independently controlling the second body region 103b, which influences the device withstand voltage, and the first body region 103a, which influences the threshold voltage Vth of the transistor and the rising voltage Vf0 of the channel diode. Particularly, in the example shown in FIG. 42, the first body region 103a having a high concentration is not in contact with the drift region 102d, and it is therefore possible to more effectively reduce a leak current as compared with Embodiment 4-1.

The semiconductor device 314' can be manufactured by a similar process to that of the semiconductor device 314 of Embodiment 4-1. For example, as described above in Embodiment 4-1 with reference to FIGS. 36 and 37, the structure up to the contact region 105' shown in FIG. 37(b) is formed in a similar manner to Embodiment 4-1.

Figure 43:
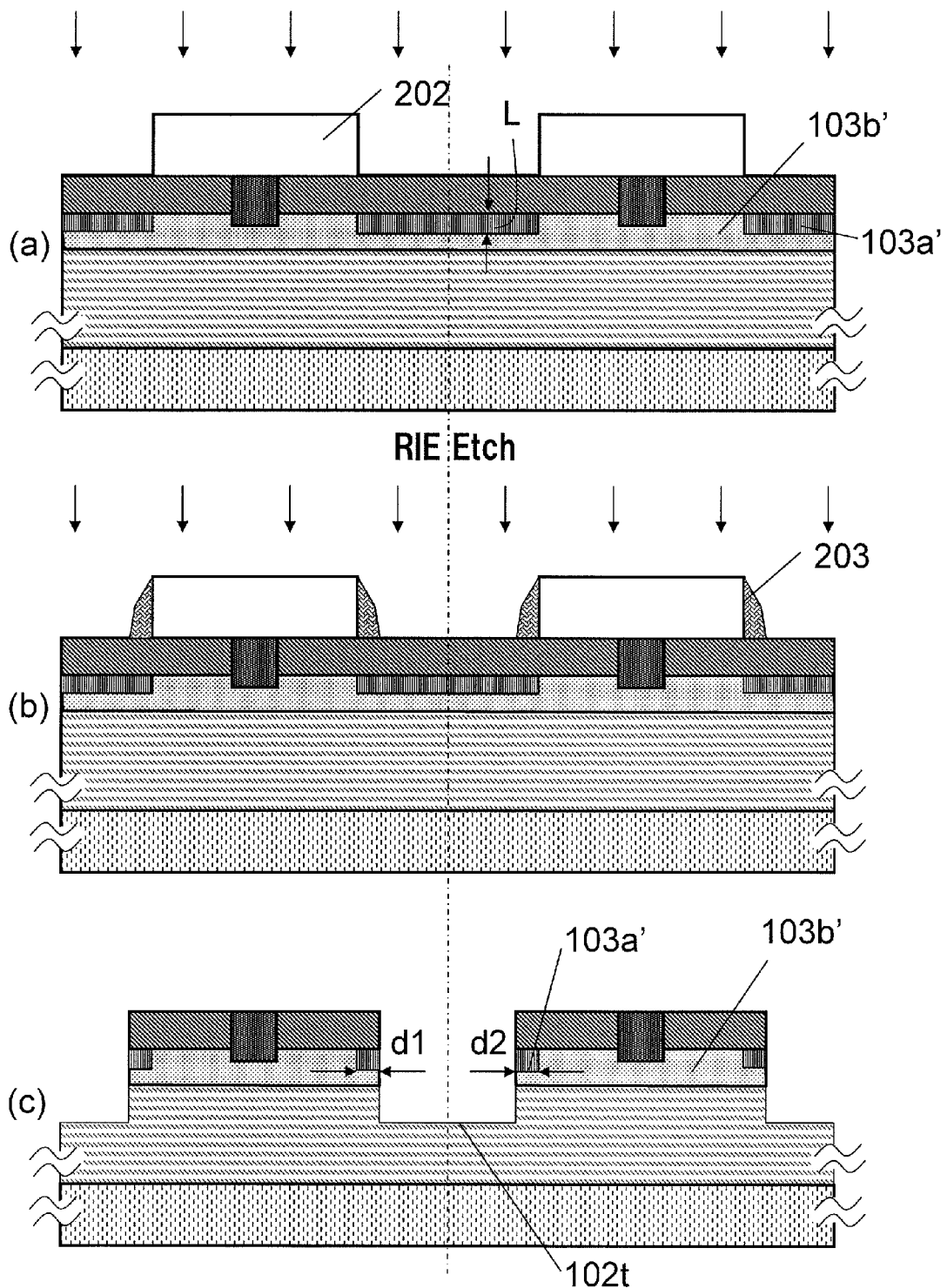
FIGS. 43 (a) to (c) are process cross-sectional views each illustrating a method for manufacturing the semiconductor device shown in FIG. 42.

Then, as shown in FIG. 43(a), the mask 202 is formed on the first silicon carbide semiconductor layer 102, and Al is implanted into the second body region 103b' using the mask 202, thereby forming the first body region 103a'. In this process, the impurity implantation profile is adjusted so that the first body region 103a' has a depth of L and does not reach the drift region 102d. Then, as shown in FIG. 43(b), as described above in Embodiment 4-1, the side wall 203 is formed on the side surface of the mask 202, and the trench 102t running through the impurity region 104 and the first body region 103a' so as to expose the drift region 102d is formed as shown in FIG. 43(c) by using the mask 202 having the side wall 203 formed on the first silicon carbide semiconductor layer 102 as a mask.

Thereafter, the semiconductor device 314' can be formed by using similar steps to those of the first embodiment.

Embodiment 4-2

A semiconductor device according to Embodiment 4-2 will now be described. As shown in FIG. 44(a), a semiconductor device 324 includes the unit cell placement section 100ul, including unit cells of the semiconductor device of Embodiment 4-1 or unit cells of the semiconductor device 314' of Embodiment 4-1', and the peripheral portion 100*fl* arranged around the unit cell placement section 100*ul*. With respect to the unit cell placement section 100*ul*, the peripheral portion 100*fl* is arranged so as to surround the unit cell placement section 100*ul*, for example, as seen from the normal direction to the principal surface of the semiconductor substrate 101.

FIG. 44(*b*) is a cross-sectional view showing one of the plurality of unit cells 100*u* arranged in the unit cell placement section 100*ul*. The unit cell 100*u* shown in the figure has a similar configuration to that of the unit cell described above with reference to FIG. 34, and therefore will not be described below.

FIG. 44(*c*) is a cross-sectional view taken along line E-F shown in FIG. 12(*a*), showing a configuration of the peripheral portion 100*fl*. As shown in the figure, the peripheral portion 100*fl* includes the implantation region 115 and the FLR structure 116 of the second conductivity type arranged in the first silicon carbide semiconductor layer 102. The depletion suppressing region 104*f* of the first conductivity type arranged further on the outside of the FLR structure 116 may be included. The implantation regions 115 and 116 are provided for the purpose of ensuring the device withstand voltage, and serve to relax the electric field localization at the peripheral portion 100*fl* of the semiconductor device 324. These implantation regions 115 and 116 are preferably formed in the same step as the body region 103. This not only facilitates the process design, but also gives an advantage that deterioration of the device withstand voltage can be suppressed. Note that the peripheral portion 100*fl* of the present embodiment shown in FIG. 44(*c*) has a similar structure to that of the peripheral portion described above in Embodiment 2-2 with reference to FIG. 19(*c*), and detailed description thereof will be omitted.

Embodiment 4-3

Figure 45:
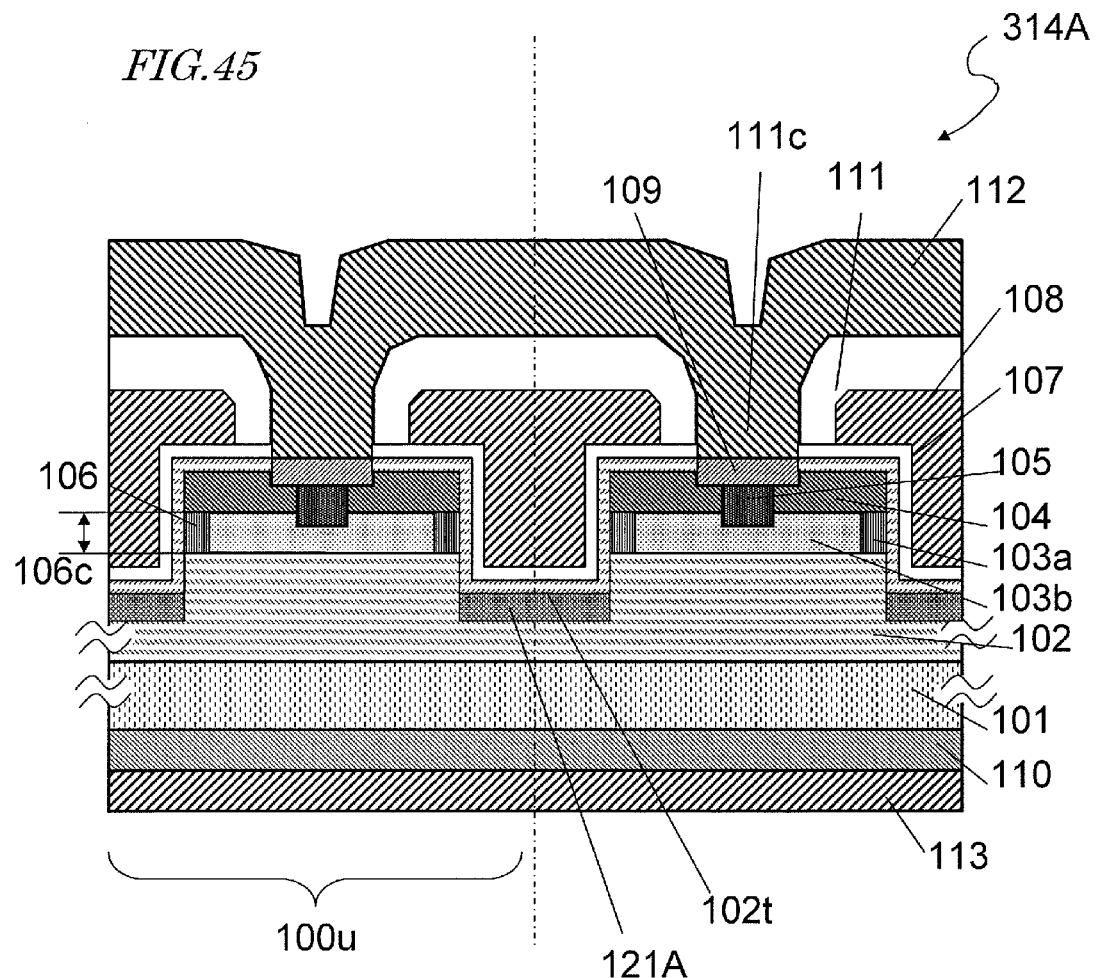
FIG. 45 A cross-sectional view showing a semiconductor device according to another example of Embodiment 4-3 of the present invention.
Figure 46:
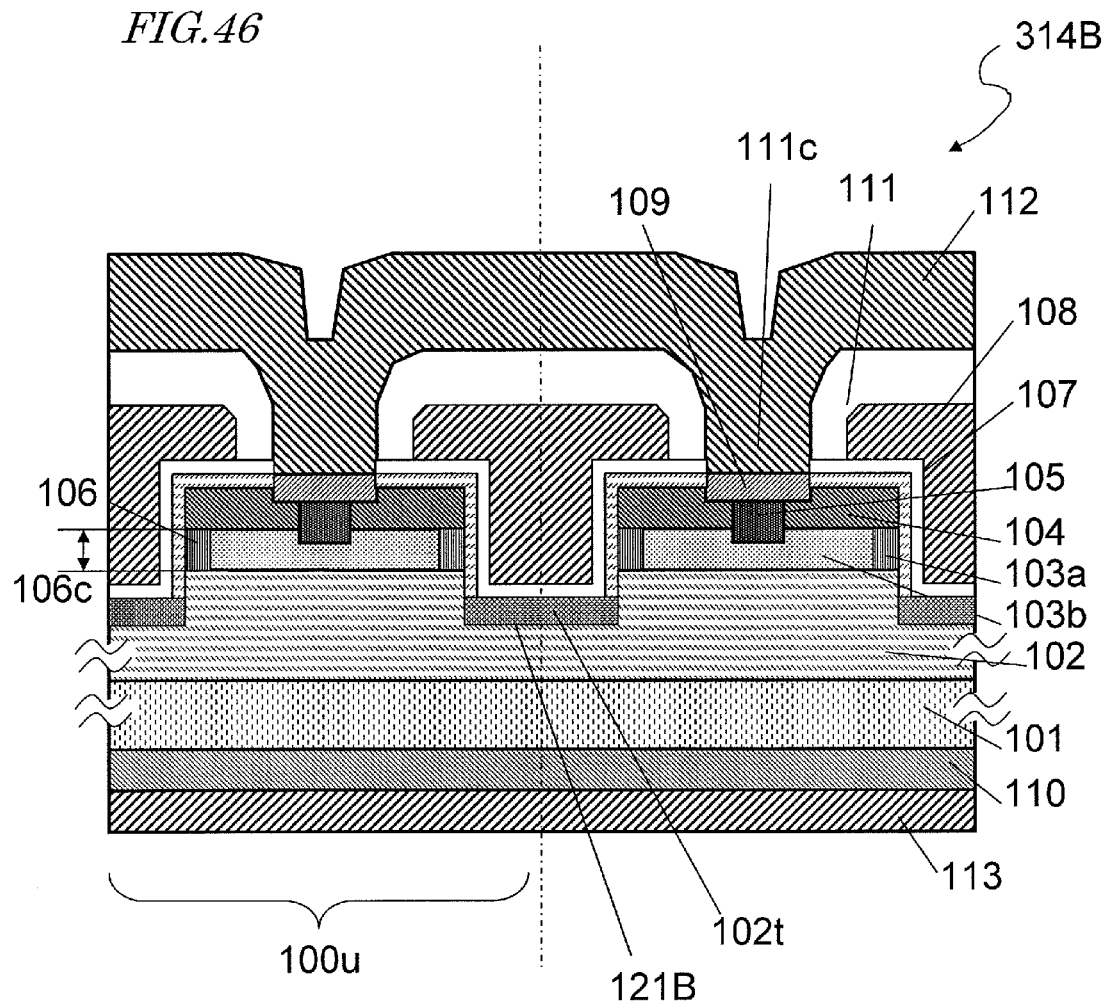
FIG. 46 A cross-sectional view showing a semiconductor device according to another example of Embodiment 4-1 of the present invention.

FIGS. 45 and 46 are cross-sectional views showing semiconductor devices 314A and 314B, respectively, according to another embodiment of the present invention. Specifically, the semiconductor device 314A has a structure of the semiconductor device 314 of Embodiment 4-1 where the electric field relaxing layer 121A of Embodiment 2-3 is provided, and a semiconductor device 314B has a structure of the semiconductor device 314 of Embodiment 4-1 where an electric field relaxing layer 121B of Embodiment 2-3 is provided. With the provision of the electric field relaxing regions 121A and 121B, it is possible to reduce the electric field intensity occurring on the bottom surface of the trench 102*t*, as in Embodiment 2-3.

While the embodiments described above are directed to cases where the side surface of the trench 102*t* is vertical, similar advantageous effects can be realized also when the trench groove is tapered. While the gate insulating film 107 is formed by oxidizing the surface of silicon carbide in the method described above, it may be formed by using a CVD method, or the like, instead. Moreover, while the first and second body regions 103*a* and 103*b* are formed by ion implantation on the first silicon carbide semiconductor layer 102 in the method described above, the second body region 103*b* may be formed by epitaxial growth, for example. Note however that it is preferred that the second body region 103*b* is formed by ion implantation, in which case it is possible to simultaneously form the peripheral structure (e.g., the ring region) in that ion implantation step.

Thus, with the semiconductor devices of Embodiments 4-1, 4-1', 4-2 and 4-3, a large amount of diode current can be allowed to flow through the channel, and it is therefore possible to avoid the problem of an increase in crystal defects due to the flow of a forward current through the pn junction of the silicon carbide semiconductor. The body region includes the first body region and the second body region, and it is possible to determine the threshold by adjusting the concentration of the first body region and to determine the withstand voltage of the pn junction between the second body region and the drift layer by adjusting the concentration of the second body region. Since these concentrations can be controlled independently, it is possible to suppress withstand voltage defects and leak defects of the semiconductor device while controlling the threshold to an intended value.

Since two first body regions in contact with a pair of opposing trench side surfaces have an equal width in the direction parallel to the substrate, the threshold voltages of the channels formed on the opposing trench side surfaces can be made equal to each other, thereby suppressing in-plane threshold variations.

Note that while a 4H—SiC substrate is used as the semiconductor substrate 101 in Embodiments 1-1, 1-2, 1-3, 2-1, 2-2, 2-3, 3-1, 3-2, 3-3, 4-1, 4-2 and 4-3, an SiC substrate of another crystal plane or another polytype (e.g., 6H—SiC, 3C—SiC, 15R—SiC, or the like) may be used. Where a 4H—SiC substrate is used, the first silicon carbide semiconductor layer 102 may be formed on the Si plane and the second ohmic electrode 110 on the C plane, or the first silicon carbide semiconductor layer 102 may be formed on the C plane and the second ohmic electrode 110 on the Si plane. While a plane off-cut from the (0001) plane is used as the principal surface of the semiconductor substrate 101, another plane (the (11-20) plane, the (1-100) plane, the (000-1) plane) or an off-cut plane thereof may be used as the principal surface. Moreover, a semiconductor substrate other than silicon carbide, such as an Si substrate, may be used as the 101 substrate, and a first silicon carbide semiconductor layer of silicon carbide (e.g., 3C—SiC) may be formed on the principal surface thereof (hetero junction).

The present invention is not limited to vertical MISFETs, but is applicable to various semiconductor devices having a trench gate structure. For example, while a MISFET is manufactured by using the semiconductor substrate 101 of the same conductivity type as that of the drift region 102*d* in Embodiments 1-1, 1-2, 1-3, 2-1, 2-2, 2-3, 3-1, 3-2, 3-3, 4-1, 4-2 and 4-3 described above, an insulated gate bipolar transistor (IGBT) can be manufactured by using the semiconductor substrate 101 of a different conductivity type from that of the drift region 102*d*.

INDUSTRIAL APPLICABILITY

The semiconductor device disclosed in the present application is widely applicable to semiconductor devices including a trench structure such as MISFETs, and various controllers and drivers having the same.

REFERENCE SIGNS LIST 311, 312, 313, 314 Semiconductor device
321, 322, 323, 324 Semiconductor device (semiconductor chip)
100*u* Unit cell
100*ul* Unit cell placement section
100*fl* Peripheral portion
101 Substrate
102 First silicon carbide semiconductor layer
103*a* First body region

49

103b Second body region
103d Second conductivity type region
103f Ring region
104 Impurity region
104f Depletion suppressing region
105 Contact region
106 Second silicon carbide semiconductor layer (channel layer)
106c Channel region
107 Gate insulating film
108 Gate electrode
109 First ohmic electrode
110 Second ohmic electrode
111 Interlayer insulating film
111c Contact hole
112 Upper wiring electrode
113 Reverse surface wiring electrode
115 Implantation region
116 FLR structure

The invention claimed is:

1. A semiconductor device comprising:
a semiconductor substrate having a principal surface and a reverse surface;
a first silicon carbide semiconductor layer located on the principal surface of the semiconductor substrate, the first silicon carbide semiconductor layer including a drift region of a first conductivity type, a body region of a second conductivity type located on the drift region, and an impurity region of the first conductivity type located on the body region;
a trench provided in the first silicon carbide semiconductor layer, running through the body region so as to reach inside of the drift region;
a second silicon carbide semiconductor layer of the first conductivity type located at least on a side surface of the trench so as to be in contact with at least a portion of the drift region and at least a portion of the impurity region;
a gate insulating film located on the second silicon carbide semiconductor layer;
a gate electrode located on the gate insulating film;
a first ohmic electrode in contact with the impurity region; and
a second ohmic electrode located on the reverse surface of the semiconductor substrate;
the body region includes a first body region which is in contact with the impurity region and in contact with the second silicon carbide semiconductor layer on the side surface of the trench, and a second body region which is in contact with the drift region and in contact with the second silicon carbide semiconductor layer on the side surface of the trench and has a smaller average impurity concentration than the first body region;
potentials to be applied to the second ohmic electrode and the gate electrode with respect to the first ohmic electrode are Vds and Vgs, respectively, and a gate threshold voltage is Vth;
where Vgs≥Vth, a current flows from the second ohmic electrode to the first ohmic electrode through the second silicon carbide semiconductor layer; and
where 0 volt≤Vgs<Vth, a current flows from the first ohmic electrode to the second ohmic electrode through the second silicon carbide semiconductor layer before a current starts to flow from the body region to the drift region, as Vds becomes less than 0 volt.

2. The semiconductor device according to claim 1, wherein the first body region is not in contact with the drift region.

50

3. The semiconductor device according to claim 1, wherein the second body region is further in contact with the impurity region.

4. The semiconductor device according to claim 1, wherein:
the semiconductor device includes a plurality of unit cells;
each unit cell includes the semiconductor substrate, the first silicon carbide semiconductor layer, the trench, the second silicon carbide semiconductor layer, the gate insulating film, the gate electrode, the first ohmic electrode, and the second ohmic electrode,
wherein a width of the first body region of each unit cell in a direction parallel to the semiconductor substrate is equal to a width of the first body region of another unit cell, which is adjacent to said unit cell with the trench interposed therebetween, in a direction parallel to the semiconductor substrate.

5. The semiconductor device according to claim 1, wherein the first body region is defined in a self-aligned manner with respect to the trench.

6. The semiconductor device according to claim 1, wherein the second body region is located under the first body region and is not in contact with the impurity region.

7. The semiconductor device according to claim 1, wherein the second silicon carbide semiconductor layer and the body region are configured so that where 0 volt≤Vgs<Vth, a current flows from the first ohmic electrode to the second ohmic electrode through the second silicon carbide semiconductor layer before a current starts to flow from the body region to the drift region, as Vds becomes less than 0 volt.

8. The semiconductor device according to claim 1, wherein the second silicon carbide semiconductor layer is an epitaxial layer.

9. The semiconductor device according to claim 1, wherein an average impurity concentration of the first body region is twice or more as high as an average impurity concentration of the second body region.

10. The semiconductor device according to claim 1, further comprising an electric field relaxing region of the second conductivity type provided on a bottom surface of the trench.

11. The semiconductor device according to claim 1, further comprising a contact region which is adjacent to the impurity region and is in contact with the second ohmic electrode and the second body region.

12. The semiconductor device according to claim 1, the semiconductor device comprising:
a unit cell arrangement section including a plurality of unit cells arranged therein, each unit cell including the semiconductor substrate, the first silicon carbide semiconductor layer, the trench, the second silicon carbide semiconductor layer, the gate insulating film, the gate electrode, the first ohmic electrode, and the second ohmic electrode; and
a peripheral portion arranged outside the unit cell arrangement section as seen from a normal direction to the principal surface of the semiconductor substrate,
wherein the peripheral portion includes a ring region of the second conductivity type arranged in the first silicon carbide semiconductor layer so as to surround the unit cell arrangement section as seen from a normal direction to the principal surface of the semiconductor substrate,
wherein an impurity concentration profile of the second conductivity type in a depth direction in the ring region is equal to an impurity concentration profile of the second conductivity type in a depth direction in the second body region of each unit cell.

13. A semiconductor device comprising:
a semiconductor substrate having a principal surface and a reverse surface;
a first silicon carbide semiconductor layer located on the principal surface of the semiconductor substrate, the first silicon carbide semiconductor layer including a drift region of a first conductivity type, a body region of a second conductivity type located on the drift region, and an impurity region of the first conductivity type located on the body region;
a trench provided in the first silicon carbide semiconductor layer, running through the body region so as to reach inside of the drift region;
a second silicon carbide semiconductor layer of the first conductivity type located at least on a side surface of the trench so as to be in contact with at least a portion of the drift region and at least a portion of the impurity region;
a gate insulating film located on the second silicon carbide semiconductor layer;
a gate electrode located on the gate insulating film;
a first ohmic electrode in contact with the impurity region; and
a second ohmic electrode located on the reverse surface of the semiconductor substrate, wherein:
the body region includes a first body region which is in contact with the second silicon carbide semiconductor layer on the side surface of the trench, and a second body region which is in contact with the drift region and has a smaller average impurity concentration than the first body region;
the impurity region is in contact with the first body region and the second body region;
potentials to be applied to the second ohmic electrode and the gate electrode with respect to the first ohmic electrode are Vds and Vgs, respectively, and a gate threshold voltage is Vth;
where Vgs≥Vth, a current flows from the second ohmic electrode to the first ohmic electrode through the second silicon carbide semiconductor layer; and
where 0 volt≤Vgs<Vth, a current flows from the first ohmic electrode to the second ohmic electrode through the second silicon carbide semiconductor layer before a current starts to flow from the body region to the drift region, as Vds becomes less than 0 volt.

14. The semiconductor device according to claim 13, wherein the first body region is not in contact with the drift region.

15. The semiconductor device according to claim 13, wherein the first body region is further in contact with the drift region.

16. The semiconductor device according to claim 13, wherein the second silicon carbide semiconductor layer is in contact with the first body region and the second body region on the side surface of the trench.

17. A method for manufacturing a semiconductor device, the method comprising the steps of:
forming a first silicon carbide semiconductor layer on a semiconductor substrate, the first silicon carbide semiconductor layer including a drift region of a first conductivity type and a second body region of a second conductivity type;
forming a mask on a partial region of a surface of the first silicon carbide semiconductor layer;
forming a first body region of the second conductivity type in the second body region of the first silicon carbide semiconductor layer by implanting an impurity using the mask;
forming a side wall on a side surface of the mask;
forming a trench running through the first body region so as to expose the drift region therethrough by etching the first silicon carbide semiconductor layer using the mask and the side wall;
activating the impurity region, the first body region and the second body region by performing a heat treatment on the first silicon carbide semiconductor layer; and
forming a second silicon carbide semiconductor layer so as to cover at least a side surface of the trench.

18. The method for manufacturing a semiconductor device according to claim 17, wherein in the step of forming the first body region, the first body region which does not reach the drift region is formed.

19. The method for manufacturing a semiconductor device according to claim 17, further comprising the steps of:
forming an impurity region by implanting an impurity into a surface portion of the second body region, between the step of forming the first silicon carbide semiconductor layer and the step of forming the mask, wherein:
in the step of forming the trench,
a trench running through the first body region and the impurity region is formed.

20. The method for manufacturing a semiconductor device according to claim 17, wherein:
the step of forming the first silicon carbide semiconductor layer includes the step of:
forming the second body region while defining the drift region in an area other than the second body region by implanting an impurity into a surface portion of a silicon carbide semiconductor layer of the first conductivity type.

21. The method for manufacturing a semiconductor device according to claim 17, wherein:
the semiconductor device includes a unit cell arrangement section including a plurality of unit cells arranged therein, and a peripheral portion arranged outside the unit cell arrangement section as seen from a normal direction to the principal surface of the semiconductor substrate;
in the peripheral portion, the first silicon carbide semiconductor layer includes a ring region of the second conductivity type arranged so as to surround the unit cell arrangement section as seen from a normal direction to the principal surface of the semiconductor substrate; and
the second body region and the ring region are formed in the same step.

22. The method for manufacturing a semiconductor device according to claim 19, further comprising the step of forming a contact region in the impurity region and the second body region, before the step of forming the mask.

23. The method for manufacturing a semiconductor device according to claim 22, further comprising the steps of:
forming a gate insulating film on the second silicon carbide semiconductor layer;
forming a gate electrode on the gate insulating film;
removing a portion of the gate insulating film and the second silicon carbide semiconductor layer so that a portion of the impurity region and the contact region are exposed;
forming a first ohmic electrode so as to be in contact with the exposed portion of the impurity region and the contact region; and
forming a second ohmic electrode so as to be in contact with a surface of the semiconductor substrate with which the first silicon carbide semiconductor layer is not in contact.

* * * * *